(12) United States Patent
Suhir et al.

(10) Patent No.: US 8,039,961 B2
(45) Date of Patent: Oct. 18, 2011

(54) COMPOSITE CARBON NANOTUBE-BASED STRUCTURES AND METHODS FOR REMOVING HEAT FROM SOLID-STATE DEVICES

(75) Inventors: Ephraim Suhir, Los Altos, CA (US); Roger L. Kroeze, San Francisco, CA (US); Peter Schwartz, Livermore, CA (US); K. S. Ravindhran, Stockton, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 298 days.

(21) Appl. No.: 12/058,552

(22) Filed: Mar. 28, 2008

(65) Prior Publication Data
US 2009/0008779 A1   Jan. 8, 2009

Related U.S. Application Data

(63) Continuation-in-part of application No. 11/498,408, filed on Aug. 2, 2006, which is a continuation of application No. 10/925,824, filed on Aug. 24, 2004, now Pat. No. 7,109,581, application No. 12/058,552, and a continuation-in-part of application No. 11/386,254, filed on Mar. 21, 2006, now Pat. No. 7,477,527, application No. 12/058,552, and a continuation-in-part of application No. 11/618,441, filed on Dec. 29, 2006, application No. 12/058,552, and a continuation-in-part of application No. 11/749,116, filed on May 15, 2007, now abandoned, application No. 12/058,552, and a continuation-in-part of application No. 11/749,126, filed on May 15, 2007, now abandoned, application No. 12/058,552, and a continuation-in-part of application No. 11/749,128, filed on May 15, 2007, now abandoned.

(60) Provisional application No. 61/018,650, filed on Jan. 2, 2008, provisional application No. 60/909,399, filed on Mar. 30, 2007, provisional application No. 60/497,849, filed on Aug. 25, 2003, provisional application No. 60/663,225, filed on Mar. 21, 2005, provisional application No. 60/862,664, filed on Oct. 24, 2006, provisional application No. 60/874,579, filed on Dec. 12, 2006, provisional application No. 60/908,161, filed on Mar. 26, 2007, provisional application No. 60/908,966, filed on Mar. 29, 2007.

(51) Int. Cl.
*H01L 23/48* (2006.01)
(52) U.S. Cl. .................... 257/751; 257/E23.01
(58) Field of Classification Search .................. 257/751, 257/712, 720, E23.01, 758, 750; 977/742
See application file for complete search history.

(56) References Cited

U.S. PATENT DOCUMENTS 6,645,628 B2   11/2003   Shiffler, Jr. et al. ........... 428/408
(Continued)

OTHER PUBLICATIONS

Zhang et al., *J. Mater. Res.* 21(11):2922-2926 (Nov. 2006).

(Continued)

*Primary Examiner* — Hoa B Trinh
(74) *Attorney, Agent, or Firm* — Harness, Dickey & Pierce, P.L.C.

(57) ABSTRACT

One embodiment involves an article of manufacture that includes: a copper substrate plug with a front surface and a back surface; a catalyst on top of a single surface of the copper substrate plug; and a thermal interface material on top of the single surface of the copper substrate plug. The thermal interface material comprises: a layer of carbon nanotubes that contacts the catalyst, and a filler material located between the carbon nanotubes. The carbon nanotubes are oriented substantially perpendicular to the single surface of the copper substrate plug. The copper substrate plug is configured to be incorporated in a peripheral structure of a heat spreader or a heat sink. In another embodiment, the thermal interface material is on top of both the top and bottom surfaces of the copper substrate plug.

20 Claims, 30 Drawing Sheets

U.S. PATENT DOCUMENTS

| | | | |
|---|---|---|---|
| 6,864,571 B2 * | 3/2005 | Arik et al. | 257/712 |
| 7,109,581 B2 * | 9/2006 | Dangelo et al. | 257/720 |
| 2003/0092824 A1 | 5/2003 | Bastiaens et al. | 524/495 |
| 2003/0117770 A1 | 6/2003 | Montgomery et al. | 361/687 |
| 2005/0046017 A1 | 3/2005 | Dangelo | 257/720 |
| 2006/0258054 A1 | 11/2006 | Pan et al. | 438/122 |
| 2007/0031660 A1 | 2/2007 | Kanamaru et al. | 428/355 |

OTHER PUBLICATIONS

Park et al., *Nanotechnology* 17:2294-2303 (2006).

* cited by examiner

Incorporate a copper substrate plug into a peripheral structure of a heat spreader or a heat sink, wherein:
a first thermal interface material is attached to a front surface of the copper substrate plug; and the first thermal interface material comprises: a first layer of carbon nanotubes oriented substantially perpendicular to the front surface of the copper substrate plug, and a first filler material between carbon nanotubes ⟵ 1102

Figure 11A

COMPOSITE CARBON NANOTUBE-BASED STRUCTURES AND METHODS FOR REMOVING HEAT FROM SOLID-STATE DEVICES

RELATED APPLICATIONS

This application claims the benefit of U.S. Provisional Application Nos. 61/018,650, filed Jan. 2, 2008, entitled "Composite Carbon Nanotube-Based Structures and Methods for Removing Heat from Solid-State Devices," and 60/909,399, filed Mar. 30, 2007, entitled "Composite nanotube-based structures for removing heat from solid-state devices and methods for making them." Both of these applications are incorporated by reference herein in their entirety.

This application is a continuation-in-part of: (A) U.S. patent application Ser. No. 11/498,408, filed Aug. 2, 2006, which is a continuation of application Ser. No. 10/925,824 filed on Aug. 24, 2004 U.S. Pat. No. 7,109,581, filed Aug. 24, 2004, which in turn claims the benefit of U.S. Provisional Application No. 60/497,849 filed Aug. 25, 2003; (B) U.S. patent application Ser. No. 11/386,254, filed Mar. 21, 2006, now U.S. Pat. No. 7,477,527 entitled "Apparatus for attaching a cooling structure to an integrated circuit" which in turn claims the benefit of U.S. Provisional Application No. 60/663,225, filed Mar. 21, 2005; (C) U.S. patent application Ser. No. 11/618,441, filed Dec. 29, 2006, entitled "Method and apparatus for the evaluation and improvement of mechanical and thermal properties of CNT/CNF arrays" which in turn claims the benefit of U.S. Provisional Application No. 60/862,664, filed Oct. 24, 2006; (D) U.S. patent application Ser. No. 11/749,116, filed May 15, 2007, now abandoned entitled "Carbon nanotube-based structures and methods for removing heat from solid-state devices" which in turn claims the benefit of U.S. Provisional Application No. 60/874,579, filed Dec. 12, 2006, entitled "Carbon nanotube-based structures and methods for removing heat from solid-state devices"; (E) U.S. patent application Ser. No. 11/749,126, filed May 15, 2007, now abandoned entitled "Single layer carbon nanotube-based structures and methods for removing heat from solid-state devices" which in turn claims the benefit of U.S. Provisional Application No. 60/908,161, filed Mar. 26, 2007, entitled "Single layer carbon nanotube-based structures and methods for removing heat from solid-state devices"; and (F) U.S. patent application Ser. No. 11/749,128, filed May 15, 2007, now abandoned entitled "Double layer carbon nanotube-based structures and methods for removing heat from solid-state devices" which in turn claims the benefit of U.S. Provisional Application No. 60/908,966, filed Mar. 29, 2007, entitled "Double layer carbon nanotube-based structures and methods for removing heat from solid-state devices." All of these applications are incorporated by reference herein in their entirety.

TECHNICAL FIELD

The disclosed embodiments relate generally to structures and methods for removing heat from integrated circuits and other solid-state devices. More particularly, the disclosed embodiments relate to structures and methods that use carbon nanotubes to remove heat from integrated circuits and other solid-state devices.

BACKGROUND

As the speed and density of modern integrated circuits (ICs) increase, the power generated by these chips also increases. The ability to dissipate the heat being generated by IC dies is becoming a serious limitation to advances in IC performance. Similar heat dissipation problems arise in other solid-state devices, such as light emitting diodes (LEDs), lasers, power transistors, RF devices, and solar cells.

Considerable effort has been put into developing materials and structures for use as thermal interface materials, heat spreaders, heat sinks, and other packaging components for ICs and solid-state devices, with limited success.

Thus, there remains a need to develop new structures and methods for removing heat from ICs and other solid-state devices that are compatible with current semiconductor packaging technology, provide low thermal resistances, and are low cost.

SUMMARY

The present invention addresses the problems described above by providing carbon nanotube-based structures and methods for removing heat from IC dies and other solid-state devices.

One aspect of the invention involves an article of manufacture that includes: a copper substrate plug with a front surface and a back surface; a catalyst on top of a single surface of the copper substrate plug; and a thermal interface material on top of the single surface of the copper substrate plug. The thermal interface material comprises: a layer of carbon nanotubes that contacts the catalyst, and a filler material located between the carbon nanotubes. The carbon nanotubes are oriented substantially perpendicular to the single surface of the copper substrate plug. The copper substrate plug is configured to be incorporated in a peripheral structure of a heat spreader or a heat sink.

Another aspect of the invention involves a method that includes: forming a catalyst on top of a single surface of a copper substrate plug, growing a layer containing carbon nanotubes on top of a front surface of a copper substrate plug, wherein the layer of carbon nanotubes are oriented substantially perpendicular to the front surface of the copper substrate plug; incorporating the copper substrate plug into a peripheral structure of a heat spreader or a heat sink; and placing a filler material between carbon nanotubes in the layer containing carbon nanotubes. A thermal interface material comprises the layer containing carbon nanotubes and the filler material between carbon nanotubes.

Another aspect of the invention involves a method that includes incorporating a copper substrate plug into a peripheral structure of a heat spreader or a heat sink, wherein a thermal interface material is attached to a front surface of the copper substrate plug. The thermal interface material comprises: a layer of carbon nanotubes oriented substantially perpendicular to the front surface of the copper substrate plug, and a filler material between carbon nanotubes.

Another aspect of the invention involves a method that includes placing a filler material between carbon nanotubes in a layer containing carbon nanotubes to form a thermal interface material on a front surface of a copper substrate plug. The copper substrate plug is configured to be incorporated in a peripheral structure of a heat spreader or a heat sink.

Another aspect of the invention involves an article of manufacture that includes: a solid-state device; a heat spreader or a heat sink with a peripheral structure; a copper substrate plug with a front surface, wherein the copper substrate plug is incorporated in the peripheral structure of the heat spreader or the heat sink; and a thermal interface material attached to the front surface of the copper substrate plug and in contact with the solid-state device. The thermal interface material comprises a layer of carbon nanotubes and a filler material located between the carbon nanotubes. The carbon nanotubes are oriented substantially perpendicular to the front surface of the copper substrate plug.

Another aspect of the invention involves an article of manufacture that includes a copper substrate plug with a front surface and a back surface. The copper substrate plug is configured to be incorporated in a peripheral structure of a heat spreader. The article of manufacture further includes: a first catalyst on top of the front surface of the copper substrate plug; and a first thermal interface material on top of the front surface of the copper substrate plug. The first thermal interface material comprises: a first layer of carbon nanotubes that contacts the first catalyst, and a first filler material located between the carbon nanotubes in the first layer of carbon nanotubes. The carbon nanotubes in the first layer of carbon nanotubes are oriented substantially perpendicular to the front surface of the copper substrate plug. The article of manufacture further includes: a second catalyst on top of the back surface of the copper substrate plug; and a second thermal interface material on top of the back surface of the copper substrate plug. The second thermal interface material comprises: a second layer of carbon nanotubes that contacts the second catalyst, and a second filler material located between the carbon nanotubes in the second layer of carbon nanotubes. The carbon nanotubes in the second layer of carbon nanotubes are oriented substantially perpendicular to the back surface of the copper substrate plug.

Another aspect of the invention involves a method that includes incorporating a copper substrate plug into a peripheral structure of a heat spreader. A first thermal interface material is attached to a front surface of the copper substrate plug and a second thermal interface material is attached to a back surface of the copper substrate plug. The first thermal interface material comprises: a first layer of carbon nanotubes oriented substantially perpendicular to the front surface of the copper substrate plug, and a first filler material between carbon nanotubes in the first layer of carbon nanotubes. The second thermal interface material comprises: a second layer of carbon nanotubes oriented substantially perpendicular to the back surface of the copper substrate plug, and a second filler material between carbon nanotubes in the second layer of carbon nanotubes.

Another aspect of the invention involves a method that includes: placing a first filler material between carbon nanotubes in a first layer containing carbon nanotubes to form a first thermal interface material on a front surface of a copper substrate plug; and placing a second filler material between carbon nanotubes in a second layer containing carbon nanotubes to form a second thermal interface material on a back surface of the copper substrate plug. The copper substrate plug is configured to be incorporated in a peripheral structure of a heat spreader or a heat sink.

Another aspect of the invention involves an article of manufacture that includes: a solid-state device; a heat spreader with a peripheral structure; and a copper substrate plug with a front surface and a back surface. The copper substrate plug is incorporated in the peripheral structure of the heat spreader. The article of manufacture further includes a first thermal interface material attached to the front surface of the copper substrate plug and in contact with the solid-state device. The first thermal interface material comprises a first layer of carbon nanotubes and a first filler material located between the carbon nanotubes in the first layer of carbon nanotubes. The carbon nanotubes in the first layer of carbon nanotubes are oriented substantially perpendicular to the front surface of the copper substrate plug. The article of manufacture further includes a second thermal interface material attached to the back surface of the copper substrate plug comprising a second layer of carbon nanotubes and a second filler material located between carbon nanotubes in the second layer of carbon nanotubes. The carbon nanotubes in the second layer of carbon nanotubes are oriented substantially perpendicular to the back surface of the copper substrate plug.

Another aspect of the invention involves a method that includes contacting a solid-state device with a first thermal interface material. The first thermal interface material is attached to a front surface of a copper substrate plug that is incorporated in a peripheral structure in a heat spreader. A back surface of the copper substrate plug is attached to a second thermal interface material. The second thermal interface material is attached to a heat conducting surface. The first thermal interface material comprises: a first layer of carbon nanotubes that are oriented substantially perpendicular to the front surface of the copper substrate plug, and a first filler material located between the carbon nanotubes in the first layer of carbon nanotubes. The second thermal interface material comprises: a second layer of carbon nanotubes that are oriented substantially perpendicular to the back surface of the copper substrate plug, and a second filler material located between the carbon nanotubes in the second layer of carbon nanotubes.

Thus, the present invention provides composite carbon nanotube-based structures and methods that more efficiently remove heat from IC dies and other solid-state devices. Such structures and methods are compatible with current semiconductor packaging technology, provide low thermal resistances, and are low cost.

BRIEF DESCRIPTION OF THE DRAWINGS

For a better understanding of the aforementioned aspects of the invention as well as additional aspects and embodiments thereof, reference should be made to the Description of Embodiments below, in conjunction with the following drawings in which like reference numerals refer to corresponding parts throughout the figures. For clarity, features in some figures are not drawn to scale.

FIG. 11A is a flow diagram illustrating a process for incorporating a copper substrate plug into a peripheral structure of a heat spreader or a heat sink in accordance with some embodiments.

DESCRIPTION OF EMBODIMENTS

Figure 1A:
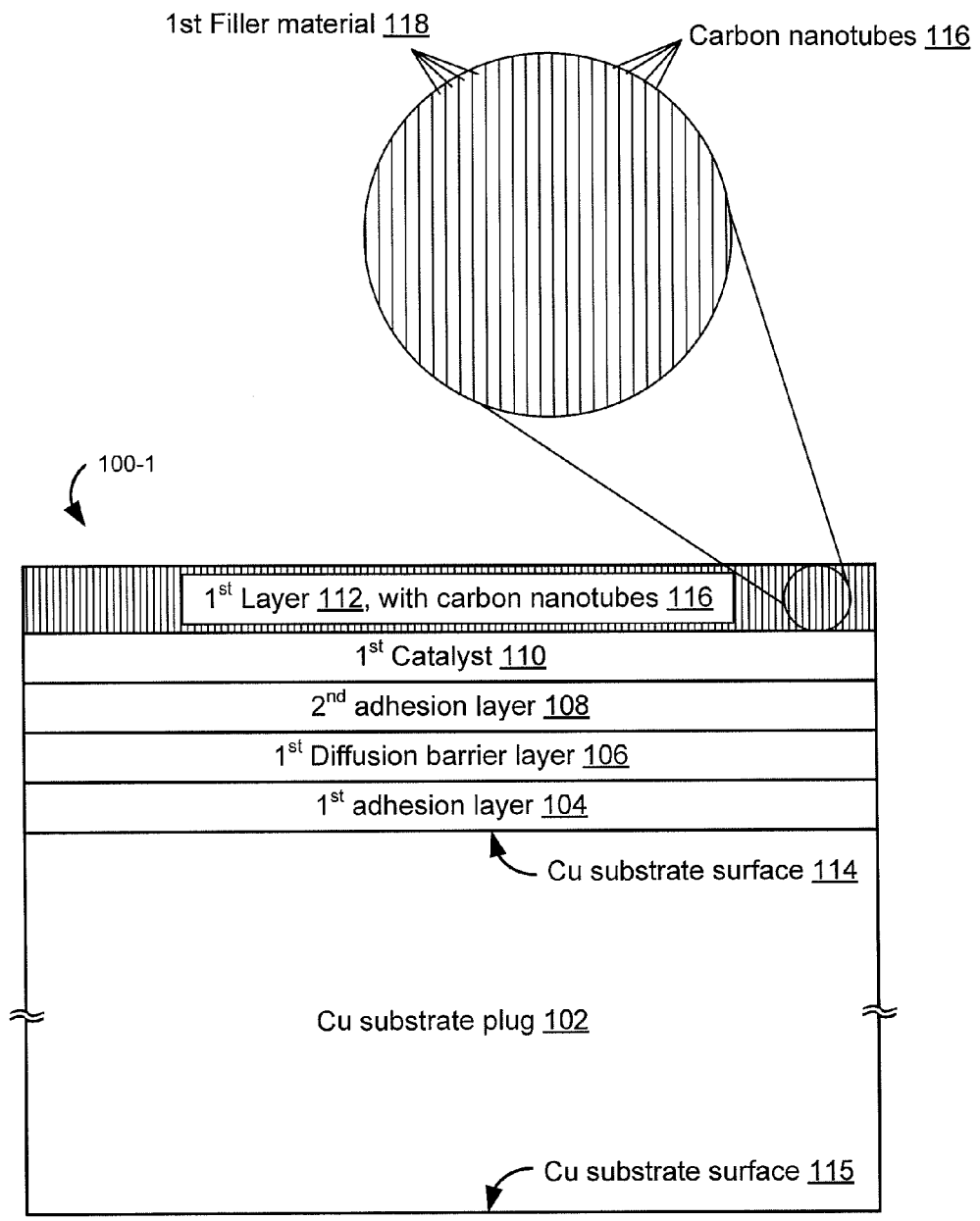
FIG. 1A-1D are schematic cross sections of articles of manufacture in accordance with some embodiments.

Carbon nanotube-based structures and methods for removing heat from ICs and other solid-state devices are described. As used in the specification and claims, "carbon nanotubes" include carbon nanotubes of varying structural quality, from carbon nanotubes with few defects to carbon nanotubes with many defects (the latter of which are sometimes referred to in the art as "carbon nanofibers"). Thus, as used herein, "carbon nanotubes" include "carbon nanofibers." Reference will be made to certain embodiments of the invention, examples of which are illustrated in the accompanying drawings. While the invention will be described in conjunction with the embodiments, it will be understood that it is not intended to limit the invention to these particular embodiments alone. On the contrary, the invention is intended to cover alternatives, modifications and equivalents that are within the spirit and scope of the invention as defined by the appended claims.

Moreover, in the following description, numerous specific details are set forth to provide a thorough understanding of the present invention. However, it will be apparent to one of ordinary skill in the art that the invention may be practiced without these particular details. In other instances, methods, procedures, and components that are well known to those of ordinary skill in the art are not described in detail to avoid obscuring aspects of the present invention.

It will be understood that when a layer is referred to as being "on top of" another layer, it can be directly on the other layer or intervening layers may also be present. In contrast, when a layer is referred to as "contacting" another layer, there are no intervening layers present.

It will also be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer, without departing from the scope of the present invention.

Furthermore, relative terms, such as "lower" or "bottom" and "upper" or "top," may be used herein to describe one layer's relationship to another layer relative to the substrate surface on which the layers were formed. For example, in FIG. 1C, the first diffusion barrier 106 is on top of the first adhesion layer 104 relative to the front surface 114 of the copper substrate plug 102. Similarly, in FIG. 1C, the second diffusion barrier 124 is on "top" of the third adhesion layer 122 relative to the back surface 115 of the copper substrate plug 102, even though the second diffusion barrier 124 is below the third adhesion layer 122 for the orientation of article 100-3 depicted in FIG. 1C.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The present invention is described below with reference to block diagrams and/or flowchart illustrations of systems, devices, and/or methods according to embodiments of the invention. It should be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

Thermal Interface Material(s) on Copper Substrate Plugs

Figure 1B:
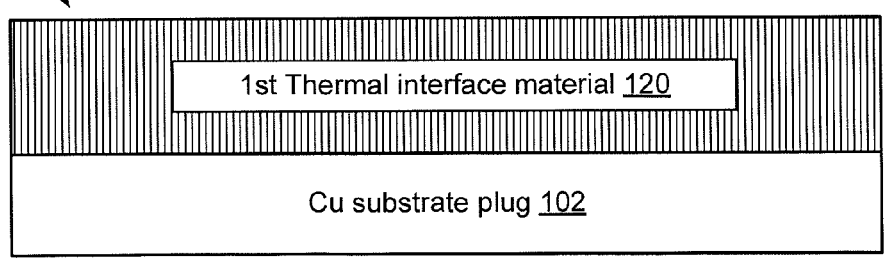
Figure 1C:
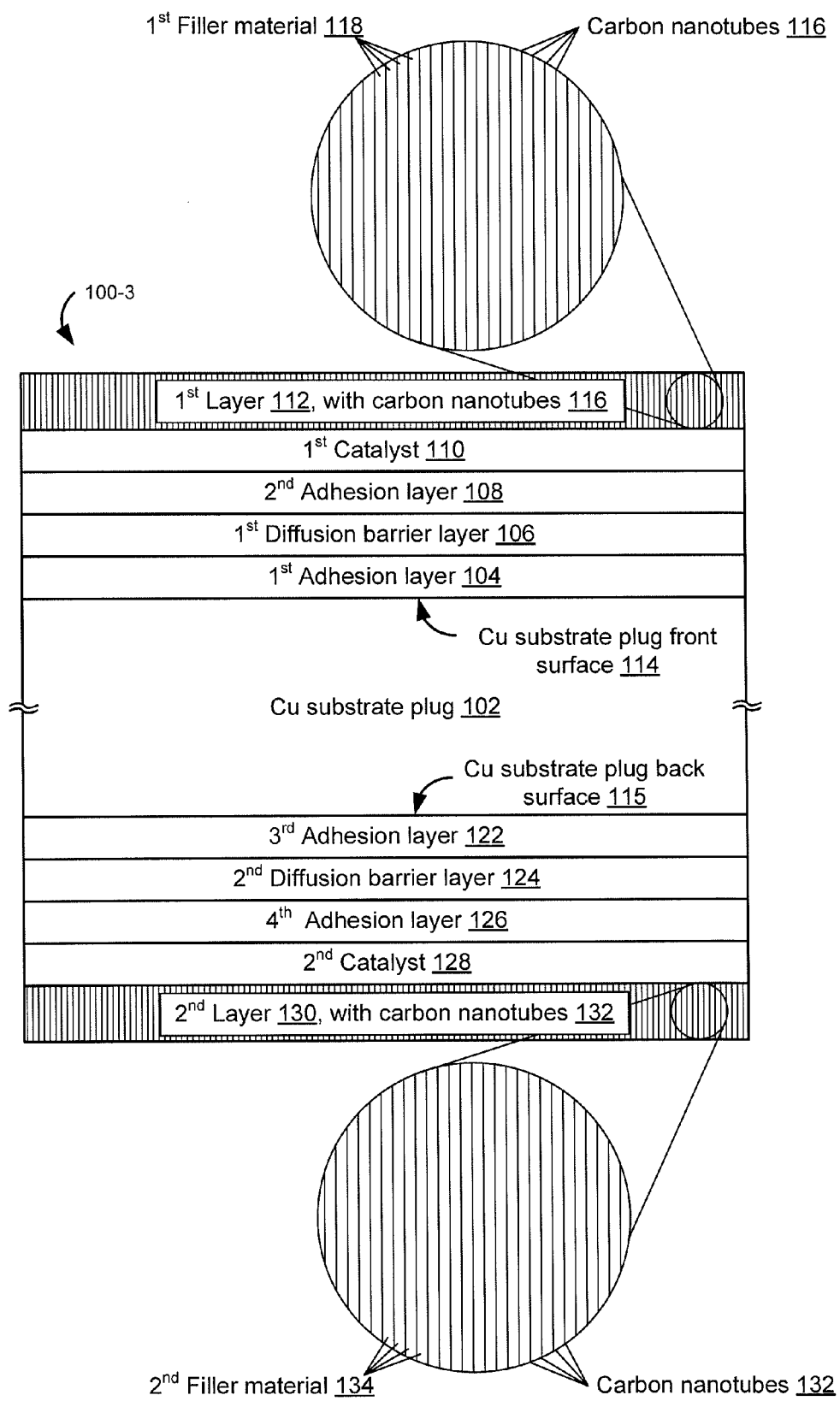
Figure 1D:
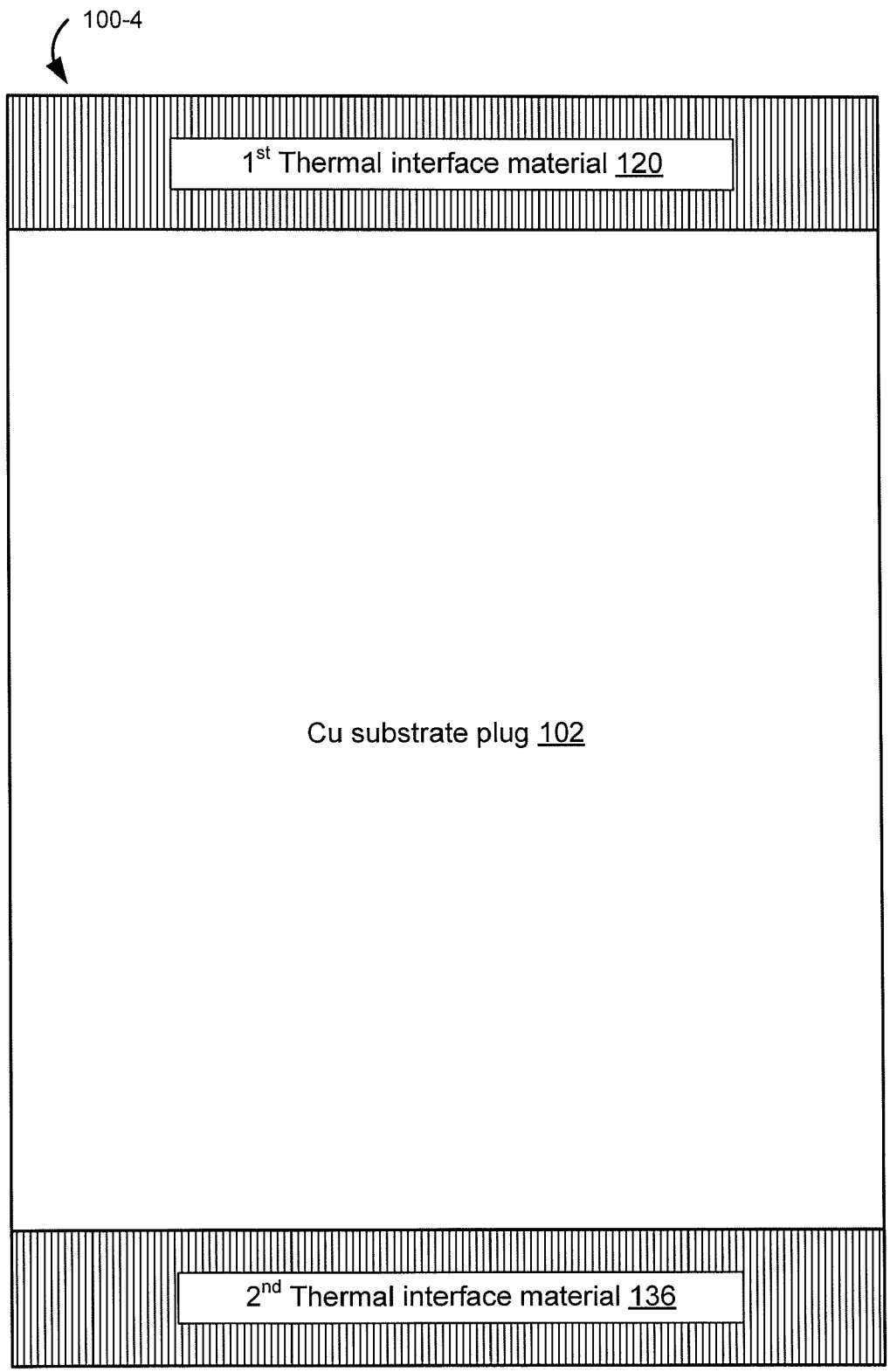

FIGS. 1A-1D are schematic cross sections of articles of manufacture 100 in accordance with some embodiments. FIGS. 1A and 1B illustrate a copper substrate plug 102 with a thermal interface material comprising carbon nanotubes grown on one surface of the plug. FIGS. 1C and 1D illustrate a copper substrate plug 102 with thermal interface materials comprising carbon nanotubes grown on both the front and back surfaces of the plug. The thermal interface material may cover an entire surface of the copper substrate plug (e.g., FIGS. 1A-1D) or just a portion thereof (e.g., FIGS. 9A-9B). The sides of the copper substrate plugs may be perpendicular to the front and back surfaces of the copper substrate plug (e.g., FIGS. 1A-1D and FIG. 2C(1)) or other various shapes, as illustrated in FIGS. 2C(2)-2C(5). For simplicity, the sides of the copper substrate plugs are shown as perpendicular to the front and back surfaces of the copper substrate plug in all of the figures except FIGS. 2C(2)-2C(5). The copper substrate plugs 102 are configured to be incorporated in a peripheral structure 205 of a heat spreader 206 (e.g., FIG. 2A-2B) or a heat sink (not shown).

The articles of manufacture 100 comprise a copper substrate plug 102 with a front surface (e.g., 114) and a back surface (e.g., 115). Copper substrate plug 102 has a thermal resistance, which will be referred to as the "copper substrate plug thermal resistance" in the specification and claims. The copper substrate plug 102 may be pure copper (e.g., electrical copper with at least 99.99% purity) or a copper alloy. In some embodiments, the copper substrate plug 102 contains less than 40 parts per million (ppm) oxygen. In some embodiments, the copper substrate plug 102 contains 10 ppm oxygen or less. In some embodiments, the copper substrate plug 102 is oxygen-free copper (OFC). We have found that reducing the amount of oxygen in the copper substrate increases the uniformity of the carbon nanotubes that are subsequently grown on top of the copper substrate surface(s).

For clarity, the thicknesses of the layers in FIGS. 1A-1D are not drawn to scale. In FIGS. 1A and 1C, the thin films between the first layer 112 containing carbon nanotubes 116 and the copper substrate 102 (e.g., first adhesion layer 104, first diffusion barrier layer 106, second adhesion layer 108, and first catalyst 110) are much thinner than the first layer 112 containing carbon nanotubes 116 and the copper substrate plug 102. Similarly, in FIG. 1C, the thin films between the second layer 130 containing carbon nanotubes 132 and the copper substrate plug 102 (e.g., third adhesion layer 122, second diffusion barrier layer 124, fourth adhesion layer 126, and second catalyst 128) are much thinner than the second layer 130 containing carbon nanotubes 116 and the copper substrate plug 102. These thin films are not shown in FIGS. 1B and 1D.

First thermal interface material 120 includes the first layer 112 with carbon nanotubes 116 and a first filler material 118 (e.g. a wax, an ester, an acrylate, a phase change material, or mixtures thereof, as described below) located between the carbon nanotubes in the first layer 112 with carbon nanotubes 116. Similarly, second thermal interface material 136 includes the second layer 130 with carbon nanotubes 132 and a second filler material 134 (e.g. a wax, an ester, an acrylate, a phase change material, or mixtures thereof, as described below) located between the carbon nanotubes in the second layer 130 with carbon nanotubes 132.

Figure 2A:
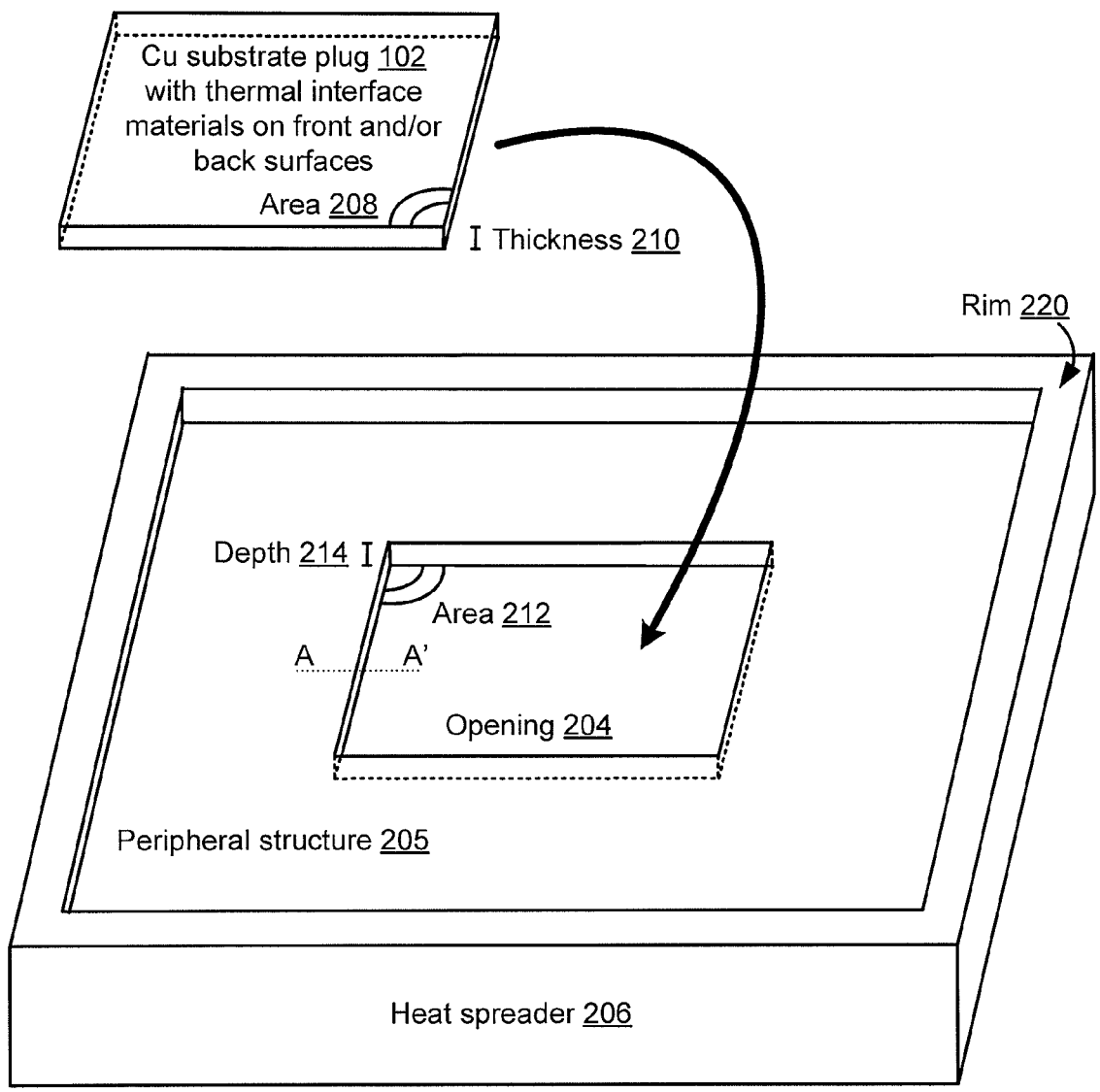
FIG. 2A-2B are schematic drawings of copper substrate plugs with thermal interface materials on the front and/or back surfaces that are configured to be incorporated in a peripheral structure in a heat spreader in accordance with some embodiments.
Figure 2B:
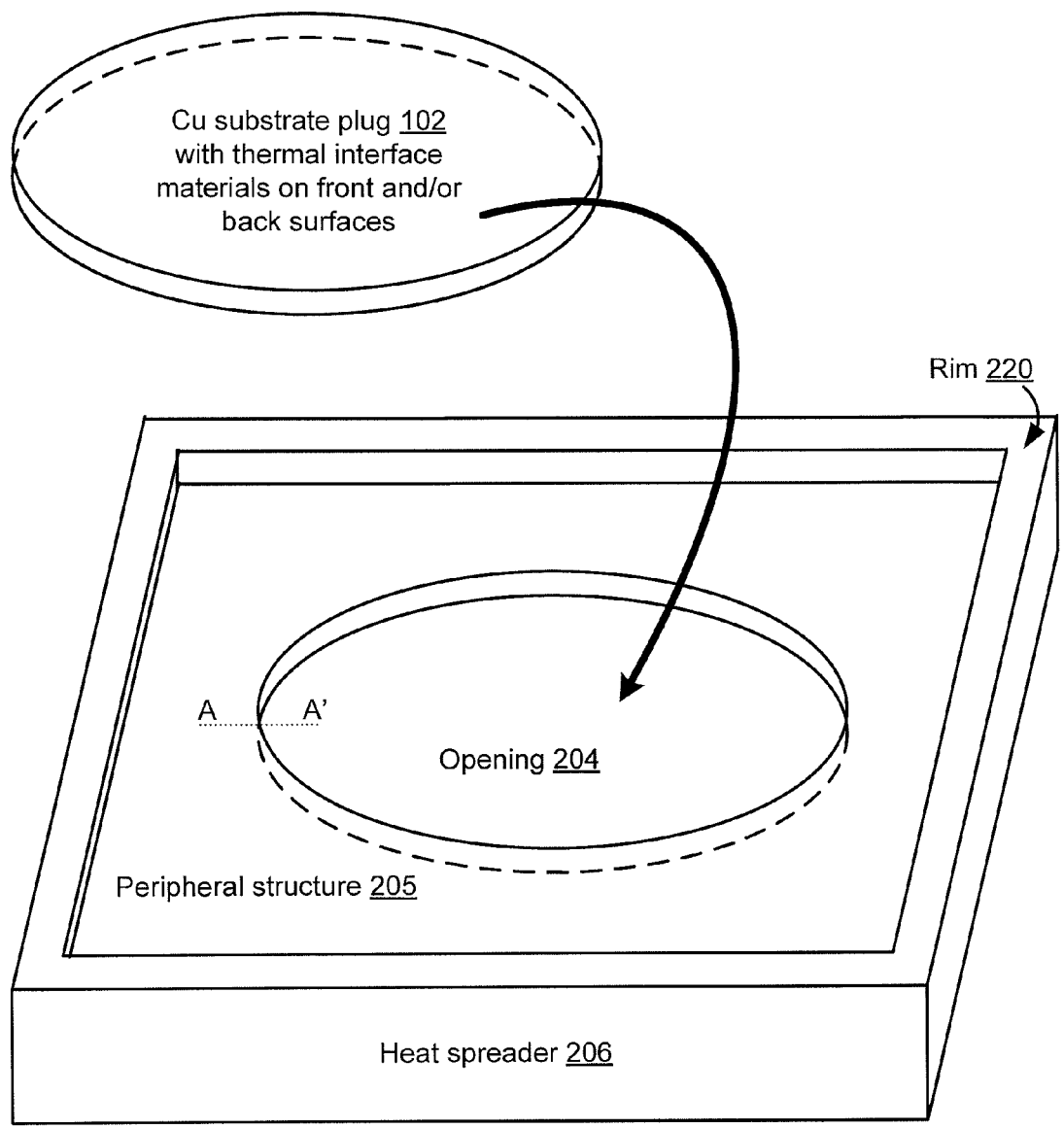
Figure 2C:
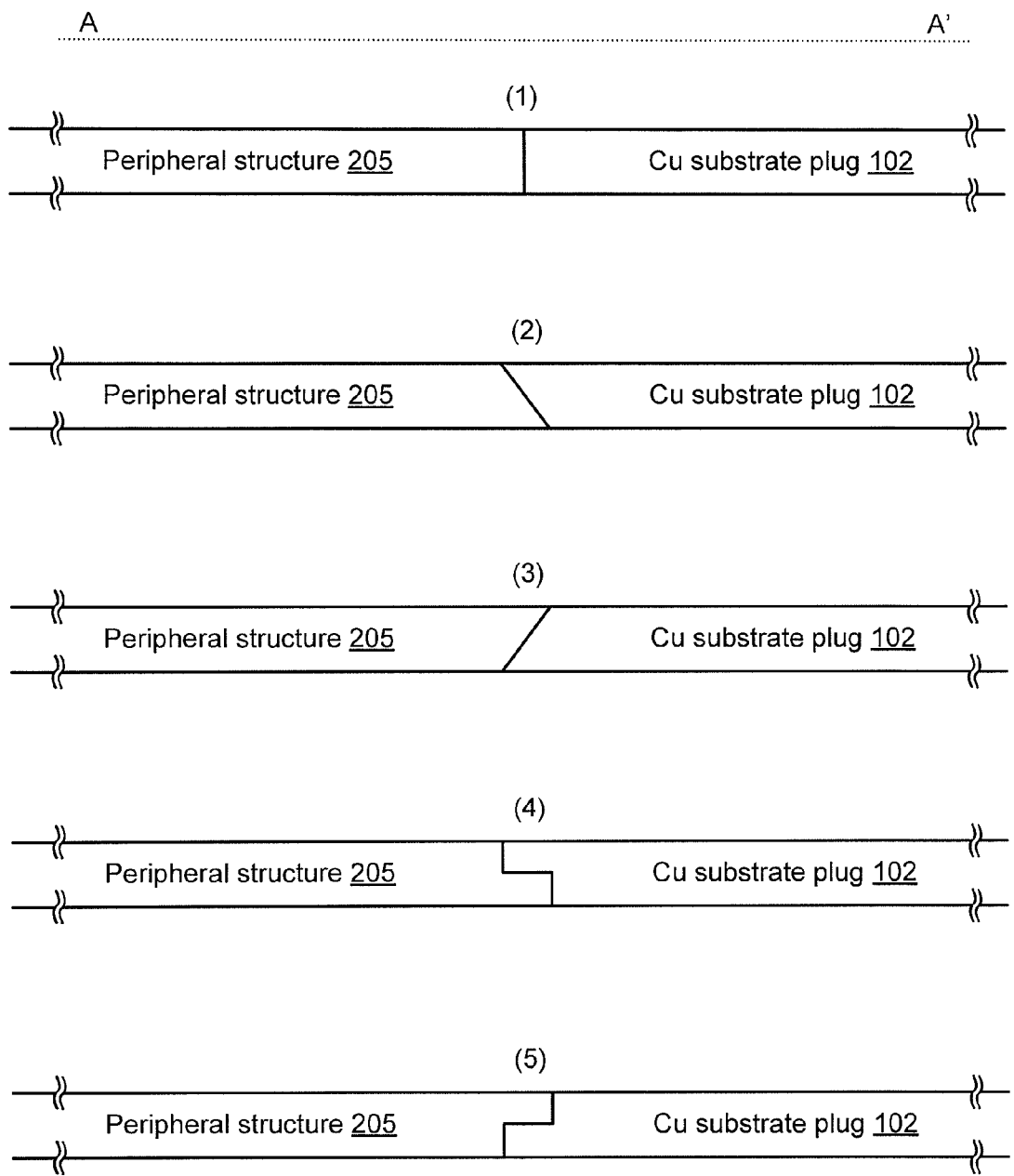
FIG. 2C shows schematic cross sections of the sides of the copper substrate plug and the peripheral structure in accordance with some embodiments.

FIG. 2A-2B are schematic drawings of copper substrate plugs 102 with thermal interface materials on the front and/or back surfaces that are configured to be incorporated in a peripheral structure 205 in a heat spreader 206 in accordance with some embodiments.

In some embodiments, the copper substrate plug 102 has a shape that is configured to fit in an opening 204 in a peripheral structure 205 of a heat spreader 206 (or a heat sink, not shown). In some embodiments, the copper substrate plug 102 has a square or rectangular shape (e.g., FIG. 2A). In some embodiments, the copper substrate plug 102 has a substantially square or rectangular shape (e.g., a square or rectangle with rounded corners). In some embodiments, the copper substrate plug 102 has a circular shape (e.g., FIG. 2B). In some embodiments, the copper substrate plug 102 has a polyhedral shape. In some embodiments, the copper substrate plug 102 has a cross-sectional area 208 and thickness 210 that substantially correspond to the cross-sectional area 212 and depth 214 of the opening 204, respectively. In some embodiments, the copper substrate plug cross-sectional area 208 is slightly smaller than the cross-sectional area 212 of the opening 204 to allow for bonding material(s) that attach the substrate plug 102 to the peripheral structure 205 in the heat spreader (or heat sink). In some embodiments, the copper substrate plug cross-sectional area 208 is slightly larger than the cross-sectional area 212 of the opening 204 to allow the substrate plug to be incorporated in the peripheral structure 205 in the heat spreader with a press fit technique, described below with respect to FIG. 1B. Typical plug areas 208 range from 49 mm² (e.g., 7 mm×7 mm) to 2500 mm² (e.g., 50 mm×50 mm). Typical plug thicknesses 210 range from 0.1 mm to 4.0 mm, with 0.5 mm to 2.5 mm being preferred. For ASIC applications, the plug thickness is typically from 0.3 mm to 0.6 mm. In some embodiments, the peripheral structure 205 of the heat spreader 206 is made of copper, a copper alloy, nickel-plated copper, or another high thermal conductivity substrate. In some embodiments, the heat spreader 206 does not have a rim 220. In some embodiments, the peripheral structure 205 may include a plurality of openings 204 that can incorporate a corresponding plurality of copper substrate plugs 102 (not shown).

In some embodiments, the copper substrate plug 102 has a cross-sectional area 208 that substantially corresponds to the cross-sectional area of an integrated circuit or other solid-state device (e.g., a light emitting diode, laser, power transistor, RF device, or solar cell). Thus, the area of thermal interface material 120 formed on the copper substrate plug 102 can be tailored to the corresponding area of an integrated circuit or other solid-state device that will contact the thermal interface material 120.

FIG. 2C shows schematic cross sections of the sides of the copper substrate plug and the peripheral structure in accordance with some embodiments. In some embodiments, the side of the copper substrate plug 102 is perpendicular to the front and back surfaces of the copper substrate plug (e.g., FIG. 2C(1)). In some embodiments, the side of the copper substrate plug 102 is tapered between the front and back surfaces of the copper substrate plug (e.g., FIGS. 2C(2) and 2C(3)). In some embodiments, the side of the copper substrate plug 102 forms one or more "stair steps" between the front and back surfaces of the copper substrate plug (e.g., FIGS. 2C(4) and 2C(5)). For simplicity, figures other than FIG. 2C show the sides of the copper substrate plug as just a straight edge (i.e., like that shown in FIG. 2C(1)).

In some embodiments, the lateral dimensions of the copper substrate plug 102 are greater than the corresponding dimensions of the solid state device to be cooled such that the sides of the copper substrate plug 102 are outside the main heat conduction path. The amount of lateral spreading that occurs in the copper substrate plug 102 (e.g., as heat passes from the solid state device through a first thermal interface material, through the plug 102, and through a second thermal interface material to a heat sink) is governed by the thermal conductivity of the copper substrate plug 102 (~4 W/cm/K), the thickness of the copper substrate plug 102, and the resistance of the second thermal interface material on the heat sink side of the plug (TIM2). In the case where the second thermal interface material is an efficient heat conductor, the amount of lateral spreading in the plug 102 can be expressed by the following equation:

$$L_H = (r_{TIM2} \times d \times k)^{0.5} \tag{1}$$

where:
$L_H$ is the lateral spreading length,
$r_{TIM2}$ is the thermal resistance of the second thermal interface material,
d is the thickness of the plug 102, and
k is the thermal conductivity of the plug 102.

Figure 13A:
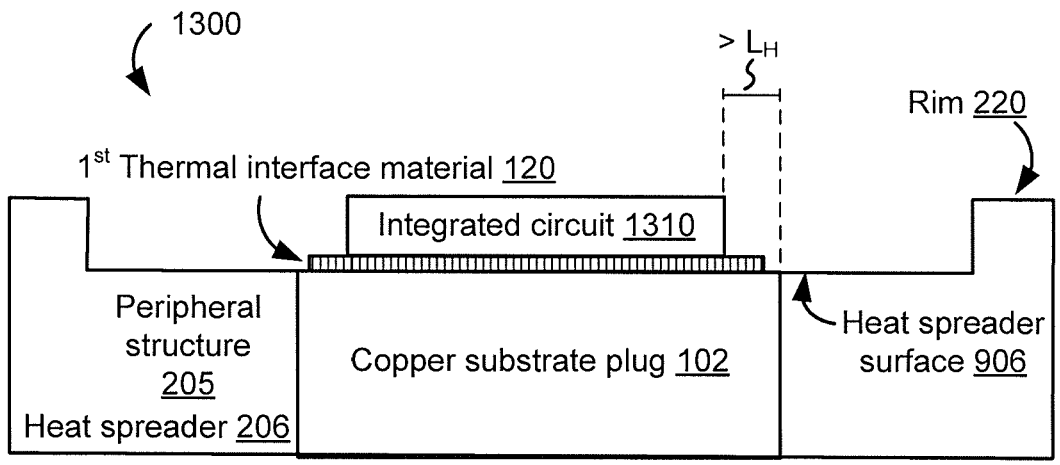
FIG. 13A illustrates a side view of an article of manufacture that includes a solid-state device (e.g., an integrated circuit) and a heat spreader with a copper substrate plug incorporated in a peripheral structure of the heat spreader in accordance with some embodiments.
Figure 13B:
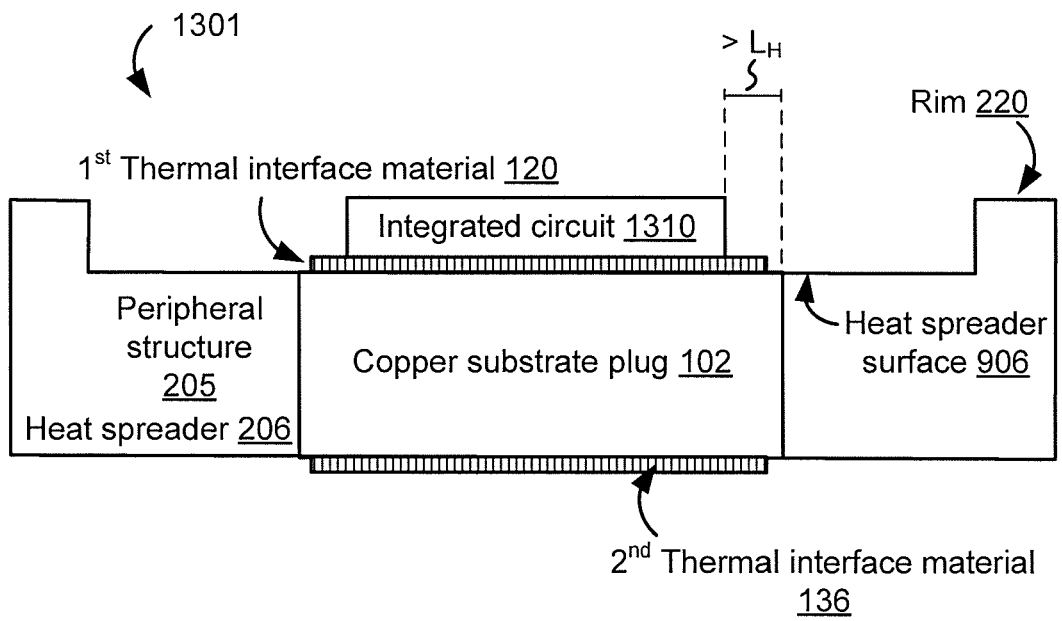
FIG. 13B illustrates a side view of an article of manufacture that comprises a solid-state device (e.g., an integrated circuit) and a heat spreader with a copper substrate plug incorporated in a peripheral structure of the heat spreader in accordance with some embodiments.

By designing the plug 102 such that $L_H$ is less than the distance from a respective side of the solid-state device to a corresponding respective side of the plug 102 when the solid-state device is in contact with the plug 102 (or in contact with the intervening first thermal interface material), the sides of the plug 102 remain out of the main heat conduction path (e.g., see FIGS. 13A and 13B, which are not drawn to scale). Thus, the impact of any thermal resistance at the interface between the sides of the plug 102 and the corresponding sides of the peripheral structure 205 becomes negligible. For $r_{TIM2}=0.020$ cm²K/W, d=0.2 cm, and k=4 W/cm/K, the lateral spreading length $L_H$ is 0.12 cm.

In some embodiments, the article of manufacture 100 includes a first adhesion layer 104 that contacts the front surface 114 of the copper substrate plug 102. The first adhesion layer helps keep subsequent layers firmly attached to the copper substrate plug. In some embodiments, the first adhesion layer 104 has a thickness between 200 and 5000 Å and comprises Ti, TiN, Cr, or Ta. In some embodiments, the first adhesion layer 104 has a thickness between 200 and 500 Å and comprises Ti.

In some embodiments, the article of manufacture 100 includes a first diffusion barrier layer 106 on top of the first adhesion layer 104. The first diffusion barrier layer minimizes diffusion of a first catalyst 110 into the copper substrate plug during subsequent high-temperature processing (e.g., during nanotube growth). In some embodiments, the first diffusion barrier layer 106 has a thickness between 100 and 400 Å and comprises TiN, $SiO_2$, $Al_2O_3$, or TaN. In some embodiments, the first diffusion barrier layer 106 has a thickness between 100 and 400 Å and comprises TiN.

In some embodiments, the article of manufacture 100 includes a second adhesion layer 108 between the first diffusion barrier layer 106 and the first catalyst 110. Although not required, the second adhesion layer 108 promotes adhesion of the catalyst 110 during subsequent high-temperature processing (e.g., during nanotube growth), when thermal stresses create nucleation sites in the first catalyst 110. In some embodiments, the second adhesion layer 108 has a thickness between 25 and 400 Å and comprises Ti, $SiO_2$, TiN, $Al_2O_3$, or Mo. In some embodiments, the second adhesion layer 108 has a thickness between 25 and 200 Å and comprises Ti.

The article of manufacture 100 includes a first catalyst 110 on top of the copper substrate plug front surface 114. As the name implies, the first catalyst catalyzes growth of the carbon nanotubes 116. The first catalyst is deposited as a layer. The first catalyst layer may subsequently form catalyst particles that act as carbon nanotube nucleation sites during the process used to form carbon nanotubes 116. In some embodiments, the as-deposited first catalyst 110 has a thickness between 30 and 1000 Å and comprises Ni, Fe, or Co. In some embodiments, the as-deposited catalyst 110 has a thickness between 200 and 400 Å and comprises Ni.

The article of manufacture 100 also includes a first layer 112 containing carbon nanotubes 116 that contacts the first catalyst 110. The carbon nanotubes 116 are oriented substantially perpendicular to the front surface 114 of the copper substrate plug. This orientation minimizes the thermal resistance of the first layer 112 and of first thermal interface materials 120 that include the first layer 112. In some embodiments, the carbon nanotubes 116 comprise multiwalled carbon nanotubes.

In some embodiments, the article of manufacture 100 includes a third adhesion layer 122 that contacts the back surface 115 of the copper substrate 102. The third adhesion layer helps keep subsequent layers firmly attached to the copper substrate plug. In some embodiments, the third adhesion layer 122 has a thickness between 200 and 5000 Å and comprises Ti, TiN, Cr, or Ta. In some embodiments, the third adhesion layer 122 has a thickness between 200 and 600 Å and comprises Cr.

In some embodiments, the article of manufacture 100 includes a second diffusion barrier layer 124 on top of the third adhesion layer 122. The second diffusion barrier layer minimizes diffusion of a second catalyst 128 into the copper substrate plug during subsequent high-temperature processing (e.g., during nanotube growth). In some embodiments, the second diffusion barrier layer 124 has a thickness between 100 and 600 Å and comprises TiN, $SiO_2$, $Al_2O_3$, or TaN. In some embodiments, the second diffusion barrier layer 124 has a thickness between 400 and 600 Å and comprises $SiO_2$ or $Al_2O_3$.

In some embodiments, the article of manufacture 100 includes a fourth adhesion layer 126 between the second diffusion barrier layer 124 and the second catalyst 128. Although not required, the fourth adhesion layer 126 promotes adhesion of the second catalyst 128 during subsequent high-temperature processing (e.g., during nanotube growth), when thermal stresses create nucleation sites in the second catalyst 128. In some embodiments, the fourth adhesion layer 124 has a thickness between 25 and 400 Å and comprises Ti, $SiO_2$, TiN, $Al_2O_3$, or Mo. In some embodiments, the fourth adhesion layer 126 has a thickness between 25 and 200 Å and comprises Ti.

In some embodiments, the article of manufacture 100 includes a second catalyst 128 on top of the copper substrate plug back surface 115. As the name implies, the second catalyst catalyzes growth of the carbon nanotubes 132. The second catalyst is deposited as a layer. The second catalyst layer may subsequently form catalyst particles that act as carbon nanotube nucleation sites during the process used to form carbon nanotubes 132. In some embodiments, the as-deposited second catalyst 128 has a thickness between 30 and 1000 Å and comprises Ni, Fe, or Co. In some embodiments, the as-deposited second catalyst 128 has a thickness between 30 and 100 Å and comprises Fe.

In some embodiments, the article of manufacture 100 also includes a second layer 130 containing carbon nanotubes 132 that contacts the second catalyst 128. The carbon nanotubes 132 are oriented substantially perpendicular to the back surface 115 of the copper substrate plug. This orientation minimizes the thermal resistance of the second layer 130 and of second thermal interface materials 136 that include the second layer 130. In some embodiments, the carbon nanotubes 132 comprise multiwalled carbon nanotubes.

Figure 3:
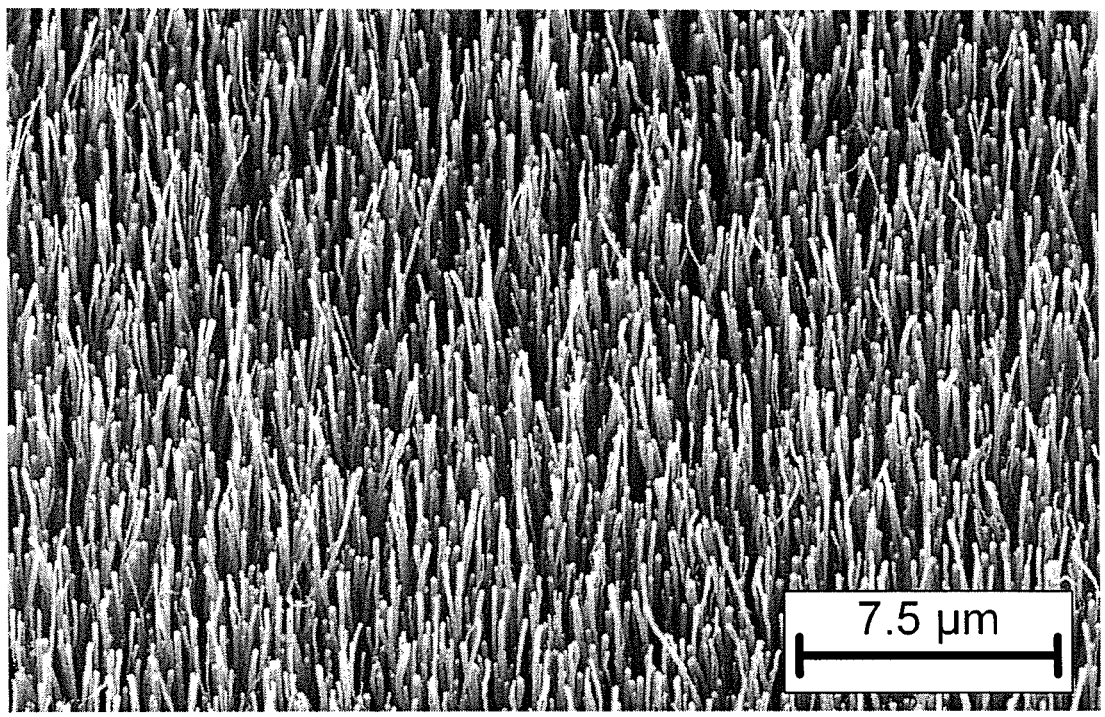
FIG. 3 is a scanning electron microscope image of a layer containing carbon nanotubes in accordance with some embodiments.

FIG. 3 is a scanning electron microscope image of a layer (e.g., 112 or 130) containing carbon nanotubes in accordance with some embodiments.

In some embodiments, the carbon nanotubes 116 and/or 132 have an average diameter between 60 nm and 200 nm. In some embodiments, the carbon nanotubes 116 and/or 132 have an average diameter between 100 nm and 150 nm. In some embodiments, the carbon nanotubes 116 and/or 132 have an average length between 5 and 50 μm. In some embodiments, the carbon nanotubes 116 and/or 132 have an average length between 20 and 100 μm, with a preferred average length between 25 and 50 μm. Depending on the size of the solid state device and the non-planarity (warping) of its surface, longer carbon nanotubes may be used to provide good thermal contact over the bond line thickness between the solid state device (e.g., an integrated circuit) and the copper substrate plug. In some embodiments, the carbon nanotubes 116 and/or 132 have a tip density between 10 and 40 nanotubes per $\mu m^2$. In some embodiments, the carbon nanotubes 116 and/or 132 have a surface area coverage density between 15 and 40 percent.

In some embodiments, substantially all (e.g., >85%) of the carbon nanotubes 116 and/or 132 are individually separated from each other. Although axial thermal conduction of carbon nanotubes is very high, lateral thermal conduction (in the non-axial direction from nanotube to nanotube) is not as good. In fact, it has been found that lateral contact between axially aligned nanotubes can reduce their effective axial thermal conductivity. If the number of carbon nanotubes attached to substrate is too high (for example, >40% carbon nanotube density) Van der Waals forces will create a bundle or mat situation resulting in poor thermal conduction. If, on the other hand the coverage density is too low (for example, <15%), thermal conduction will also be lower due to the reduced number of conducting nanotubes. A preferred range a coverage density is between about 15 and 40%, with 25 to 40% being most preferred. Thus, vertically aligned, individually separated, parallel carbon nanotubes with coverage between about 15 and 40%, may provide better overall thermal conduction than a bundle or mat of carbon nanotubes.

Figure 4A:
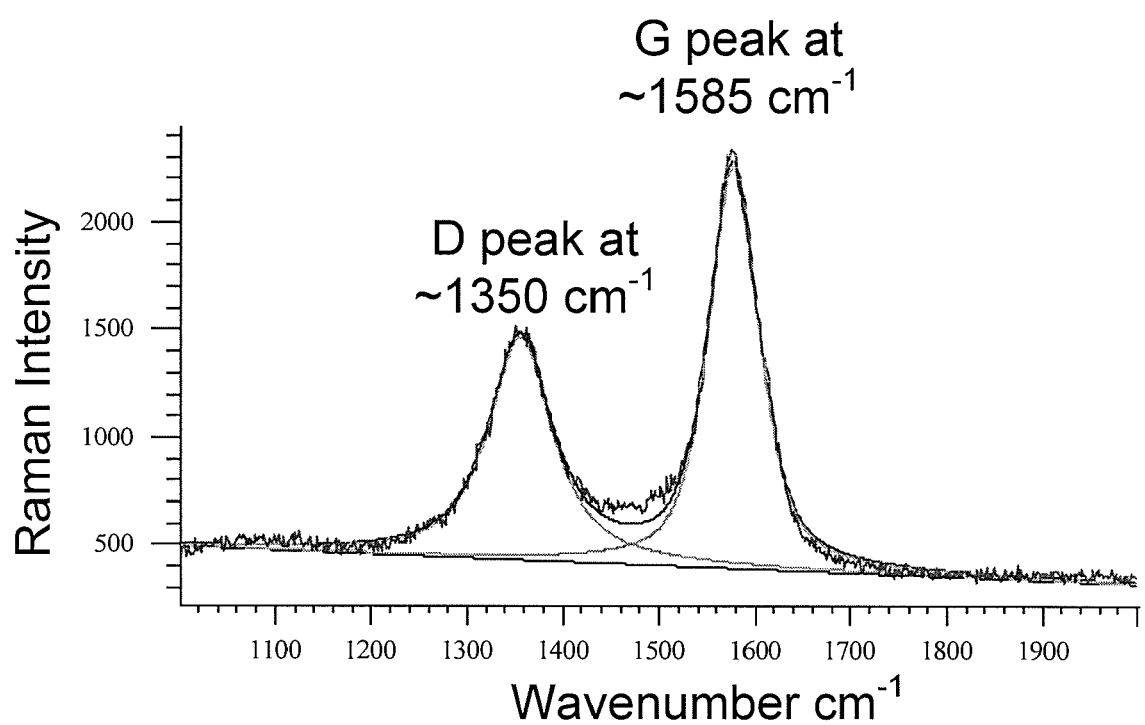
FIG. 4A is a Raman spectrum of a layer containing carbon nanotubes in accordance with some embodiments.

FIG. 4A is a Raman spectrum of a layer containing carbon nanotubes in accordance with some embodiments. The Raman spectrum of the layer (e.g., 112 or 130) containing carbon nanotubes 116 has a D peak at ~1350 $cm^{-1}$ with an intensity $I_D$ and a G peak at ~1585 $cm^{-1}$ with an intensity $I_G$.

Figure 4B:
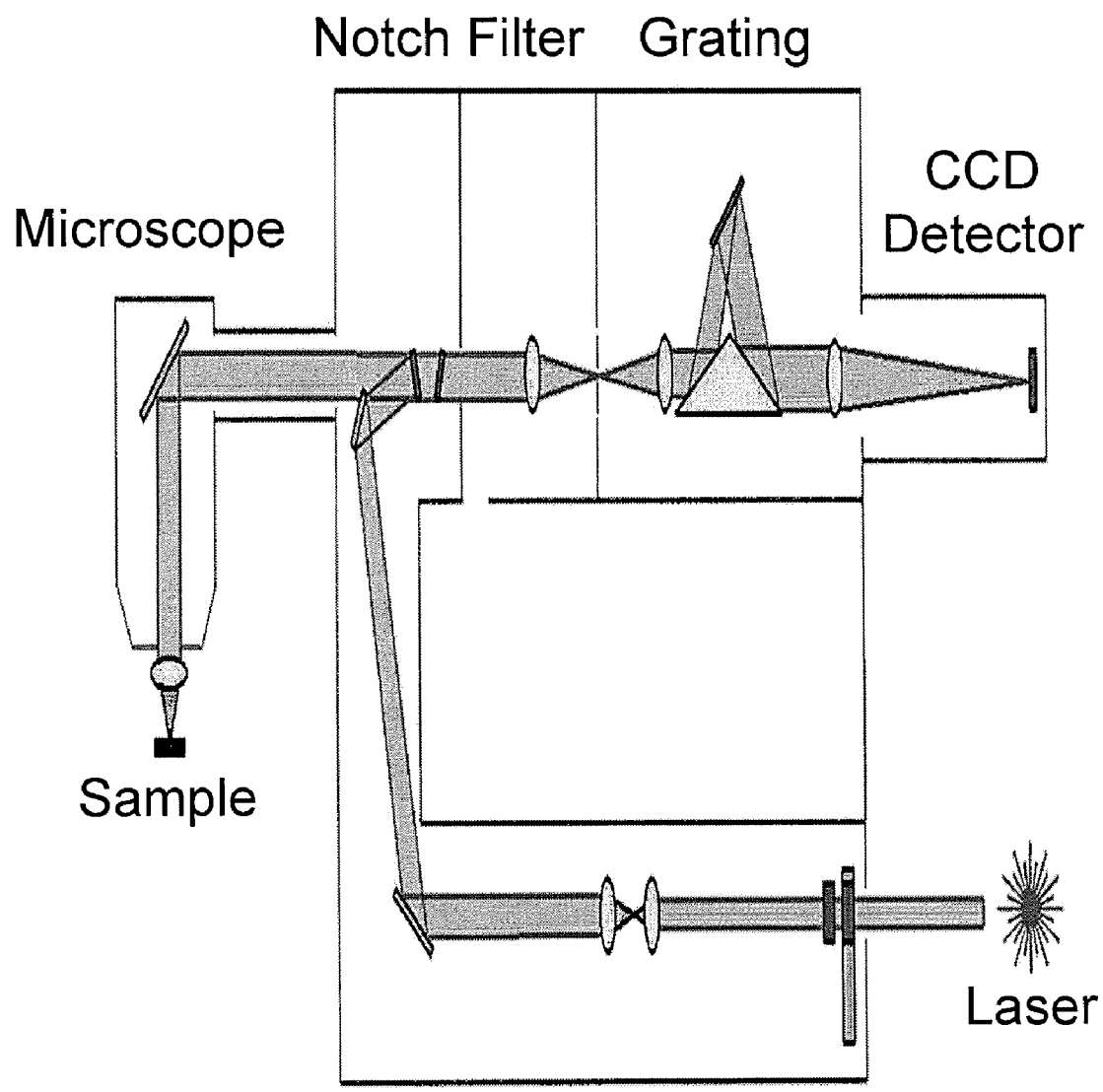
FIG. 4B is a schematic diagram of the experimental configuration for obtaining the Raman spectra in FIGS. 4A, 4C & 4D in accordance with some embodiments.
Figure 4C:
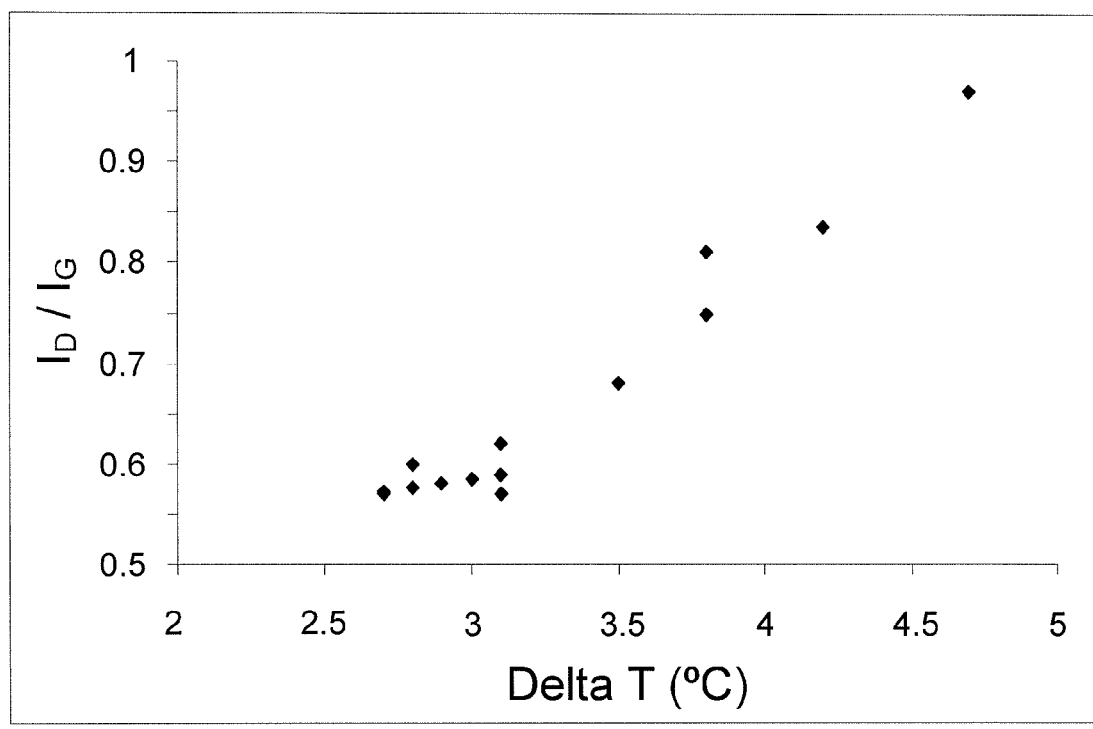
FIG. 4C is a plot of the Raman intensity ratio $I_D/I_G$ versus thermal performance for layers containing carbon nanotubes, where $I_D$ is the intensity of the D peak at ~1350 cm$^{-1}$ and $I_G$ is the intensity of the G peak at ~1585 cm$^{-1}$, in accordance with some embodiments.
Figure 4D:
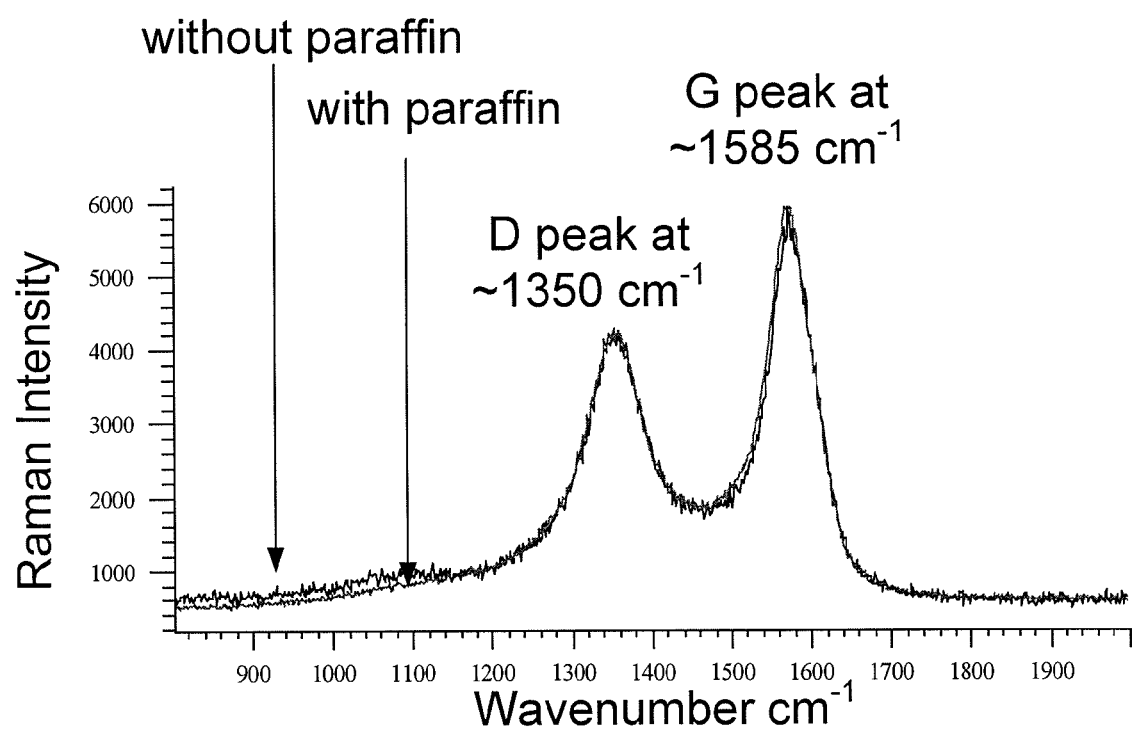
FIG. 4D shows Raman spectra of a layer containing carbon nanotubes with and without paraffin between the carbon nanotubes in accordance with some embodiments.

FIG. 4B is a schematic diagram of the experimental configuration for obtaining the Raman spectra in FIGS. 4A, 4C & 4D in accordance with some embodiments. A Renishaw in Via Raman microscope with a 514 nm laser beam was used to obtain the Raman spectra. A ~10 mW, ~10 $\mu m^2$ laser spot was directed onto the sample with a 50× objective lens. The laser spot was configured to hit the carbon nanotubes in a direction that was parallel to the axes of the carbon nanotubes. The Raman spectra were analyzed using Renishaw WiRE 2.0 software.

FIG. 4C is a plot of the Raman intensity ratio $I_D/I_G$ versus thermal performance for layers containing carbon nanotubes in accordance with some embodiments. We have found that the thermal performance of the layers (e.g., 112 and/or 130) containing carbon nanotubes depends strongly on the quality of the nanotubes grown, which, in turn, depends on the materials, layers, and growth conditions used. As shown in FIG. 4C, we have also found that Raman spectra from the layer of carbon nanotubes can be used to monitor the quality of the nanotubes. We have found that layers (e.g., 112 and/or 130) with an intensity ratio $I_D/I_G$ of less than 0.7 at a laser excitation wavelength of 514 nm provide good thermal performance (e.g., 0.060 $cm^2K/W$ or less, as described below), with an intensity ratio $I_D/I_G$ of less than 0.6 at a laser excitation wavelength of 514 nm being preferred. In FIG. 4C, the intensity ratio $I_D/I_G$ is plotted versus the temperature drop (Delta T, ° C.) across an ASTM D 5470 thermal interface material tester containing identical copper substrates with different single layers of carbon nanotubes. As shown in FIG. 4C, the temperature drop decreases (which corresponds to lower thermal resistance) as the $I_D/I_G$ intensity ratio decreases. These results were obtained for carbon nanotubes grown on copper coupons, but we expect these results will also apply to carbon nanotubes grown on copper substrate plugs, which will subsequently be incorporated into the peripheral structure of a heat spreader or heat sink.

The Raman measurements may be taken with no interstitial (i.e., filler) material (e.g., 118 or 134) between the nanotubes (e.g., before a phase change material is placed between the carbon nanotubes or after such a phase change material is removed from between the carbon nanotubes).

The Raman measurements may also be taken with an interstitial material between the nanotubes if the interstitial material does not interfere with the D peak at ~1350 $cm^{-1}$ and the G peak at ~1585 $cm^{-1}$. For example, FIG. 4D shows Raman spectra of a layer containing carbon nanotubes with and without paraffin between the carbon nanotubes in accordance with some embodiments. The D and G peaks in the two spectra and the corresponding $I_D/I_G$ intensity ratios are essentially the same.

In some embodiments, a 0.8 mm thick copper substrate with a thermal interface material comprising: (a) a layer containing carbon nanotubes (with an average length of 25-45 μm) and (b) paraffin wax had a thermal resistance of 0.08 cm²K/W or less. This thermal resistance is a summation of: (1) the bulk thermal resistance of the copper substrate (0.02 cm²K/W for a 0.8 mm thick copper substrate), (2) the contact resistance between the thermal interface material and the copper substrate, (3) the bulk thermal resistance of the thermal interface material, and (4) the contact resistance between the thermal interface material and an integrated circuit or other solid-state device. Thus, the summation of (2)-(4) (i.e., the bulk thermal resistance of the thermal interface material and the two contact resistances associated with the thermal interface material) is 0.060 cm²K/W or less. In some embodiments, for a thermal interface material comprising (a) the layer containing carbon nanotubes and (b) paraffin wax, the sum of the bulk thermal resistance of the thermal interface material and the two contact resistances associated with the thermal interface material is 0.050 cm²K/W or less. In some embodiments, the sum of the bulk thermal resistance of the thermal interface material and the two contact resistances associated with the thermal interface material is 0.040 cm²K/W or less. In some embodiments, the sum of the bulk thermal resistance of the thermal interface material and the two contact resistances associated with the thermal interface material is 0.030 cm²K/W or less. In some embodiments, the sum of the bulk thermal resistance of the thermal interface material and the two contact resistances associated with the thermal interface material is 0.020 cm²K/W or less. In some embodiments, the sum of the bulk thermal resistance of the thermal interface material and the two contact resistances associated with the thermal interface material is between 0.020-0.060 cm²K/W. In some embodiments, the sum of the bulk thermal resistance of the thermal interface material and the two contact resistances associated with the thermal interface material is between 0.020-0.050 cm²K/W. In some embodiments, the sum of the bulk thermal resistance of the thermal interface material and the two contact resistances associated with the thermal interface material is between 0.020-0.040 cm²K/W. These values are better than what is achieved with conventional thermal interface materials and with prior thermal interface materials that include a layer of carbon nanotubes on a single surface of a copper substrate. These results were obtained for carbon nanotubes grown on copper coupons, but we expect these results will also apply to carbon nanotubes grown on copper substrate plugs, which will subsequently be incorporated into the peripheral structure of a heat spreader or heat sink.

In some embodiments, a copper substrate with a thermal interface material on one surface comprising: (a) the layer containing carbon nanotubes (e.g., with an average length of 25-45 μm) and (b) filler material (e.g. a wax, an ester, an acrylate, a phase change material, or mixtures thereof) has a thermal resistance of 0.060 cm²K/W or less, excluding the thermal resistance due to the bulk thermal resistance of the copper substrate. This thermal resistance is a summation of: (1) the contact resistance between the thermal interface material and the copper substrate, (2) the bulk thermal resistance of the thermal interface material, and (3) the contact resistance between the thermal interface material and a solid-state device (e.g., an IC) or the equivalent of a solid-state device for testing purposes (e.g., a thermal testing vehicle (TTV) or a heated copper block). Thus, the summation of (1)-(3) (i.e., the bulk thermal resistance of the thermal interface material and the two contact resistances associated with the thermal interface material) is 0.060 cm²K/W or less. In some embodiments, the sum of the bulk thermal resistance of the thermal interface material and the two contact resistances associated with the thermal interface material is 0.050 cm²K/W or less. In some embodiments, the sum of the bulk thermal resistance of the thermal interface material and the two contact resistances associated with the thermal interface material is 0.040 cm²K/W or less. In some embodiments, the sum of the bulk thermal resistance of the thermal interface material and the two contact resistances associated with the thermal interface material is 0.030 cm²K/W or less. In some embodiments, the sum of the bulk thermal resistance of the thermal interface material and the two contact resistances associated with the thermal interface material is 0.020 cm²K/W or less. In some embodiments, the sum of the bulk thermal resistance of the thermal interface material and the two contact resistances associated with the thermal interface material is between 0.020-0.060 cm²K/W. In some embodiments, the sum of the bulk thermal resistance of the thermal interface material and the two contact resistances associated with the thermal interface material is between 0.020-0.050 cm²K/W. In some embodiments, the sum of the bulk thermal resistance of the thermal interface material and the two contact resistances associated with the thermal interface material is between 0.020-0.040 cm²K/W. These values are better than what is achieved with conventional thermal interface materials and with prior thermal interface materials that include a layer of carbon nanotubes on a single surface of a copper substrate. These results were obtained for carbon nanotubes grown on copper coupons, but we expect these results will also apply to carbon nanotubes grown on copper substrate plugs, which will subsequently be incorporated into the peripheral structure of a heat spreader or heat sink.

In some embodiments, a copper substrate with: (a) a first thermal interface material comprising the first layer containing carbon nanotubes (e.g., with an average length of 25-45 μm) and first filler material (e.g. a wax, an ester, an acrylate, a phase change material, or mixtures thereof), and (b) a second thermal interface material comprising the second layer containing carbon nanotubes (e.g., with an average length of 25-45 μm) and second filler material (e.g. a wax, an ester, an acrylate, a phase change material, or mixtures thereof) has a thermal resistance of 0.060 cm²K/W or less, excluding the thermal resistance due to the bulk thermal resistance of the copper substrate. This thermal resistance is a summation of: (1) the bulk thermal resistance of the first thermal interface material (termed "the first bulk thermal resistance" in the specification and claims); (2) the contact resistance between the first thermal interface material and the copper substrate; (3) the contact resistance between the first thermal interface material and a solid-state device (e.g., an IC) or the equivalent of a solid-state device for testing purposes (e.g., a thermal testing vehicle (TTV) or a heated copper block); (4) the bulk thermal resistance of the second thermal interface material (termed "the second bulk thermal resistance" in the specification and claims); (5) the contact resistance between the second thermal interface material and the copper substrate; and (6) the contact resistance between the second thermal interface material and a heat conducting surface (e.g., a surface of a heat sink). Thus, the summation of (1)-(6) (i.e., the two bulk thermal resistances of the thermal interface materials, and the four contact resistances associated with the two thermal interface materials) is 0.060 cm²K/W or less. In some embodiments, the summation is 0.050 cm²K/W or less. In some embodiments, the summation is 0.040 cm²K/W or less. In some embodiments, the summation is between 0.035-0.060 cm²K/W. In some embodiments, the summation is between 0.035-0.050 cm²K/W. In some embodiments, the summation is between 0.035-0.040 cm²K/W. These values are better than what is achieved with conventional thermal interface materials and with prior copper substrates with carbon nanotube-based thermal interface materials on both the front and back surfaces. These results were obtained for carbon nanotubes grown on 25 μm thick copper substrates, but we expect these results will also apply to carbon nanotubes grown on copper substrate plugs, which will subsequently be incorporated into the peripheral structure of a heat spreader or heat sink.

In testing thermal interface materials, the "solid-state device" referred to in the phrase "contact resistance between the (first) thermal interface material and a/the solid-state device" may be a thermal test vehicle (TTV, e.g., a non-functional IC package that uses one or more heater resistors to simulate the power dissipation of a live IC), a heated copper block (e.g., in an ASTM D 5470 thermal interface material tester), or other equivalent to a solid-state device for testing purposes. Thus, in the specification and claims, the "contact resistance between the (first) thermal interface material and a/the solid-state device" includes the contact resistance between the thermal interface material and a solid-state device (e.g., an IC, light emitting diode, laser, power transistor, RF device, or solar cell), a TTV, a copper block in a thermal interface material tester, or other equivalents to a solid-state device for testing purposes.

Figure 5A:
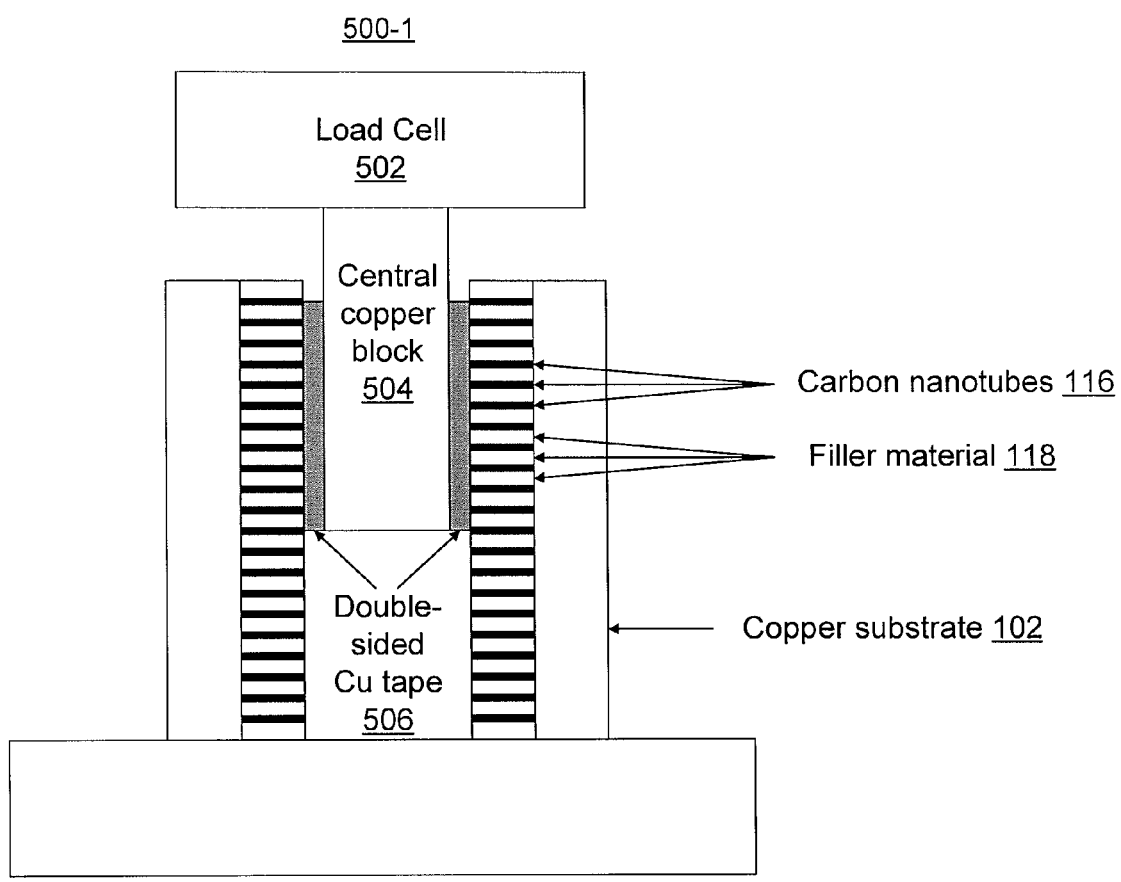
FIG. 5A is a schematic diagram of an experimental configuration for obtaining adhesion data from copper substrates with one thermal interface material in accordance with some embodiments.

FIG. 5A is a schematic diagram of an experimental configuration for obtaining adhesion data from copper substrates with one thermal interface material in accordance with some embodiments.

Two samples of thermal interface materials 120 (comprising a layer 112 of carbon nanotubes 116 and filler material 118) on copper substrates are attached (e.g., with double sided copper tape 506) to a central copper block 504 in a load cell 502. For a 2 cm×2 cm sample, the tape 506 is typically attached to a 1 cm×2 cm portion of the sample (e.g., the upper half of the samples in FIG. 5A). A shearing force is applied by moving the central copper block 504 vertically. The layer 112 of carbon nanotubes 116 is attached to the copper substrate. The shearing force needed to detach the layer of carbon nanotubes from the copper substrate is measured.

In some embodiments, the layer of carbon nanotubes can withstand a shearing force of at least 0.5 Kgf without detaching from the copper substrate. In some embodiments, the layer of carbon nanotubes can withstand a shearing force of at least 3.3 Kgf without detaching from the copper substrate. In some embodiments, the layer of carbon nanotubes can withstand a shearing force of at least 5 Kgf without detaching from the copper substrate. These results were obtained for carbon nanotubes grown on copper coupons, but we expect these results will also apply to carbon nanotubes grown on copper substrate plugs, which will subsequently be incorporated into the peripheral structure of a heat spreader or heat sink.

The interfacial shearing stress (adhesion) required to detach the layer of carbon nanotubes from the copper substrate may be calculated using the formula:

$$\tau_{max} = kT \quad (2)$$

where $\tau_{max}$ is the interfacial shear stress (adhesion), k is a constant equal to 0.0422 mm⁻², and T is the measured shearing force required for detachment. Adhesion measurements are discussed in greater detail in U.S. patent application Ser. No. 11/618,441, filed Dec. 29, 2006, entitled "Method and apparatus for the evaluation and improvement of mechanical and thermal properties of CNT/CNF arrays."

In some embodiments, the layer of carbon nanotubes can withstand an interfacial shearing stress of at least 30 psi without detaching from the copper substrate. In some embodiments, the layer of carbon nanotubes can withstand an interfacial shearing stress of at least 200 psi without detaching from the copper substrate. In some embodiments, the layer of carbon nanotubes can withstand an interfacial shearing stress of at least 300 psi without detaching from the copper substrate. These results were obtained for carbon nanotubes grown on copper coupons, but we expect these results will also apply to carbon nanotubes grown on copper substrate plugs, which will subsequently be incorporated into the peripheral structure of a heat spreader or heat sink.

We have found that adhesion of the layer containing carbon nanotubes correlates with the overall thermal performance of the thermal interface material. For example, the value of the summation of the bulk thermal resistance and the two contact resistances associated with the thermal interface material is typically greater than 0.10 cm²K/W if the layer of carbon nanotubes fails a tape pull test, whereas the value of the summation is 0.060 cm²K/W or less if the layer of carbon nanotubes passes a tape pull test.

Figure 5B:
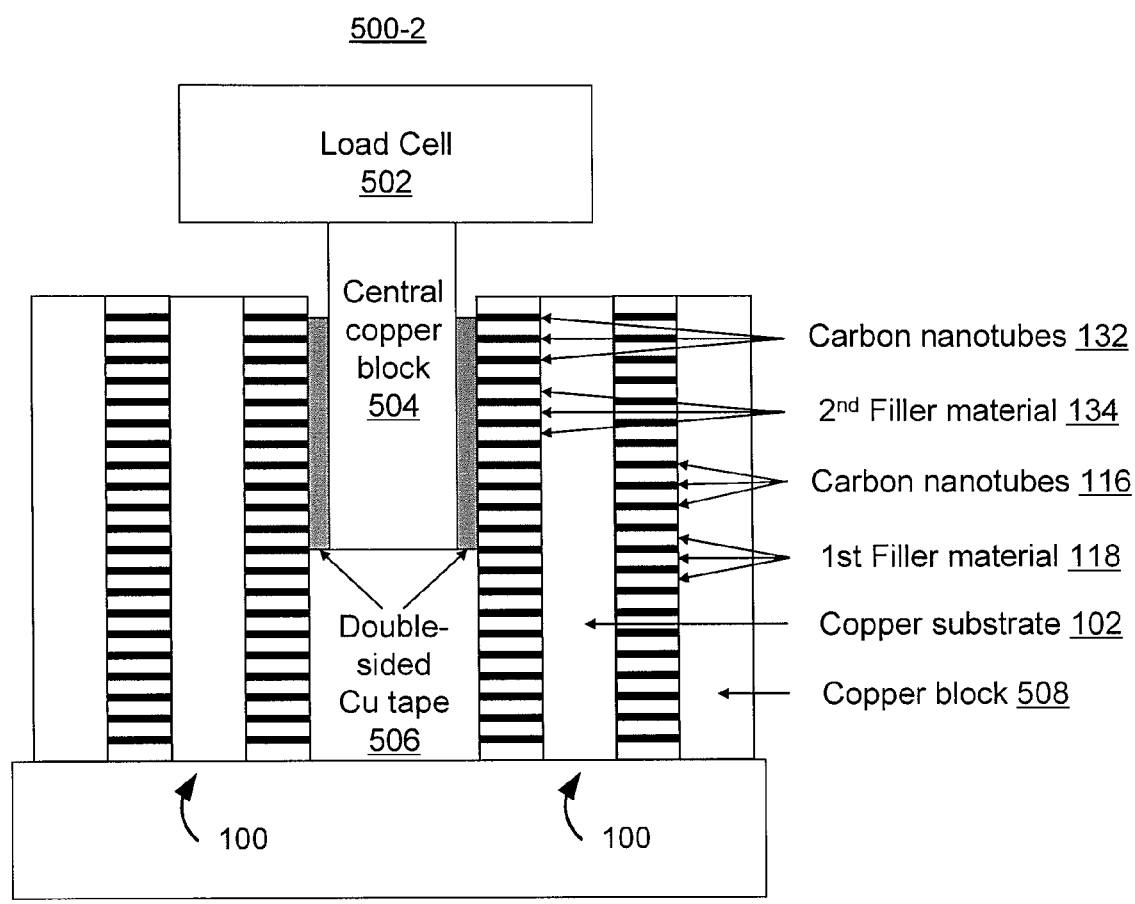
FIG. 5B is a schematic diagram of an experimental configuration for obtaining adhesion data from copper substrates with two thermal interface materials in accordance with some embodiments.

FIG. 5B is a schematic diagram of an experimental configuration for obtaining adhesion data from copper substrates with two thermal interface materials in accordance with some embodiments.

Two samples, which each include a copper substrate, a first thermal interface material 120 (comprising a first layer 112 of carbon nanotubes 116 and first filler material 118), and a second thermal interface material 136 (comprising a second layer 130 of carbon nanotubes 132 and second filler material 134), are: (1) attached to respective copper blocks 508 and (2) attached (e.g., with double sided copper tape 506) to a central copper block 504 in a load cell 502. For a 2 cm×2 cm sample, the tape 506 is typically attached to a 1 cm×2 cm portion of the sample (e.g., the upper half of the samples in FIG. 5B). A shearing force is applied by moving the central copper block 504 vertically. The first layer 112 of carbon nanotubes 116 and the second layer 130 of carbon nanotubes 132 are attached to the copper substrate. The shearing force needed to detach either the first layer 112 or the second layer 130 of carbon nanotubes from the copper substrate is measured. Typically, the layer of carbon nanotubes in contact with the double sided tape 506 (e.g., the layer 130 of carbon nanotubes 132 in FIG. 5B) detaches first, particularly if no filler material (e.g., second filler 134 in FIG. 5) is placed between the carbon nanotubes.

In some embodiments, both the first layer 112 of carbon nanotubes and the second layer 130 of carbon nanotubes can withstand a shearing force of at least 0.5 Kgf without detaching from the copper substrate. In some embodiments, both the first layer 112 of carbon nanotubes and the second layer 130 of carbon nanotubes can withstand a shearing force of at least 3.3 Kgf without detaching from the copper substrate. In some embodiments, both the first layer 112 of carbon nanotubes and the second layer 130 of carbon nanotubes can withstand a shearing force of at least 5 Kgf without detaching from the copper substrate. These results were obtained for carbon nanotubes grown on 25 μm thick copper substrates, but we expect these results will also apply to carbon nanotubes grown on copper substrate plugs, which will subsequently be incorporated into the peripheral structure of a heat spreader or heat sink.

As noted above, the interfacial shearing stress (adhesion) required to detach a layer (e.g., 112 or 130) of carbon nanotubes from the copper substrate may be calculated using the formula:

$$\tau_{max} = kT \quad (2)$$

where $\tau_{max}$ is the interfacial shear stress (adhesion), k is a constant equal to 0.0422 mm$^{-2}$, and T is the measured shearing force required for detachment.

In some embodiments, both the first layer 112 of carbon nanotubes and the second layer 130 of carbon nanotubes can withstand an interfacial shearing stress of at least 30 psi without detaching from the copper substrate plug. In some embodiments, both the first layer 112 of carbon nanotubes and the second layer 130 of carbon nanotubes can withstand an interfacial shearing stress of at least 200 psi without detaching from the copper substrate plug. In some embodiments, both the first layer 112 of carbon nanotubes and the second layer 130 of carbon nanotubes can withstand an interfacial shearing stress of at least 300 psi without detaching from the copper substrate plug. These results were obtained for carbon nanotubes grown on 25 μm thick copper substrates, but we expect these results will also apply to carbon nanotubes grown on copper substrate plugs, which will subsequently be incorporated into the peripheral structure of a heat spreader or heat sink.

Figure 6:
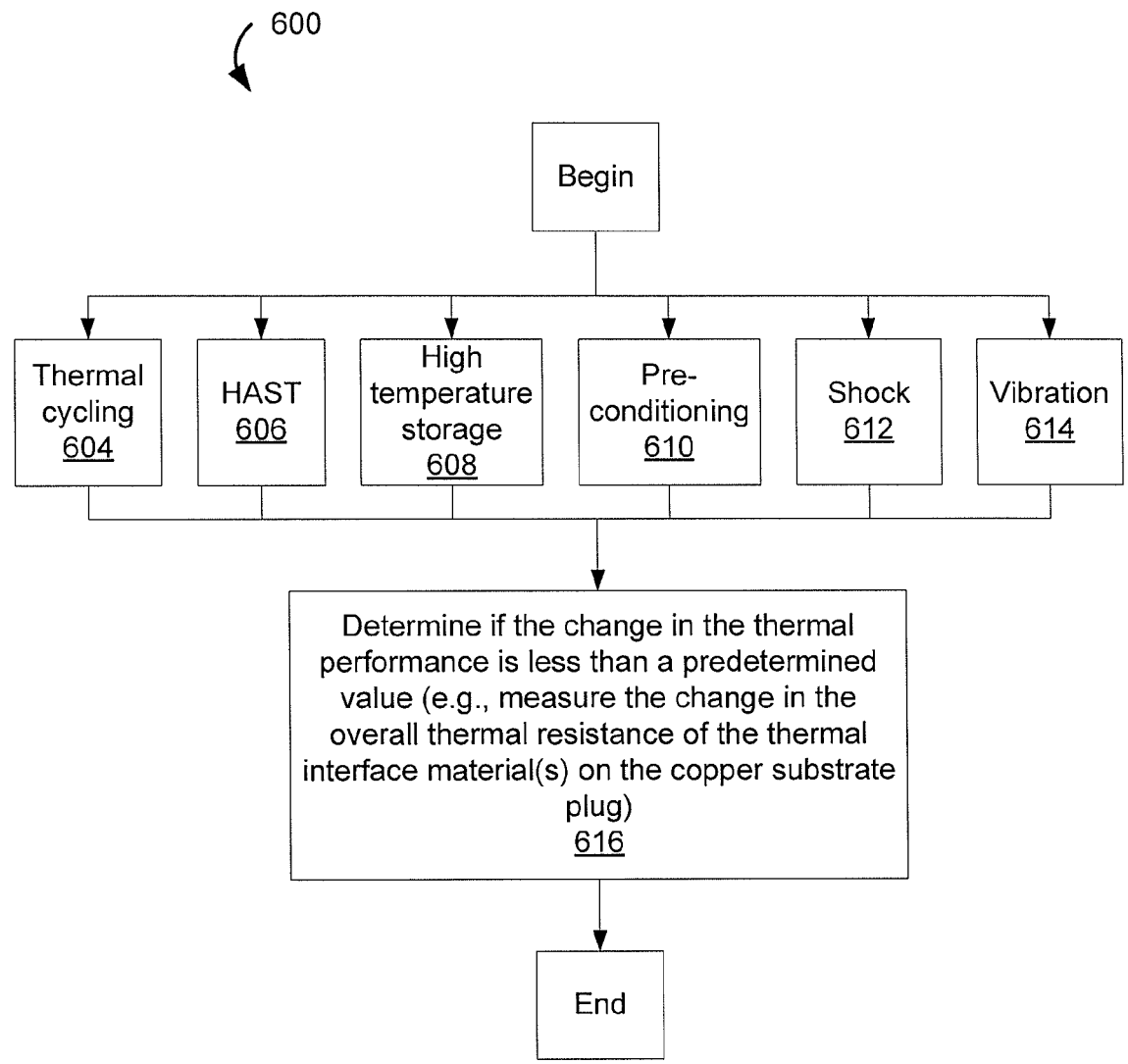
FIG. 6 is a flow diagram illustrating one or more reliability tests that may be applied to carbon nanotube-based structures for removing heat in accordance with some embodiments.

We expect that adhesion of the two layers containing carbon nanotubes will also correlate with the thermal performance of copper substrate plugs containing carbon nanotubes on the front and back surfaces FIG. 6 is a flow diagram illustrating one or more reliability tests that may be applied to carbon nanotube-based structures for removing heat in accordance with some embodiments. It is desirable that carbon nanotube-based structures maintain their thermal performance after being exposed or subjected to harsh environments. These environments may include one or more of:

Temperature cycling 604 (e.g., as described in Joint Electron Device Engineering Council (JEDEC) Standard JESD22-A104C);

Highly-accelerated temperature and humidity stressing (HAST) 606 (e.g., as described in JEDEC Standard JESD22-A110-B);

High temperature storage 608 (e.g., as described in JEDEC Standard JESD22-A103C, condition A);

Preconditioning of non-hermetic surface mount devices prior to reliability testing 610 (e.g., as described in JEDEC Standard JESD22A113E);

Mechanical shock 612 (e.g. as described in Military Standard (MIL-STD) 883E, method 2002.3, test condition B); and/or Vibration 614 (e.g., variable frequency vibration as described in MIL-STD 883E, method 2007.2, test condition A and/or random vibration as described in JEDEC Standard JESD22-B103-B, test condition D).

The discussion of FIG. 6 and reliability below concerns prophetic examples/embodiments. We expect that copper substrate plugs with thermal interface materials made according to the methods described herein will maintain their thermal performance as described below. To date, we have found that copper substrate plugs with a single thermal interface material (comprising carbon nanotubes made according to the methods described herein and wax (MULTIWAX® W445 Multicrystalline Wax from Gehring-Montgomery)) had their thermal performance change by less than 10% after heating at 130° C. for 1000 hours. Moreover, all of the embodiments of copper substrate plugs with a thermal interface materials on the front and back surfaces described in this application are prophetic examples/embodiments. To date, we have only made copper substrate plugs with a single thermal interface material.

Figure 7:
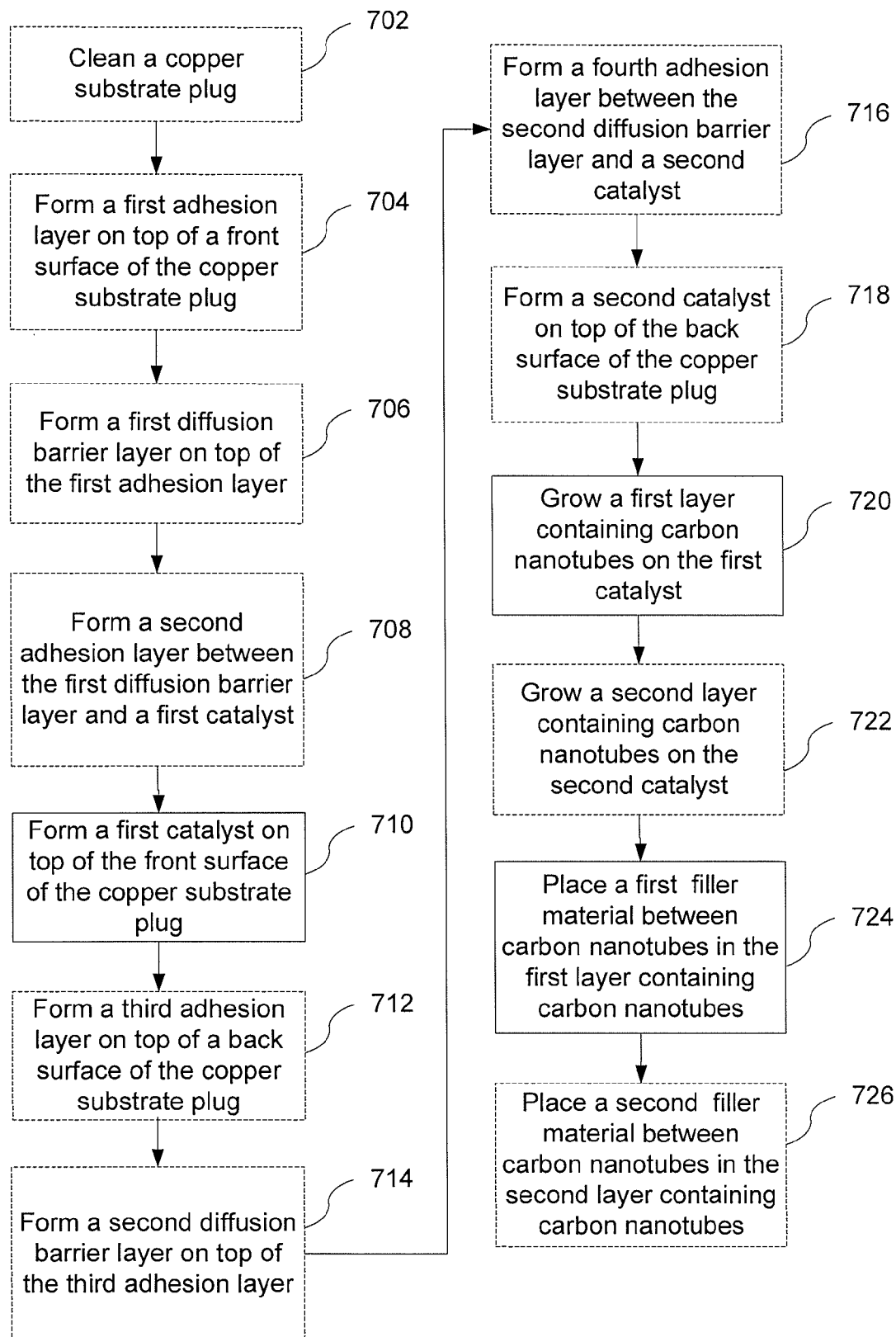
FIG. 7 is a flow diagram illustrating a process for making a copper substrate plug with thermal interface materials on one or two surfaces in accordance with some embodiments.

FIG. 7 is a flow diagram illustrating a process for making a copper substrate plug with thermal interface materials on one or two surfaces in accordance with some embodiments.

In some embodiments, a copper substrate plug 102 is cleaned (702). In some embodiments, the copper substrate plug 102 is an oxygen-free copper substrate plug.

In some embodiments, cleaning the copper substrate plug 102 comprises exposing the substrate plug 102 to a wet chemical bath. In some embodiments, the wet chemical bath comprises citric acid. In some embodiments, the wet chemical bath is a 100:1 mixture of 5% citric acid and hydrogen peroxide.

In some embodiments, cleaning the copper substrate plug 102 comprises sputter cleaning the copper substrate plug.

In some embodiments, a plasma etch step is used to remove contaminants from the copper substrate plug 102.

We have found that using an oxygen-free copper substrate and thoroughly cleaning the substrate to remove grease, oxides, and other contaminants greatly increases the uniformity and quality of the subsequently grown layer(s) of carbon nanotubes.

Using a copper substrate plug that can be incorporated after nanotube growth into a peripheral structure of a heat spreader or a heat sink enables layers of carbon nanotubes to be grown on the copper substrate plug in an optimum manner, with less concern for how the nanotube growth conditions may alter the dimensions, surfaces, and/or mechanical properties of the heat spreader or heat sink.

In some embodiments, a first adhesion layer 104 is formed (704) on top of a front surface 114 of the copper substrate plug 102.

In some embodiments, a first diffusion barrier layer 106 is formed (706) on top of the first adhesion layer 104.

In some embodiments, a second adhesion layer 108 is formed (708) between the first diffusion barrier layer 106 and the first catalyst 110. In some embodiments, the second adhesion layer 108 is formed by sputtering.

A first catalyst 110 is formed (710) on top of the front surface 114 of the copper substrate plug 102.

In some embodiments, the first adhesion layer 104, the first diffusion barrier layer 106, the second adhesion layer 108, and the first catalyst 110 are formed by sputtering. In some embodiments, the first adhesion layer 104, the first diffusion barrier layer 106, the second adhesion layer 108, and the first catalyst 110 are formed by sequentially sputtering each respective layer.

If there is no second adhesion layer 108, in some embodiments, the first adhesion layer 104, the first diffusion barrier layer 106, and the first catalyst 110 are formed by sputtering. If there is no second adhesion layer 108, in some embodiments, the first adhesion layer 104, the first diffusion barrier layer 106, and the first catalyst 110 are formed by sequentially sputtering each respective layer.

Other deposition methods, such as electron beam evaporation, may be used to form the first adhesion layer 104, the first diffusion barrier layer 106, the second adhesion layer 108, and/or the first catalyst 110. The uniformity and thickness of each of these layers, especially the first catalyst 110, is preferably kept within 10% total variation to promote a uniform catalyst nucleation process, which promotes individual separation of carbon nanotubes in the first layer 112 containing carbon nanotubes. In some embodiments, the uniformity and thickness of the first catalyst 110 is kept within 5% total variation.

In some embodiments, a third adhesion layer 122 is formed (712) on top of a back surface 115 of the copper substrate plug 102.

In some embodiments, a second diffusion barrier layer 124 is formed (714) on top of the third adhesion layer 122.

In some embodiments, a fourth adhesion layer 126 is formed (716) between the second diffusion barrier layer 124 and the second catalyst 128. In some embodiments, the fourth adhesion layer 126 is formed by sputtering.

In some embodiments (e.g., for a copper substrate plug 102 with thermal interface materials on both the front and back surfaces), a second catalyst 128 is formed (718) on top of the back surface 115 of the copper substrate plug 102.

In some embodiments, the third adhesion layer 122, the second diffusion barrier layer 124, the fourth adhesion layer 126, and the second catalyst 128 are formed by sputtering. In some embodiments, the third adhesion layer 122, the second diffusion barrier layer 124, the fourth adhesion layer 126, and the second catalyst 128 are formed by sequentially sputtering each respective layer.

If there is no fourth adhesion layer 126, in some embodiments, the third adhesion layer 122, the second diffusion barrier layer 124, and the second catalyst 128 are formed by sputtering. If there is no fourth adhesion layer 126, in some embodiments, the third adhesion layer 122, the second diffusion barrier layer 124, and the second catalyst 128 are formed by sequentially sputtering each respective layer.

Other deposition methods, such as electron beam evaporation, may be used to form the third adhesion layer 122, the second diffusion barrier layer 124, the fourth adhesion layer 126, and/or the second catalyst 128. The uniformity and thickness of each of these layers, especially the second catalyst 128, is preferably kept within 10% total variation to promote a uniform catalyst nucleation process, which promotes individual separation of carbon nanotubes in the second layer 130 containing carbon nanotubes. In some embodiments, the uniformity and thickness of the second catalyst 128 is kept within 5% total variation.

A first layer 112 containing carbon nanotubes 116 is grown (720) on the first catalyst 110. In some embodiments, a second layer 130 containing carbon nanotubes 132 is grown (722) on the second catalyst 128. As is known in the art, carbon nanotubes may form via either tip growth or base growth on the catalyst. As used in the specification and claims, growing carbon nanotubes "on the first/second catalyst" includes tip growth, base growth, or mixtures thereof.

In some embodiments, growing the first layer 112 containing carbon nanotubes and/or second layer 130 containing carbon nanotubes comprises a temperature ramp in an inert atmosphere followed by nanotube growth in a carbon-containing atmosphere.

In some embodiments, the temperature ramp includes ramping the temperature between 600 and 800° C. in 5 minutes or less. In some embodiments, the temperature ramp includes ramping the temperature between 600 and 800° C. in 2 minutes or less. We have found that a fast temperature ramp between 600 and 800° C. promotes a uniform catalyst nucleation process, which promotes individual separation of carbon nanotubes in the layers 112 & 130 containing carbon nanotubes.

In some embodiments, the inert atmosphere comprises argon or nitrogen.

In some embodiments, nanotube growth in the carbon-containing atmosphere comprises plasma-enhanced chemical vapor deposition (PECVD) of carbon nanotubes. In some embodiments, the PECVD comprises flowing $NH_3$ and $C_2H_2$ gases over the first catalyst 110 and/or second catalyst 128 at a temperature between 700 and 900° C. in a total pressure between 1 and 10 torr. In some embodiments, the total pressure is between 2 and 4 torr. An electric field created by a DC plasma may be used to align the carbon nanotubes during the PECVD growth process. In some embodiments, nanotube growth in the carbon-containing atmosphere comprises thermal chemical vapor deposition (CVD) of carbon nanotubes. In some embodiments, the thermal CVD comprises flowing $NH_3$ and $C_2H_2$ gases over the first catalyst 110 and/or second catalyst 128 at a temperature between 700 and 900° C. in a total pressure between 1 and 10 torr. In some embodiments, the total pressure is between 2 and 4 torr. For both PECVD and thermal CVD, we have found that using $NH_3$ and a total pressure between 1 and 10 torr improves the quality of the nanotubes and their adhesion to the copper substrate.

In some embodiments, growing (720) the first layer 112 containing carbon nanotubes comprises PECVD of carbon nanotubes and growing (722) the second layer 130 containing carbon nanotubes comprises PECVD of carbon nanotubes. In some embodiments, growing (720) the first layer 112 containing carbon nanotubes comprises PECVD of carbon nanotubes and growing (722) the second layer 130 containing carbon nanotubes comprises thermal chemical vapor deposition of carbon nanotubes. In some embodiments, growing (720) the first layer 112 containing carbon nanotubes comprises thermal chemical vapor deposition of carbon nanotubes and growing (722) the second layer 130 containing carbon nanotubes comprises thermal chemical vapor deposition of carbon nanotubes. In some embodiments, the first layer 112 containing carbon nanotubes and the second layer 130 containing carbon nanotubes are grown simultaneously.

In some embodiments, the carbon nanotubes are annealed after the growth process to release thermal stresses and to remove defects in the nanotube layer (e.g., at temperatures ranging from 700 to 1000° C.).

In some embodiments, a Raman spectrum of the first layer 112 containing carbon nanotubes has a D peak at ~1350 $cm^{-1}$ with an intensity $I_D$, a G peak at ~1585 $cm^1$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

In some embodiments, a Raman spectrum of the second layer 130 containing carbon nanotubes has a D peak at ~1350 $cm^{-1}$ with an intensity $I_D$, a G peak at ~1585 $cm^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

A first filler material 118 is placed (724) between carbon nanotubes in the first layer 112 containing carbon nanotubes. In some embodiments (e.g., for a copper substrate plug with thermal interface materials on both the front and back surfaces), a second filler material 134 is placed (726) between carbon nanotubes in the second layer 130 containing carbon nanotubes. In some embodiments, the first filler material 118 and/or the second filler material 134 has one or more of the following properties:

Viscosity between 0.5-100 cSt (at 25° C.), typically 10 cSt—for rapid uptake in the layer containing carbon nanotubes;

Melting point between 30-120° C., preferably between 40-80° C., and most preferably between 50-60° C.;

Thermal conductivity between 0.1-500 W/mK, typically between 0.2-10 W/mK;

Modulus between 50-1000 psi, preferably between 50-150 psi—for better compliance of the thermal interface material;

Boiling point of at least 250° C.; and

Surface tension between 1-100 dyne/cm, preferably between 1-20 dynes/cm—with lower values preferred so that the filler material wets the carbon nanotubes.

In some embodiments, the first filler material 118 and/or the second filler material 134 comprises an ester, such as Purester 40 ($CH_3$—$(CH_2)_{20}$—$COO$—$(CH_2)_{17}$—$CH_3$, an ester made from stearyl alcohol and methyl behenate by Strahl & Pitsch, http://www.spwax.com/sppure.htm). In some embodiments, the first filler material 118 and/or the second filler material 134 comprises a wax, such as MULTI-WAX® W445 Multicrystalline Wax from Gehring-Montgomery, Inc. (http://gehring-montgomery.com/pdfs/MI-CROCRY.pdf) or paraffin (e.g., C44 paraffin). In some embodiments, the first filler material 118 and/or the second filler material 134 comprises an acrylate. In some embodiments, the first filler material 118 and/or the second filler material 134 comprises a mixture of acrylates. In some embodiments, the first filler material 118 and/or the second filler material 134 comprises a mixture of methyl acrylate, octadecyl acrylate, and acrylic acid. In some embodiments, the first filler material 118 and/or the second filler material 134 comprises a mixture of 0-50% methyl acrylate, 50-90% octadecyl acrylate, and 0-10% acrylic acid. In some embodiments, the first filler material 118 and/or the second filler material 134 comprises a mixture of 27% methyl acrylate, 70% octadecyl acrylate, and 3% acrylic acid. (The preceding percentages are volume percentages.) In some embodiments, the first filler material 118 and/or the second filler material 134 comprises mixtures of esters, waxes, and/or acrylates. In some embodiments, the first filler material 118 and/or the second filler material 134 comprises a conductive filler such as graphene, which may be combined with an ester, wax, and/or acrylate. In some embodiments, the first filler material 118 and/or the second filler material 134 comprises an antioxidant, such as 2',3-bis[[3-[3,5-di-tert-butyl-4-hydroxyphenyl]propionyl]]propionohydrazide (which goes by the trade name Ciba® IRGANOX® MD 1024) or Pentaerythritol Tetrakis(3-(3,5-di-tert-butyl-4-hydroxyphenyl)propionate) (which goes by the trade name Ciba® IRGANOX® 1010). In some embodiments, between 0.5-5% antioxidant improves the long term stability of the first filler material 118 and/or the second filler material 134.

Figure 8A:
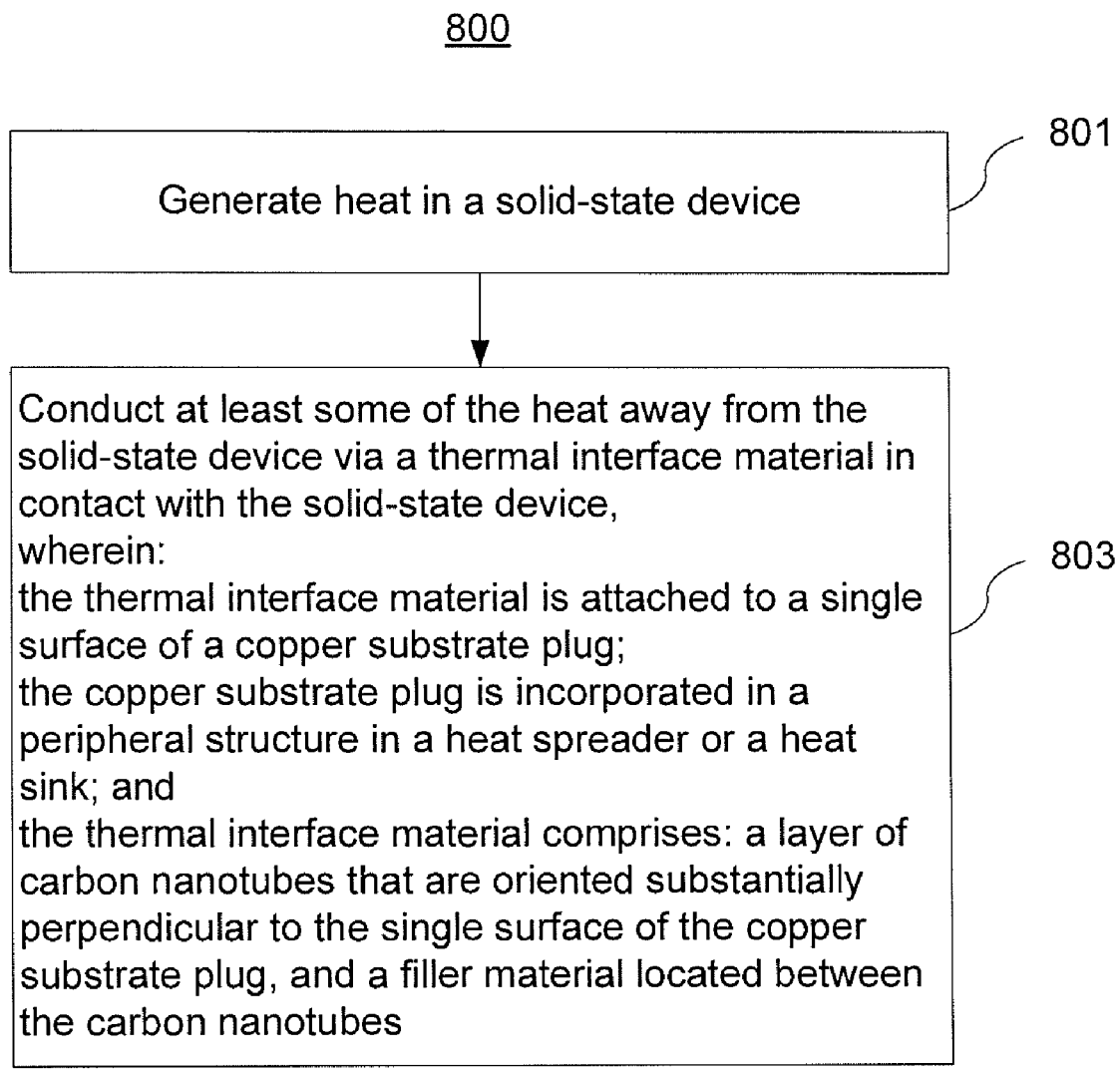
FIG. 8A is a flow diagram illustrating a process for using a thermal interface material on a single side of a copper substrate plug in accordance with some embodiments.

FIG. 8A is a flow diagram illustrating a process 800 for using a thermal interface material 120 on a single side of a copper substrate plug 102 in accordance with some embodiments.

Heat is generated (801) in a solid-state device. In some embodiments, the solid-state device is an integrated circuit (e.g., IC 1310, FIG. 13A).

At least some of the heat is conducted (803) away from the solid-state device via a thermal interface material in contact with the solid-state device. The thermal interface material is attached to a single surface of a copper substrate plug 102. The copper substrate plug 102 is incorporated in a peripheral structure 205 in a heat spreader 206 (or a heat sink, not shown). The thermal interface material comprises: a layer of carbon nanotubes that are oriented substantially perpendicular to the single surface of the copper substrate plug, and a filler material located between the carbon nanotubes. The thermal interface material has: a bulk thermal resistance, a contact resistance between the thermal interface material and the copper substrate plug, and a contact resistance between the thermal interface material and the solid-state device.

In some embodiments, the summation of the bulk thermal resistance, the contact resistance between the thermal interface material and the copper substrate plug, and the contact resistance between the thermal interface material and the solid-state device has a value of 0.060 $cm^2K/W$ or less. In some embodiments, the summation of the bulk thermal resistance, the contact resistance between the thermal interface material and the copper substrate plug, and the contact resistance between the thermal interface material and the solid-state device has a value of 0.050 $cm^2K/W$ or less. In some embodiments, the summation of the bulk thermal resistance, the contact resistance between the thermal interface material and the copper substrate plug, and the contact resistance between the thermal interface material and the solid-state device has a value of 0.040 $cm^2K/W$ or less. In some embodiments, the summation of the bulk thermal resistance, the contact resistance between the thermal interface material and the copper substrate plug, and the contact resistance between the thermal interface material and the solid-state device has a value of 0.030 $cm^2K/W$ or less. In some embodiments, the summation of the bulk thermal resistance, the contact resistance between the thermal interface material and the copper substrate plug, and the contact resistance between the thermal interface material and the solid-state device has a value of 0.020 $cm^2K/W$ or less. In some embodiments, the summation of the bulk thermal resistance, the contact resistance between the thermal interface material and the copper substrate plug, and the contact resistance between the thermal interface material and the solid-state device has a value between 0.020-0.060 $cm^2K/W$. In some embodiments, the summation of the bulk thermal resistance, the contact resistance between the thermal interface material and the copper substrate plug, and the contact resistance between the thermal interface material and the solid-state device has a value between 0.020-0.050 $cm^2K/W$. In some embodiments, the summation of the bulk thermal resistance, the contact resistance between the thermal interface material and the copper substrate plug, and the contact resistance between the thermal interface material and the solid-state device has a value between 0.020-0.040 $cm^2K/W$. These values are better than what is achieved with conventional thermal interface materials and with prior thermal interface materials that include a layer of carbon nanotubes on a single surface of a copper substrate.

Figure 8B:
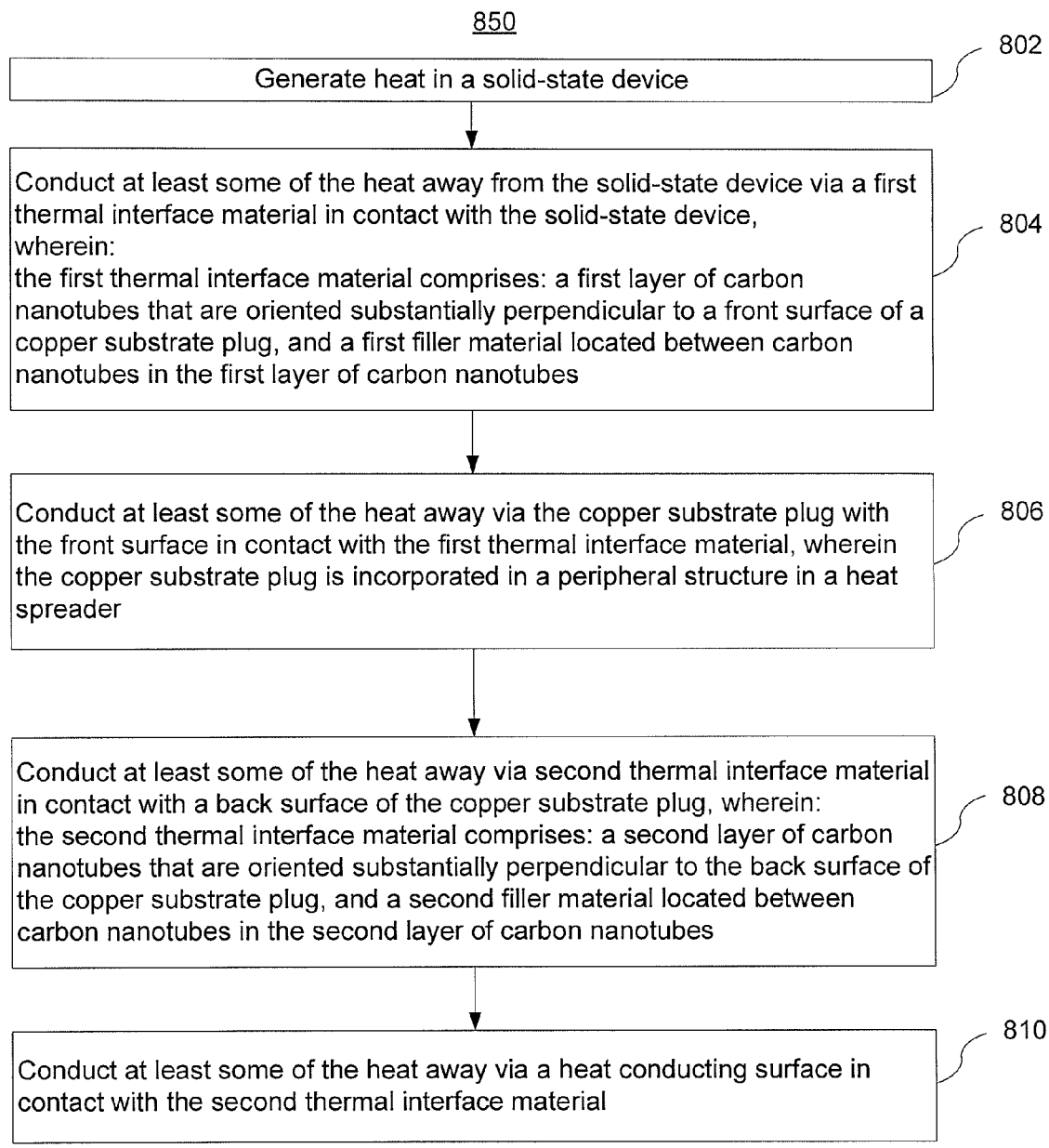
FIG. 8B is a flow diagram illustrating a process for using a copper substrate plug with thermal interface materials on both the front and back surfaces in accordance with some embodiments.

FIG. 8B is a flow diagram illustrating a process for using a copper substrate plug with thermal interface materials on both the front and back surfaces in accordance with some embodiments.

Heat is generated (802) in a solid-state device. In some embodiments, the solid-state device is an integrated circuit (e.g., IC 1310, FIG. 13B).

At least some of the heat is conducted (804) away from the solid-state device via a first thermal interface material 120 in contact with the solid-state device. The first thermal interface material 120 comprises: a first layer 112 of carbon nanotubes 116 that are oriented substantially perpendicular to the front surface 114 of a copper substrate plug 102, and a first filler material 118 located between carbon nanotubes in the first layer 116 of carbon nanotubes. The first thermal interface material 120 has: a first bulk thermal resistance, a contact resistance between the first thermal interface material 120 and the copper substrate plug 102, and a contact resistance between the first thermal interface material 120 and the solid-state device.

At least some of the heat is conducted (806) away via the copper substrate plug 102 with a front surface 114 in contact with the first thermal interface material 120. The copper substrate plug 102 has a copper substrate thermal resistance. The copper substrate plug 102 is incorporated in a peripheral structure 205 in a heat spreader 206 (or a heat sink, not shown).

At least some of the heat is conducted (808) away via a second thermal interface material 136 in contact with a back surface 115 of the copper substrate plug 102. The second thermal interface material 136 comprises: a second layer 130 of carbon nanotubes 132 that are oriented substantially perpendicular to the back surface 115 of the copper substrate plug, and a second filler material 134 located between carbon nanotubes 132 in the second layer 130 of carbon nanotubes. The second thermal interface material 136 has: a second bulk thermal resistance, a contact resistance between the second thermal interface material 136 and the copper substrate plug 102, and a contact resistance between the second thermal interface material 136 and a heat conducting surface (e.g., the surface 1606 of heat sink 1602, FIG. 16B).

At least some of the heat is conducted (810) away via a heat conducting surface (e.g., a heat sink) in contact with the second thermal interface material 136.

In some embodiments, the summation of the first bulk thermal resistance, the contact resistance between the first thermal interface material and the copper substrate, the contact resistance between the first thermal interface material and the solid-state device, the second bulk thermal resistance, the contact resistance between the second thermal interface material and the copper substrate, and the contact resistance between the second thermal interface material and the heat conducting surface has a value of 0.060 $cm^2K/W$ or less. In some embodiments, the summation is 0.050 $cm^2K/W$ or less. In some embodiments, the summation is 0.040 $cm^2K/W$ or less. In some embodiments, the summation is between 0.035-0.060 $cm^2K/W$. In some embodiments, the summation is between 0.035-0.050 $cm^2K/W$. In some embodiments, the summation is between 0.035-0.040 $cm^2K/W$. These values are better than what is achieved with conventional thermal interface materials and with prior copper substrates with carbon nanotube-based thermal interface materials on both the front and back surfaces.

Figure 9A:
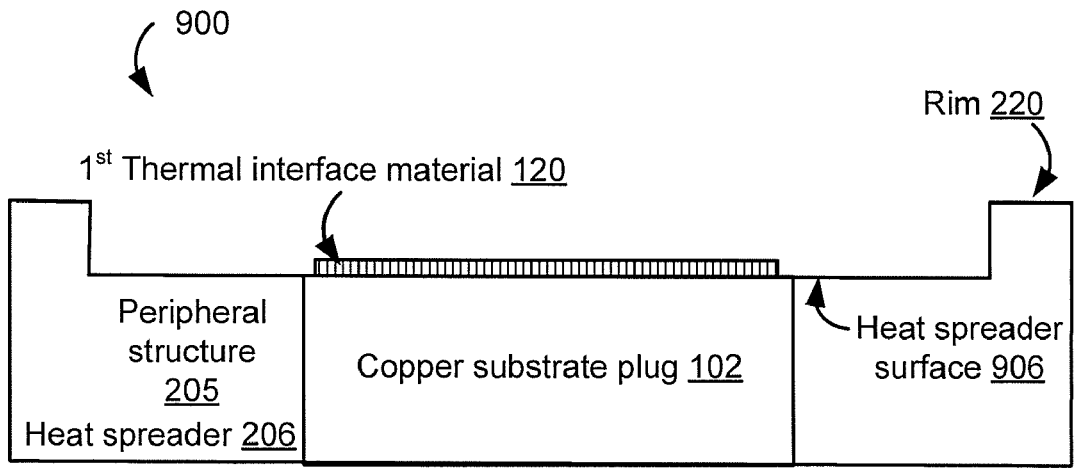
FIG. 9A is a schematic cross section of an article of manufacture that includes a single thermal interface material on a copper substrate plug incorporated in a peripheral structure of a heat spreader in accordance with some embodiments.

FIG. 9A is a schematic cross section of an article of manufacture 900 that includes a single thermal interface material 120 on a copper substrate plug 102 incorporated in a peripheral structure 205 of a heat spreader 206 in accordance with some embodiments.

In some embodiments, the heat spreader 206 does not have a rim 220. In some embodiments, the peripheral structure 205 comprises copper or other high-thermal conductivity metal. The copper may comprise pure copper, an alloy containing copper, a mixture containing copper (e.g., Cu—W), and/or a composite containing copper (e.g., Cu—Mo laminate).

The heat spreader 206 has a surface 906 that is configured to face an integrated circuit or other solid-state device.

The copper substrate plug 102 is incorporated in the peripheral structure 205. In some embodiments, the copper substrate plug has a thickness between 0.1 and 4.0 mm. In some embodiments, the copper substrate plug has a thickness between 0.5 and 2.5 mm. In some embodiments, the copper substrate plug has a thickness between 0.3 and 0.6 mm.

The thermal interface material 120 is attached to the front surface of the copper substrate plug. The thermal interface material 120 comprises a layer 112 of carbon nanotubes 116 and a filler material 118 located between the carbon nanotubes. The carbon nanotubes 116 are oriented substantially perpendicular to the front surface of the copper substrate plug. In some embodiments, substantially all of the carbon nanotubes are individually separated from each other.

In some embodiments, a Raman spectrum of the layer of carbon nanotubes has a D peak at ~1350 $cm^{-1}$ with an intensity $I_D$, a G peak at ~1585 $cm^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

In some embodiments, the layer 112 of carbon nanotubes 116 are attached to the front surface of the copper substrate plug 102 by growing the carbon nanotubes on the front surface of the copper substrate plug. In some embodiments, as described above, the layer of carbon nanotubes can withstand a shearing force of at least 0.5 Kgf without detaching from the copper substrate plug. In some embodiments, the layer of carbon nanotubes can withstand a shearing force of at least 3.3 Kgf without detaching from the copper substrate plug. In some embodiments, the layer of carbon nanotubes can withstand a shearing force of at least 5 Kgf without detaching from the copper substrate plug.

In some embodiments, as described above, the layer of carbon nanotubes can withstand an interfacial shearing stress of at least 30 psi without detaching from the copper substrate plug. In some embodiments, the layer of carbon nanotubes can withstand an interfacial shearing stress of at least 200 psi without detaching from the copper substrate plug. In some embodiments, the layer of carbon nanotubes can withstand an interfacial shearing stress of at least 300 psi without detaching from the copper substrate plug.

In some embodiments, the filler material 118 located between the carbon nanotubes comprises a phase change material. In some embodiments, the filler material located between the carbon nanotubes comprises an ester, a wax, or an acrylate. In some embodiments, the phase change material comprises paraffin. We believe that filler materials like paraffin improve the thermal performance of the thermal interface material 120 by filling the air gap between carbon nanotubes with lengths that do not make thermal contact with an opposing IC or other solid-state device surface and by wetting and separating the carbon nanotubes when pressed to conform with asperities on the opposing surface.

In some embodiments, as described above, the filler material comprises an ester, such as Purester 40 ($CH_3$—$(CH_2)_{20}$—COO—$(CH_2)_{17}$—$CH_3$, an ester made from stearyl alcohol and methyl behenate by Strahl & Pitsch, http://www.spwax.com/sppure.htm). In some embodiments, the filler material comprises a wax, such as MULTIWAX® W445 Multicrystalline Wax from Gehring-Montgomery, Inc. (http://gehring-montgomery.com/pdfs/MICROCRY.pdf) or paraffin (e.g., C44 paraffin). In some embodiments, the filler material comprises an acrylate. In some embodiments, the filler material comprises a mixture of acrylates. In some embodiments, the filler material comprises a mixture of methyl acrylate, octadecyl acrylate, and acrylic acid. In some embodiments, the filler material comprises a mixture of 0-50% methyl acrylate, 50-90% octadecyl acrylate, and 0-10% acrylic acid. In some embodiments, the filler material comprises a mixture of 27% methyl acrylate, 70% octadecyl acrylate, and 3% acrylic acid. (The preceding percentages are volume percentages.) In some embodiments, the filler material comprises mixtures of esters, waxes, and/or acrylates. In some embodiments, the filler material comprises a conductive filler such as graphene, which may be combined with an ester, wax, and/or acrylate. In some embodiments, the filler material comprises an antioxidant, such as 2',3-bis[[3-[3,5-di-tert-butyl-4-hydroxyphenyl]propionyl]]propionohydrazide (which goes by the trade name Ciba® IRGANOX® MD 1024) or Pentaerythritol Tetrakis(3-(3,5-di-tert-butyl-4-hydroxyphenyl)propionate) (which goes by the trade name Ciba® IRGANOX® 1010). In some embodiments, between 0.5-5% antioxidant improves the long term stability of the filler material.

The thermal interface material has: a bulk thermal resistance, a contact resistance between the thermal interface material and the front surface of the copper substrate plug, and a contact resistance between the thermal interface material and a solid-state device. In some embodiments, the summation of the bulk thermal resistance, the contact resistance between the thermal interface material and the copper substrate plug, and the contact resistance between the thermal interface material and the solid-state device has a value of 0.060 cm$^2$K/W or less. In some embodiments, the summation has a value of 0.050 cm$^2$K/W or less. In some embodiments, the summation has a value of 0.040 cm$^2$K/W or less. In some embodiments, the summation has a value of 0.030 cm$^2$K/W or less. In some embodiments, the summation has a value of 0.020 cm$^2$K/W or less. In some embodiments, the summation has a value between 0.020-0.060 cm$^2$K/W. In some embodiments, the summation has a value between 0.020-0.050 cm$^2$K/W. In some embodiments, the summation has a value between 0.020-0.040 cm$^2$K/W. These values are better than what is achieved with conventional thermal interface materials and with prior thermal interface materials that include a layer of carbon nanotubes on a single surface of a copper substrate.

In some embodiments, as described above with respect to FIG. 6, the value of the summation of the bulk thermal resistance and the two contact resistances associated with the thermal interface material changes (e.g., increases) by less than a predetermined value (e.g., 5%, 10%, or 15%) after an article containing the thermal interface material is subjected to one or more harsh environments (e.g., thermal cycling 604, HAST 606, high temperature storage 608, preconditioning 610, shock 612, and/or vibration 614). The two contact resistances associated with the thermal interface material are the contact resistance between the thermal interface material and the copper substrate plug, and the contact resistance between the thermal interface material and a solid-state device (e.g., an IC) or the equivalent of a solid-state device for testing purposes (e.g., a TTV or a copper block, as discussed above).

The article of manufacture 900 may be reworkable, which increases yields and reduces manufacturing costs. In some embodiments, an integrated circuit or other solid-state device may be removably connected to the thermal interface material 120. In some embodiments, the thermal interface material 120 is configured to enable an integrated circuit or other solid-state device to be connected to the thermal interface material, disconnected from the thermal interface material, and then reconnected to the thermal interface material. In some embodiments, the article of manufacture 900 is configured to be reused to cool a succession of integrated circuits or other solid-state devices.

Figure 9B:
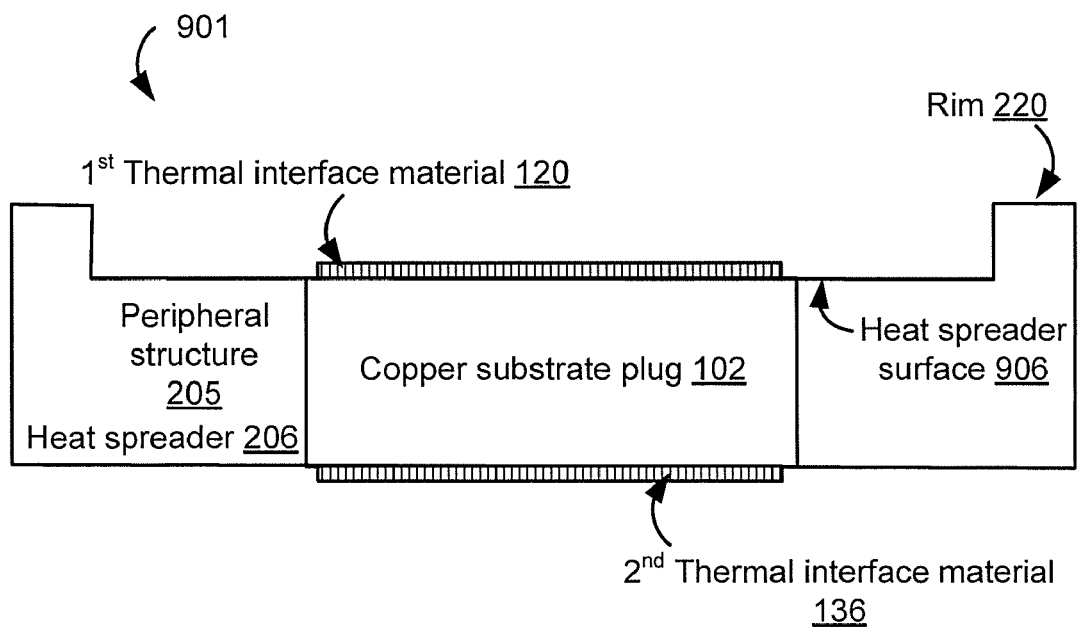
FIG. 9B is a schematic cross section of an article of manufacture that includes thermal interface materials on both surfaces of a copper substrate plug incorporated in a peripheral structure of a heat spreader in accordance with some embodiments.

FIG. 9B is a schematic cross section of an article of manufacture 901 that includes thermal interface materials 120 and 136 on both surfaces of a copper substrate plug 102 incorporated in a peripheral structure 205 of a heat spreader 206 in accordance with some embodiments.

In some embodiments, the heat spreader 206 does not have a rim 220. In some embodiments, the peripheral structure 205 comprises copper or other high-thermal conductivity metal. The copper may comprise pure copper, an alloy containing copper, a mixture containing copper (e.g., Cu—W), and/or a composite containing copper (e.g., Cu—Mo laminate).

The heat spreader 206 has a surface 906 that is configured to face an integrated circuit or other solid-state device.

The copper substrate plug 102 has a front surface 114 and a back surface 115. The copper substrate plug 102 is incorporated in the peripheral structure 205. In some embodiments, the copper substrate plug has a thickness between 0.1 and 4.0 mm. In some embodiments, the copper substrate plug has a thickness between 0.5 and 2.5 mm. In some embodiments, the copper substrate plug has a thickness between 0.3 and 0.6 mm. The copper substrate plug 102 has a copper substrate plug thermal resistance.

The first thermal interface material 120 is attached to the front surface 114 of the copper substrate plug 102. The first thermal interface material 120 comprises a first layer 112 of carbon nanotubes 116 and a first filler material 118 located between the carbon nanotubes. The carbon nanotubes 116 are oriented substantially perpendicular to the front surface 114 of the copper substrate plug 102. In some embodiments, substantially all of the carbon nanotubes 116 are individually separated from each other.

The second thermal interface material 136 is attached to the back surface 115 of the copper substrate plug 102. The second thermal interface material 136 comprises a second layer 130 of carbon nanotubes 132 and a second filler material 134 located between the carbon nanotubes. The carbon nanotubes 132 are oriented substantially perpendicular to the back surface 115 of the copper substrate plug 102. In some embodiments, substantially all of the carbon nanotubes 132 are individually separated from each other.

In some embodiments, a Raman spectrum of the first layer 112 containing carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

In some embodiments, a Raman spectrum of the second layer 130 containing carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

In some embodiments, the first layer 112 of carbon nanotubes 116 is attached to the front surface of the copper substrate plug 102 by growing the carbon nanotubes on the front surface of the copper substrate plug and the second layer 130 of carbon nanotubes is attached to the back surface of the copper substrate by growing carbon nanotubes on the back surface of the copper substrate plug. In some embodiments, as described above, both the first layer 112 of carbon nanotubes and the second layer 130 of carbon nanotubes can withstand a shearing force of at least 0.5 Kgf without detaching from the copper substrate plug. In some embodiments, both the first layer 112 of carbon nanotubes and the second layer 130 of carbon nanotubes can withstand a shearing force of at least 3.3 Kgf without detaching from the copper substrate plug. In some embodiments, both the first layer 112 of carbon nanotubes and the second layer 130 of carbon nanotubes can withstand a shearing force of at least 5 Kgf without detaching from the copper substrate plug.

In some embodiments, as described above, both the first layer 112 of carbon nanotubes and the second layer 130 of carbon nanotubes can withstand an interfacial shearing stress of at least 30 psi without detaching from the copper substrate plug. In some embodiments, both the first layer 112 of carbon nanotubes and the second layer 130 of carbon nanotubes can withstand an interfacial shearing stress of at least 200 psi without detaching from the copper substrate plug. In some embodiments, both the first layer 112 of carbon nanotubes and the second layer 130 of carbon nanotubes can withstand an interfacial shearing stress of at least 300 psi without detaching from the copper substrate plug.

In some embodiments, the first filler material 118 and/or the second filler material 134 comprises a phase change material. In some embodiments, the first filler material 118 and/or the second filler material 134 comprises an ester, a wax, or an acrylate. In some embodiments, the phase change material comprises paraffin. We believe that filler materials: improve the thermal performance of the first thermal interface material 120 by filling the air gap between carbon nanotubes with lengths that do not make thermal contact with an opposing IC or other solid-state device surface; improve the thermal performance of the second thermal interface material 136 by filling the air gap between carbon nanotubes with lengths that do not make thermal contact with the heat spreading surface; and improve the thermal performance of the first thermal interface material 120 and the second thermal interface material 136 by wetting and separating the carbon nanotubes when pressed to conform with asperities on the opposing surface.

In some embodiments, as described above, the first filler material 118 and/or the second filler material 134 comprises an ester, such as Purester 40 ($CH_3$—$(CH_2)_{20}$—COO—$(CH_2)_{17}$—$CH_3$, an ester made from stearyl alcohol and methyl behenate by Strahl & Pitsch, http://www.spwax.com/sppure. htm). In some embodiments, the first filler material 118 and/or the second filler material 134 comprises a wax, such as MULTIWAX® W445 Multicrystalline Wax from Gehring-Montgomery, Inc. (http://gehring-montgomery.com/pdfs/MICROCRY.pdf) or paraffin (e.g., C44 paraffin). In some embodiments, the first filler material 118 and/or the second filler material 134 comprises an acrylate. In some embodiments, the first filler material 118 and/or the second filler material 134 comprises a mixture of acrylates. In some embodiments, the first filler material 118 and/or the second filler material 134 comprises a mixture of methyl acrylate, octadecyl acrylate, and acrylic acid. In some embodiments, the first filler material 118 and/or the second filler material 134 comprises a mixture of 0-50% methyl acrylate, 50-90% octadecyl acrylate, and 0-10% acrylic acid. In some embodiments, the first filler material 118 and/or the second filler material 134 comprises a mixture of 27% methyl acrylate, 70% octadecyl acrylate, and 3% acrylic acid. (The preceding percentages are volume percentages.) In some embodiments, the first filler material 118 and/or the second filler material 134 comprises mixtures of esters, waxes, and/or acrylates. In some embodiments, the first filler material 118 and/or the second filler material 134 comprises a conductive filler such as graphene, which may be combined with an ester, wax, and/or acrylate. In some embodiments, the first filler material 118 and/or the second filler material 134 comprises an antioxidant, such as 2',3-bis[[3-[3,5-di-tert-butyl-4-hydroxyphenyl]propionyl]]propionohydrazide (which goes by the trade name Ciba® IRGANOX® MD 1024) or Pentaerythritol Tetrakis(3-(3,5-di-tert-butyl-4-hydroxyphenyl)propionate) (which goes by the trade name Ciba® IRGANOX® 1010). In some embodiments, between 0.5-5% antioxidant improves the long term stability of the first filler material 118 and/or the second filler material 134.

In some embodiments, as described above, for the copper substrate plug 102 with thermal interface materials 120 & 136 on the front and back surfaces, respectively, the summation of the first bulk thermal resistance, the contact resistance between the first thermal interface material and the copper substrate plug, the contact resistance between the first thermal interface material and the solid-state device, the second bulk thermal resistance, the contact resistance between the second thermal interface material and the copper substrate plug, and the contact resistance between the second thermal interface material and the heat conducting surface (e.g., heat sink surface 1606, FIG. 16B) has a value of 0.060 $cm^2K/W$ or less. In some embodiments, the summation is 0.050 $cm^2K/W$ or less. In some embodiments, the summation is 0.040 $cm^2K/W$ or less. In some embodiments, the summation is between 0.035-0.060 $cm^2K/W$. In some embodiments, the summation is between 0.035-0.050 $cm^2K/W$. In some embodiments, the summation is between 0.035-0.040 $cm^2K/W$. These values are better than what is achieved with conventional thermal interface materials and with prior copper substrates with carbon nanotube-based thermal interface materials on both the front and back surfaces.

In some embodiments, as described above with respect to FIG. 6, the value of the summation of the first bulk thermal resistance, the contact resistance between the first thermal interface material and the copper substrate plug, the contact resistance between the first thermal interface material and the solid-state device, the second bulk thermal resistance, the contact resistance between the second thermal interface material and the copper substrate plug, and the contact resistance between the second thermal interface material and the heat conducting surface changes (e.g., increases) by less than a predetermined value (e.g., 5%, 10%, or 15%) after the copper substrate plug 102 with thermal interface materials 120 & 136 on the front and back surfaces, respectively, is subjected to one or more harsh environments (e.g., thermal cycling 604, HAST 606, high temperature storage 608, preconditioning 610, shock 612, and/or vibration 614).

The article of manufacture 901 may be reworkable, which increases yields and reduces manufacturing costs. In some embodiments, an integrated circuit or other solid-state device may be removably connected to the first thermal interface material 120. In some embodiments, the first thermal interface material 120 is configured to enable an integrated circuit or other solid-state device to be connected to the first thermal interface material, disconnected from the first thermal interface material, and then reconnected to the first thermal interface material. In some embodiments, the article of manufacture 901 is configured to be reused to cool a succession of integrated circuits or other solid-state devices.

Figure 10:
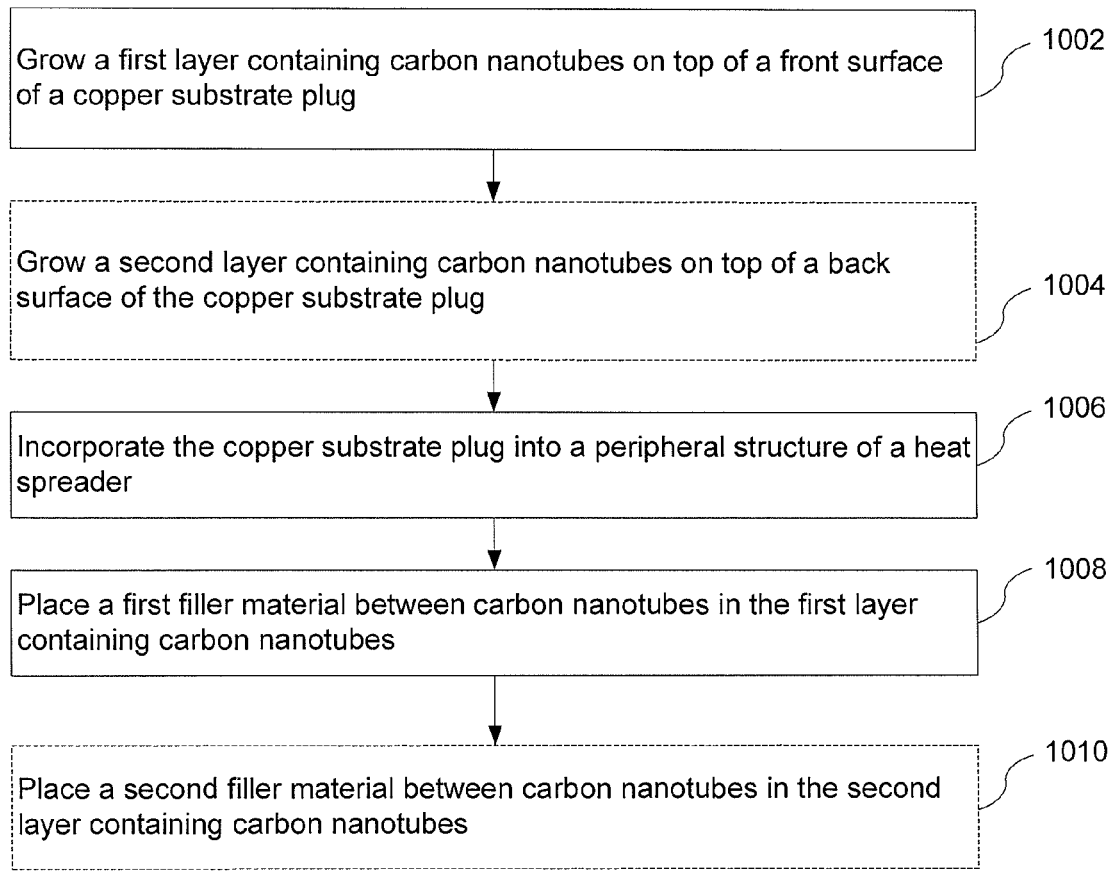
FIG. 10 is a flow diagram illustrating a process for making an article of manufacture that includes a heat spreader or a heat sink with a copper substrate plug incorporated in a peripheral structure of the heat spreader or the heat sink in accordance with some embodiments.

FIG. 10 is a flow diagram illustrating a process for making an article of manufacture (e.g., 900 or 901) that includes a heat spreader 206 or a heat sink (not shown) with a copper substrate plug 102 incorporated in a peripheral structure 205 of the heat spreader or the heat sink in accordance with some embodiments.

A first layer 112 containing carbon nanotubes 116 is grown (1002) on top of a front surface 114 of a copper substrate plug 102 (e.g., as described above with respect to FIG. 7). The first layer of carbon nanotubes are oriented substantially perpendicular to the front surface of the copper substrate plug. The copper substrate plug has a copper substrate plug thermal resistance.

In some embodiments (e.g., article 901), a second layer 130 containing carbon nanotubes 132 is grown (1004) on top of a back surface 115 of the copper substrate plug 102 (e.g., as described above with respect to FIG. 7). The second layer of carbon nanotubes are oriented substantially perpendicular to the back surface of the copper substrate plug.

In some embodiments, a Raman spectrum of the first layer 112 containing carbon nanotubes has a D peak at ~1350 $cm^{-1}$ with an intensity $I_D$, a G peak at ~1585 $cm^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

In some embodiments, a Raman spectrum of the second layer 130 containing carbon nanotubes has a D peak at ~1350 $cm^{-1}$ with an intensity $I_D$, a G peak at ~1585 $cm^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

The copper substrate plug 102 is incorporated (1006) in a peripheral structure 205 of the heat spreader 206 or the heat sink (not shown). In some embodiments, incorporating the copper substrate plug in the peripheral structure 205 of the heat spreader comprises the process discussed below with respect to FIG. 11B.

A first filler material 118 is placed (1008) between carbon nanotubes in the first layer 112 containing carbon nanotubes. In some embodiments, the first filler material comprises an ester, a wax, an acrylate, or mixtures thereof, as described above. In some embodiments, placing the first filler material between carbon nanotubes in the first layer containing carbon nanotubes comprises the process discussed below with respect to FIG. 12B, the process discussed below with respect to FIG. 12C, or the process discussed below with respect to FIG. 12D.

A first thermal interface material 120 comprises the first layer 112 containing carbon nanotubes 116 and the first filler material 118. The first thermal interface material has: a first bulk thermal resistance, a contact resistance between the first thermal interface material and the copper substrate plug, and a contact resistance between the first thermal interface material and a solid-state device.

In some embodiments (e.g., article 900), the summation of the first bulk thermal resistance, the contact resistance between the first thermal interface material and the copper substrate plug, and the contact resistance between the first thermal interface material and the solid-state device has a value of 0.060 $cm^2K/W$ or less. In some embodiments, the summation has a value of 0.050 $cm^2K/W$ or less. In some embodiments, the summation has a value of 0.040 $cm^2K/W$ or less. In some embodiments, the summation has a value of 0.030 $cm^2K/W$ or less. In some embodiments, the summation has a value of 0.020 $cm^2K/W$ or less. In some embodiments, the summation has a value between 0.020-0.060 $cm^2K/W$. In some embodiments, the summation has a value between 0.020-0.050 $cm^2K/W$. In some embodiments, the summation has a value between 0.020-0.040 $cm^2K/W$. These values are better than what is achieved with conventional thermal interface materials and with prior thermal interface materials that include a layer of carbon nanotubes on a single surface of a copper substrate.

In some embodiments (e.g., article 901), a second filler material 134 is placed (1010) between carbon nanotubes in the second layer 130 containing carbon nanotubes. In some embodiments, the second filler material comprises an ester, a wax, an acrylate, or mixtures thereof, as described above. In some embodiments, placing the second filler material between carbon nanotubes in the second layer containing carbon nanotubes comprises the process discussed below with respect to FIG. 12B, the process discussed below with respect to FIG. 12C, or the process discussed below with respect to FIG. 12D.

In some embodiments (e.g., article 901), a second thermal interface material 136 comprises the second layer 130 containing carbon nanotubes and the second filler material 134. The second thermal interface material has: a second bulk thermal resistance, a contact resistance between the second thermal interface material and the copper substrate plug, and a contact resistance between the second thermal interface material and a heat conducting surface (e.g., heat sink surface 1606, FIG. 16B). In some embodiments, the heat conducting surface is in contact with the second thermal interface material 136.

In some embodiments (e.g., article 901), the summation of the first bulk thermal resistance, the contact resistance between the first thermal interface material and the copper substrate plug, the contact resistance between the first thermal interface material and the solid-state device, the second bulk thermal resistance, the contact resistance between the second thermal interface material and the copper substrate, and the contact resistance between the second thermal interface material and the heat conducting surface has a value of 0.060 $cm^2K/W$ or less. In some embodiments, the summation is 0.050 $cm^2K/W$ or less. In some embodiments, the summation is 0.040 $cm^2K/W$ or less. In some embodiments, the summation is between 0.035-0.060 $cm^2K/W$. In some embodiments, the summation is between 0.035-0.050 $cm^2K/W$. In some embodiments, the summation is between 0.035-0.040 $cm^2K/W$. These values are better than what is achieved with conventional thermal interface materials and with prior copper substrates with carbon nanotube-based thermal interface materials on both the front and back surfaces.

FIG. 11A is a flow diagram illustrating a process for incorporating (1102) a copper substrate plug 102 into a peripheral structure 205 of a heat spreader 206 or a heat sink (not shown) in accordance with some embodiments.

A first thermal interface material 120 is attached to a front surface (e.g., 114) of the copper substrate plug 102. The first thermal interface material comprises: a first layer 112 of carbon nanotubes 116 oriented substantially perpendicular to the front surface of the copper substrate plug, and a first filler material 118 between carbon nanotubes. In some embodiments, the first filler material 118 is placed between the carbon nanotubes before the copper substrate plug is incorporated (1102) into the peripheral structure 205 of the heat spreader 206 or heat sink (not shown). In some embodiments, the first filler material is placed between the carbon nanotubes after the copper substrate plug is incorporated (1102) into the peripheral structure 205 of the heat spreader 206 or heat sink.

The first thermal interface material has: a first bulk thermal resistance, a contact resistance between the first thermal interface material and the copper substrate plug, and a contact resistance between the first thermal interface material and a solid-state device.

In some embodiments (e.g., article 900), the summation of the first bulk thermal resistance, the contact resistance between the first thermal interface material and the copper substrate plug, and the contact resistance between the first thermal interface material and the solid-state device has a value of 0.060 $cm^2K/W$ or less. In some embodiments, the summation has a value of 0.050 $cm^2K/W$ or less. In some embodiments, the summation has a value of 0.040 $cm^2K/W$ or less. In some embodiments, the summation has a value of 0.030 $cm^2K/W$ or less. In some embodiments, the summation has a value of 0.020 $cm^2K/W$ or less. In some embodiments, the summation has a value between 0.020-0.060 $cm^2K/W$. In some embodiments, the summation has a value between 0.020-0.050 $cm^2K/W$. In some embodiments, the summation has a value between 0.020-0.040 $cm^2K/W$. These values are better than what is achieved with conventional thermal interface materials and with prior thermal interface materials that include a layer of carbon nanotubes on a single surface of a copper substrate.

In some embodiments (e.g., article 901), a second filler material 134 is attached to a back surface (e.g., 115) of the copper substrate plug 102. The second thermal interface material comprises: a second layer 130 of carbon nanotubes 132 oriented substantially perpendicular to the back surface of the copper substrate plug, and a second filler material 134 between carbon nanotubes 132. In some embodiments, the second filler material 134 is placed between the carbon nanotubes before the copper substrate plug is incorporated (1102) into the peripheral structure 205 of the heat spreader 206. In some embodiments, the second filler material is placed between the carbon nanotubes after the copper substrate plug is incorporated (1102) into the peripheral structure 205 of the heat spreader 206.

Figure 16A:
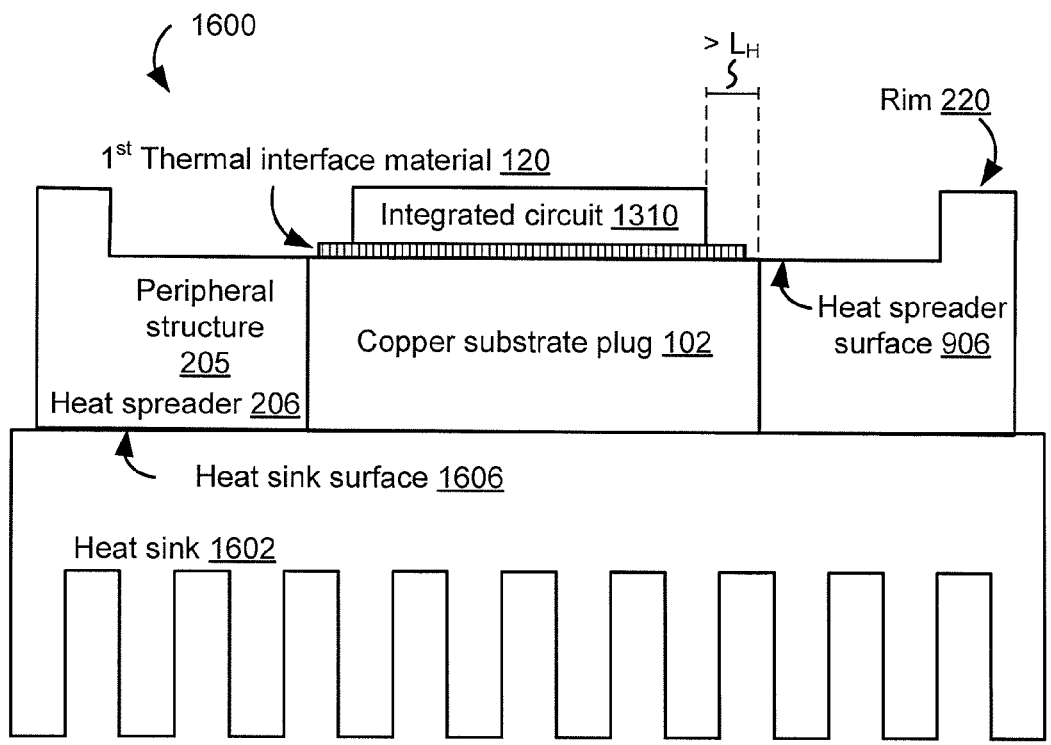
FIG. 16A-16B illustrate side views of articles of manufacture that include a copper substrate plug with thermal interface materials on one or two surfaces in accordance with some embodiments.
Figure 16B:
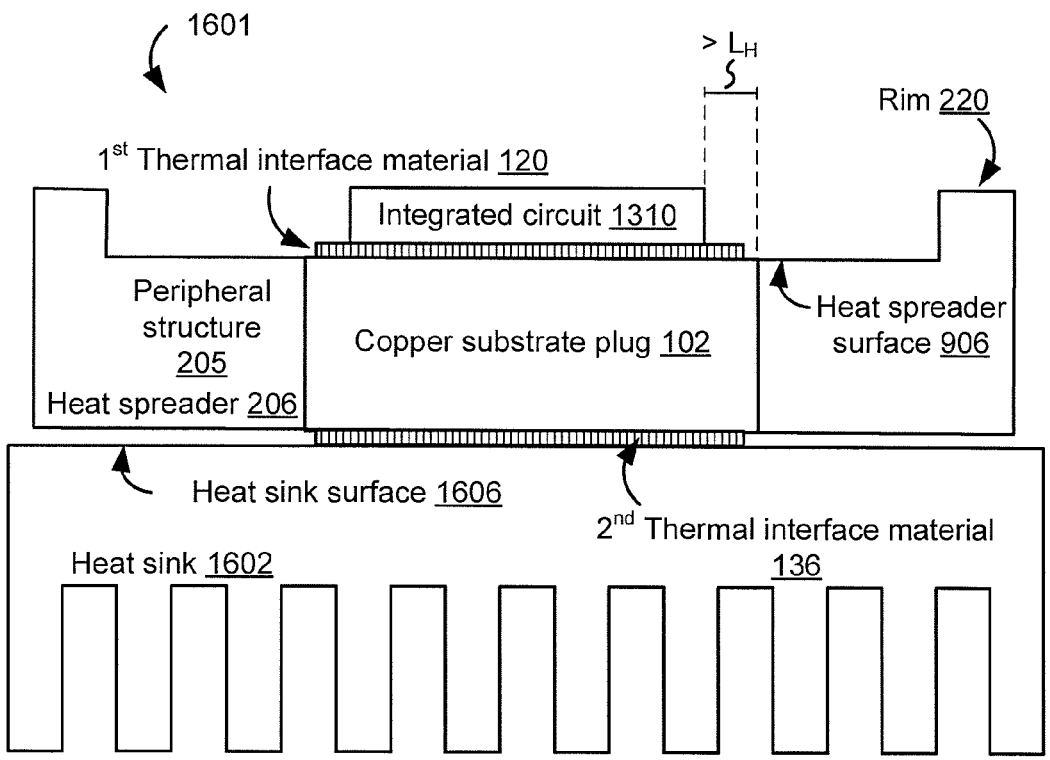

In some embodiments (e.g., article 901), the second thermal interface material has: a second bulk thermal resistance, a contact resistance between the second thermal interface material and the copper substrate plug, and a contact resistance between the second thermal interface material and a heat conducting surface (e.g., heat sink surface 1606, FIG. 16B). In some embodiments, the heat conducting surface is in contact with the second thermal interface material 136.

In some embodiments (e.g., article 901), the summation of the first bulk thermal resistance, the contact resistance between the first thermal interface material and the copper substrate plug, the contact resistance between the first thermal interface material and the solid-state device, the second bulk thermal resistance, the contact resistance between the second thermal interface material and the copper substrate, and the contact resistance between the second thermal interface material and the heat conducting surface has a value of 0.060 cm²K/W or less. In some embodiments, the summation is 0.050 cm²K/W or less. In some embodiments, the summation is 0.040 cm²K/W or less. In some embodiments, the summation is between 0.035-0.060 cm²K/W. In some embodiments, the summation is between 0.035-0.050 cm²K/W. In some embodiments, the summation is between 0.035-0.040 cm²K/W. These values are better than what is achieved with conventional thermal interface materials and with prior copper substrates with carbon nanotube-based thermal interface materials on both the front and back surfaces.

Figure 11B:
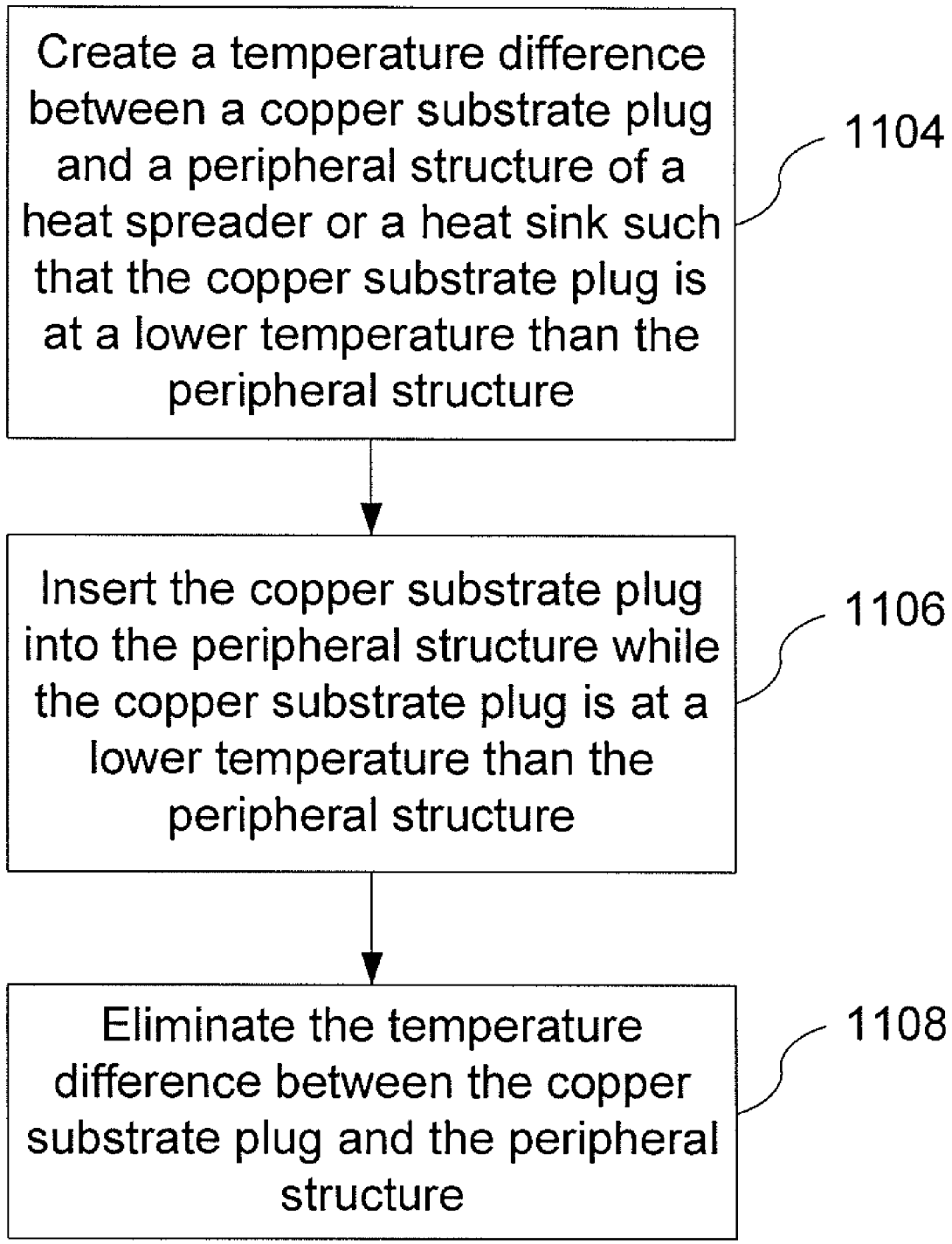
FIG. 11B is a flow diagram illustrating a process for incorporating a copper substrate plug into a peripheral structure of a heat spreader or a heat sink in accordance with some embodiments.

FIG. 11B is a flow diagram illustrating a process for incorporating a copper substrate plug 102 into a peripheral structure 205 of a heat spreader 206 or a heat sink (not shown) in accordance with some embodiments. In some embodiments, the incorporating comprises:

creating (1104) a temperature difference between the copper substrate plug 102 and the peripheral structure 205 of the heat spreader such that the copper substrate plug is at a lower temperature than the peripheral structure (e.g., by cooling the plug and/or heating the peripheral structure);

inserting (1106) the copper substrate plug into the peripheral structure while the copper substrate plug is at a lower temperature than the peripheral structure (e.g., by 400° C.); and eliminating (1108) the temperature difference between the copper substrate plug 102 and the peripheral structure 205 (e.g., by letting the incorporated plug and the peripheral structure remain in thermal contact with each other).

In some embodiments, the copper substrate plug 102 and peripheral structure 205 are designed so that the thermally induced hoop stress after eliminating (1108) the temperature difference between the copper substrate plug 102 and the peripheral structure 205 is less than the buckling stress for the plug.

In some embodiments, the copper substrate plug 102 is incorporated into the peripheral structure 205 by soldering a solder layer between the plug and the peripheral structure. In some embodiments, the copper substrate plug 102 is incorporated into the peripheral structure 205 with a thermal paste between the plug and the peripheral structure. In some embodiments, the copper substrate plug 102 is incorporated into the peripheral structure 205 with a phase change material between the plug and the peripheral structure. In some embodiments, the copper substrate plug 102 is incorporated in the peripheral structure 205 with a lead-free solder (e.g., an Indium alloy or Au/Sn) or a solder with a eutectic temperature above the temperature required for ball grid reflow (~250° C.).

Figure 12A:
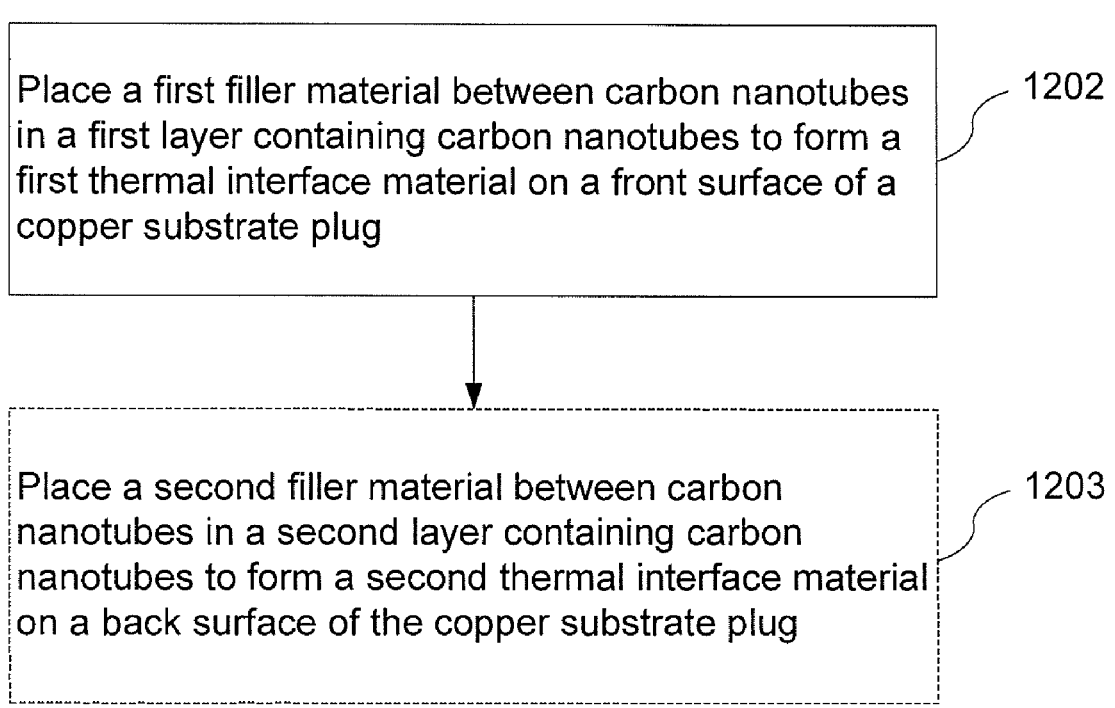
FIG. 12A-12D are flow diagrams illustrating processes for placing a filler material between carbon nanotubes in a layer containing carbon nanotubes to form a thermal interface material in accordance with some embodiments.

FIG. 12A is a flow diagram illustrating a process for placing filler materials (e.g., 118 and/or 134) between carbon nanotubes in one or two layers containing carbon nanotubes to form a copper substrate plug with thermal interface material(s) on one or two surfaces in accordance with some embodiments.

A first filler material 118 is placed (1202) between carbon nanotubes 116 in a first layer 112 containing carbon nanotubes to form a first thermal interface material 120 on a front surface 114 of a copper substrate plug 102. The copper substrate plug 102 has a copper substrate thermal resistance. The first thermal interface material 120 has: a first bulk thermal resistance, a contact resistance between the first thermal interface material and the copper substrate plug, and a contact resistance between the first thermal interface material and a solid-state device.

In some embodiments, the summation of the first bulk thermal resistance, the contact resistance between the first thermal interface material and the copper substrate plug, and the contact resistance between the first thermal interface material and the solid-state device has a value of 0.060 cm²K/W or less. In some embodiments, the summation has a value of 0.050 cm²K/W or less. In some embodiments, the summation has a value of 0.040 cm²K/W or less. In some embodiments, the summation has a value of 0.030 cm²K/W or less. In some embodiments, the summation has a value of 0.020 cm²K/W or less. In some embodiments, the summation has a value between 0.020-0.060 cm²K/W. In some embodiments, the summation has a value between 0.020-0.050 cm²K/W. In some embodiments, the summation has a value between 0.020-0.040 cm²K/W. These values are better than what is achieved with conventional thermal interface materials and with prior thermal interface materials that include a layer of carbon nanotubes on a single surface of a copper substrate.

In some embodiments, as described above with respect to FIG. 6, the value of the summation of the first bulk thermal resistance and the two contact resistances associated with the first thermal interface material changes (e.g., increases) by less than a predetermined value (e.g., 5%, 10%, or 15%) after an article containing the first thermal interface material is subjected to one or more harsh environments (e.g., thermal cycling 604, HAST 606, high temperature storage 608, preconditioning 610, shock 612, and/or vibration 614). The two contact resistances associated with the thermal interface material are the contact resistance between the first thermal interface material and the copper substrate plug, and the contact resistance between the first thermal interface material and a solid-state device (e.g., an IC) or the equivalent of a solid-state device for testing purposes (e.g. a TTV or a copper block, as discussed above).

In some embodiments, a Raman spectrum of the first layer 112 containing carbon nanotubes has a D peak at ~1350 cm⁻¹ with an intensity $I_D$, a G peak at ~1585 cm⁻¹ with an intensity $I_G$, and an intensity ratio $I_D/I_G$ of less than 0.7 at a laser excitation wavelength of 514 nm. In some embodiments, the intensity ratio $I_D/I_G$ is less than 0.6.

In some embodiments, a second filler material 134 is placed (1203) between carbon nanotubes 132 in a second layer 130 containing carbon nanotubes to form a second thermal interface material 136 on a back surface 115 of the copper substrate plug 102. The second thermal interface material 136 has: a second bulk thermal resistance, a contact resistance between the second thermal interface material and the copper substrate plug, and a contact resistance between the second thermal interface material and a heat conducting surface (e.g., heat sink surface 1606, FIG. 16B).

In some embodiments, the summation of the first bulk thermal resistance, the contact resistance between the first thermal interface material and the copper substrate plug, the contact resistance between the first thermal interface material and the solid-state device, the second bulk thermal resistance, the contact resistance between the second thermal interface material and the copper substrate plug, and the contact resistance between the second thermal interface material and the heat conducting surface has a value of 0.060 cm$^2$K/W or less. In some embodiments, the summation is 0.050 cm$^2$K/W or less. In some embodiments, the summation is 0.040 cm$^2$K/W or less. In some embodiments, the summation is between 0.035-0.060 cm$^2$K/W. In some embodiments, the summation is between 0.035-0.050 cm$^2$K/W. In some embodiments, the summation is between 0.035-0.040 cm$^2$K/W. These values are better than what is achieved with conventional thermal interface materials and with prior copper substrates with carbon nanotube-based thermal interface materials on both the front and back surfaces.

In some embodiments, as described above with respect to FIG. 6, the value of the summation of the first bulk thermal resistance, the contact resistance between the first thermal interface material and the copper substrate plug, the contact resistance between the first thermal interface material and the solid-state device, the second bulk thermal resistance, the contact resistance between the second thermal interface material and the copper substrate plug, and the contact resistance between the second thermal interface material and the heat conducting surface changes (e.g., increases) by less than a predetermined value (e.g., 5%, 10%, or 15%) after the copper substrate plug 102 with thermal interface materials 120 & 136 on the front and back surfaces, respectively, is subjected to one or more harsh environments (e.g., thermal cycling 604, HAST 606, high temperature storage 608, preconditioning 610, shock 612, and/or vibration 614).

In some embodiments, a Raman spectrum of the second layer 130 containing carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

Figure 12B:
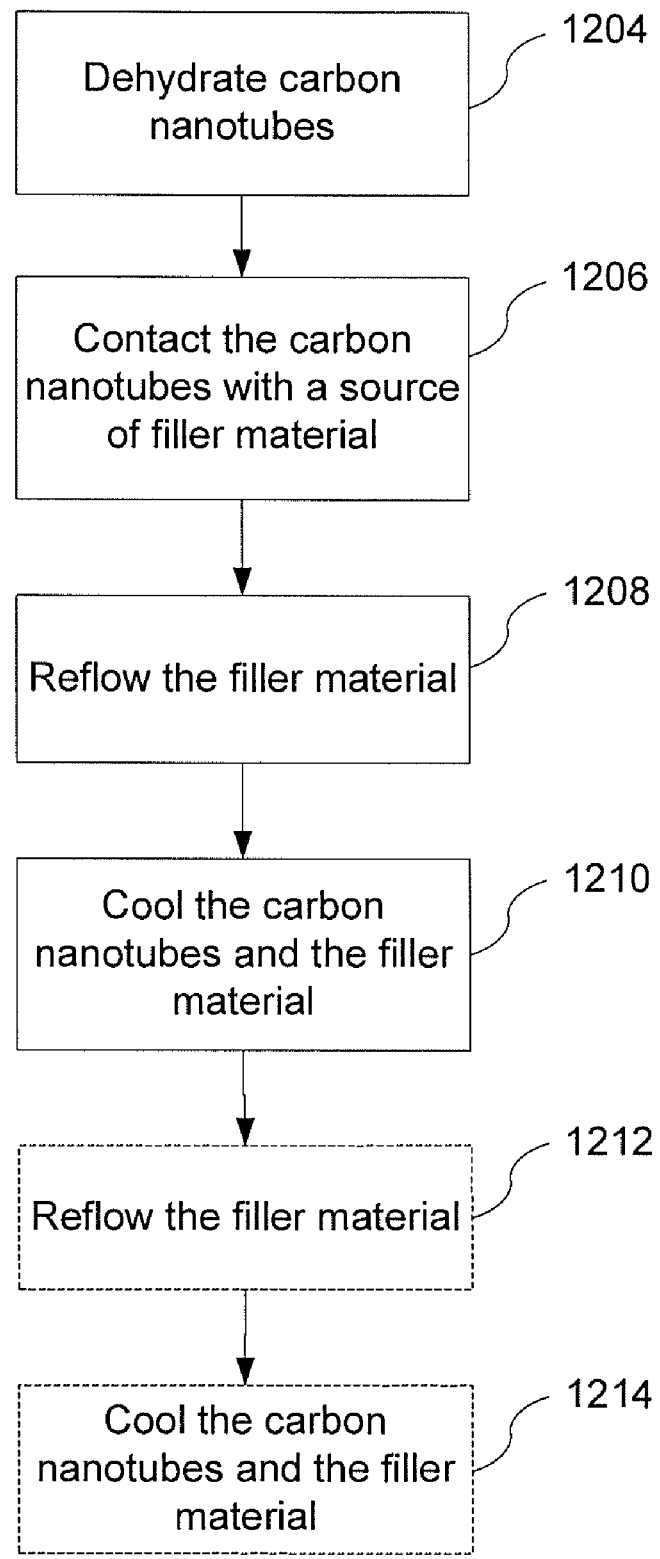

FIG. 12B is a flow diagram illustrating a process for placing a filler material between carbon nanotubes in a layer containing carbon nanotubes to form a thermal interface material in accordance with some embodiments (e.g., placing a first filler material 118 between carbon nanotubes 116 in a first layer 112 containing carbon nanotubes to form a first thermal interface material 120 or placing a second filler material 134 between carbon nanotubes 132 in a second layer 130 containing carbon nanotubes to form a second thermal interface material 136). In some embodiments, the placing comprises:

dehydrating (1204) the carbon nanotubes (e.g., by placing an article with the layer containing carbon nanotubes on a heated surface at 100° C. for 5 minutes);

contacting (1206) the carbon nanotubes with a source of filler material (e.g., for paraffin wax, pressing a pre-waxed paper on to the tips of the carbon nanotubes with a flat surface at a temperature above the melting point of the paraffin wax);

reflowing (1208) the filler material;

cooling (1210) the carbon nanotubes and filler material (e.g., by quenching on a metal block); and optionally, reflowing (1212) the filler material again and cooling (1214) the carbon nanotubes and filler material one or more additional times.

Figure 12C:
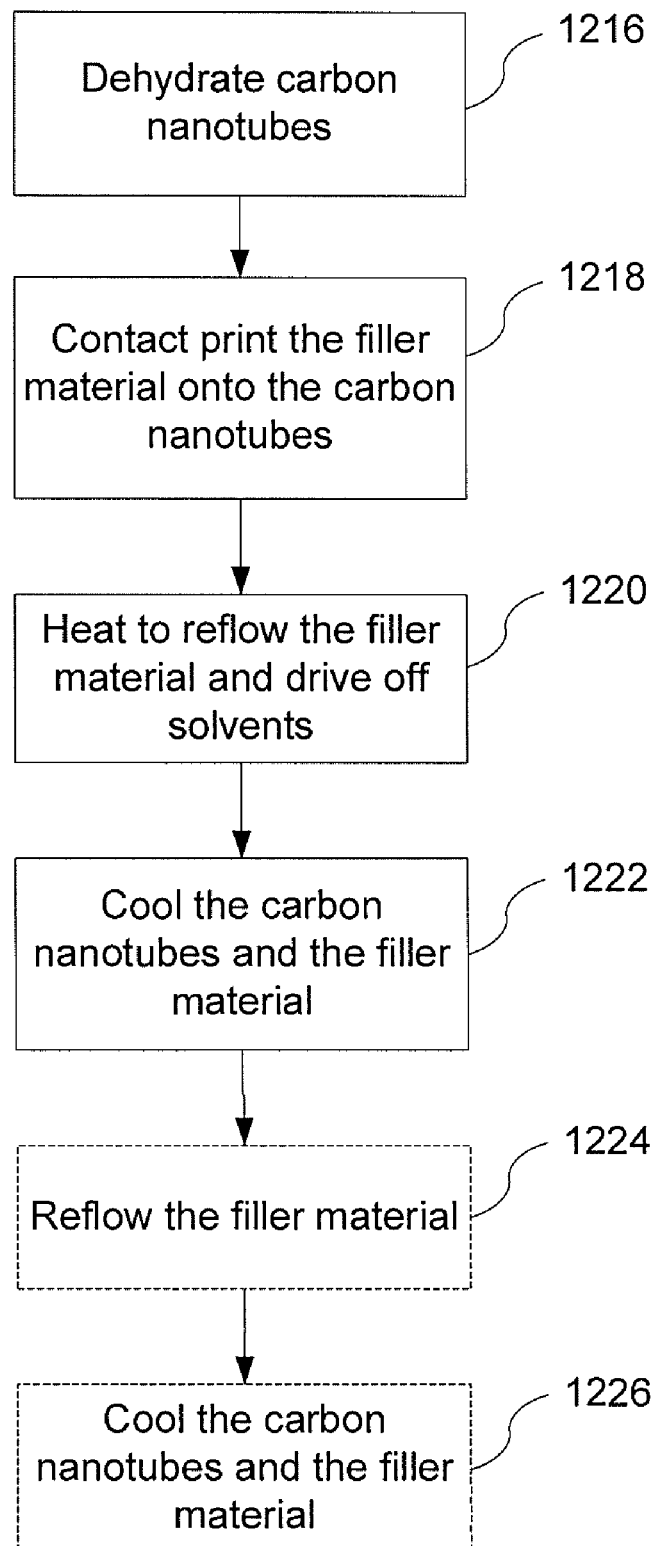

FIG. 12C is a flow diagram illustrating a process for placing a filler material between carbon nanotubes in a layer containing carbon nanotubes to form a thermal interface material in accordance with some embodiments (e.g., placing a first filler material 118 between carbon nanotubes 116 in a first layer 112 containing carbon nanotubes to form a first thermal interface material 120 or placing a second filler material 134 between carbon nanotubes 132 in a second layer 130 containing carbon nanotubes to form a second thermal interface material 136). In some embodiments, the placing comprises:

dehydrating (1216) the carbon nanotubes (e.g., by placing an article with the layer containing carbon nanotubes on a heated surface at 100° C. for 5 minutes);

contact printing (1218) the filler material onto the carbon nanotubes (e.g., using a silicon stamp and a filler material reservoir to transfer a prescribed amount of filler material from the stamp to the carbon nanotubes);

heating (1220) to reflow the filler material and drive off solvents (e.g., in a vacuum oven);

cooling (1222) the carbon nanotubes and filler material (e.g., by quenching on a metal block); and optionally, reflowing (1224) the filler material again and cooling (1226) the carbon nanotubes and filler material one or more additional times.

Figure 12D:
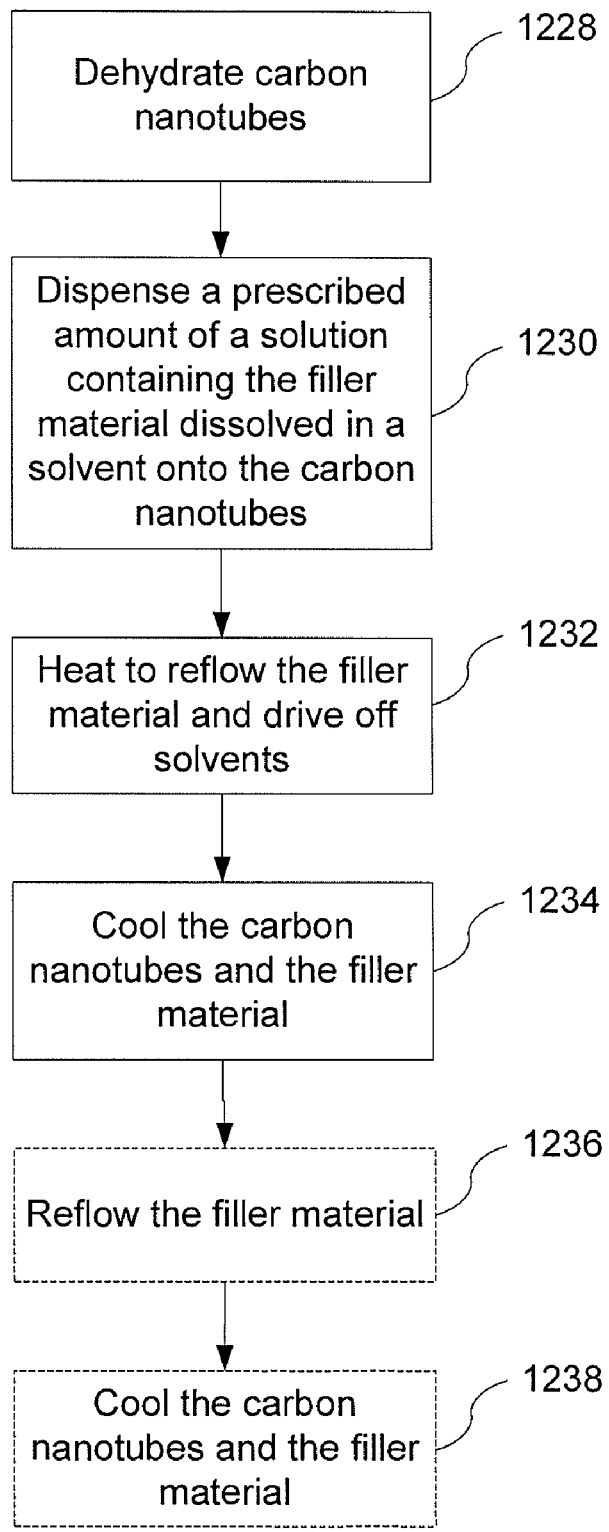

FIG. 12D is a flow diagram illustrating a process for placing a filler material between carbon nanotubes in a layer containing carbon nanotubes to form a thermal interface material in accordance with some embodiments (e.g., placing a first filler material 118 between carbon nanotubes 116 in a first layer 112 containing carbon nanotubes to form a first thermal interface material 120 or placing a second filler material 134 between carbon nanotubes 132 in a second layer 130 containing carbon nanotubes to form a second thermal interface material 136). In some embodiments, the placing comprises:

dehydrating (1228) the carbon nanotubes (e.g., by placing an article with the layer containing carbon nanotubes on a heated surface at 100° C. for 5 minutes);

dispensing (1230) a prescribed amount of a solution containing the filler material dissolved in a solvent (e.g., a solution containing the filler material and the solvent in a ratio between 1:10 and 1:500) onto the carbon nanotubes;

heating (1232) to reflow the filler material and drive off solvents (e.g., in a vacuum oven);

cooling (1234) the carbon nanotubes and filler material (e.g., by quenching on a metal block); and optionally, reflowing (1236) the filler material again and cooling (1238) the carbon nanotubes and filler material one or more additional times.

FIG. 13A illustrates a side view of an article of manufacture 1300 that comprises a solid-state device (e.g., integrated circuit 1310) and a heat spreader 206 with a copper substrate plug 102 incorporated in a peripheral structure 205 of the heat spreader in accordance with some embodiments. The printed circuit board or other substrate that the integrated circuit 1310 is attached to is omitted for clarity. Article 1300 can further include additional components (not shown).

The copper substrate plug 102 has a front surface (e.g., 114) The heat spreader 206 has a surface 906 facing the integrated circuit 1310.

A thermal interface material 120 is attached to the front surface of the copper substrate plug and contacts the solid-state device. In some embodiments, the solid-state device is an integrated circuit (e.g., IC 1310).

The thermal interface material 120 comprises a layer 112 of carbon nanotubes 116 and a filler material 118 located between the carbon nanotubes. The layer 112 of carbon nanotubes is attached to the copper substrate plug 102. The carbon nanotubes are oriented substantially perpendicular to the front surface of the copper substrate plug.

The thermal interface material 120 has: a bulk thermal resistance, a contact resistance between the thermal interface material and the copper substrate plug, and a contact resistance between the thermal interface material and the solid-state device. The summation of the bulk thermal resistance, the contact resistance between the thermal interface material and the copper substrate plug, and the contact resistance between the thermal interface material and the solid-state device has a value of 0.060 $cm^2K/W$ or less. In some embodiments, the summation has a value of 0.050 $cm^2K/W$ or less. In some embodiments, the summation has a value of 0.040 $cm^2K/W$ or less. In some embodiments, the summation has a value of 0.030 $cm^2K/W$ or less. In some embodiments, the summation has a value of 0.020 $cm^2K/W$ or less. In some embodiments, the summation has a value between 0.020-0.060 $cm^2K/W$. In some embodiments, the summation has a value between 0.020-0.050 $cm^2K/W$. In some embodiments, the summation has a value between 0.020-0.040 $cm^2K/W$. These values are better than what is achieved with conventional thermal interface materials and with prior thermal interface materials that include a layer of carbon nanotubes on a single surface of a copper substrate.

In some embodiments, as described above with respect to FIG. 6, the value of the summation of the bulk thermal resistance and the two contact resistances associated with the thermal interface material changes (e.g., increases) by less than a predetermined value (e.g., 5%, 10%, or 15%) after an article (e.g., 1300) containing the thermal interface material is subjected to one or more harsh environments (e.g., thermal cycling 604, HAST 606, high temperature storage 608, pre-conditioning 610, shock 612, and/or vibration 614). The two contact resistances associated with the thermal interface material are the contact resistance between the thermal interface material and the copper substrate plug, and the contact resistance between the thermal interface material and a solid-state device (e.g., an IC) or the equivalent of a solid-state device for testing purposes (e.g. a TTV or a copper block, as discussed above).

In some embodiments, the copper substrate plug has a thickness between 0.1 and 4.0 mm. In some embodiments, the copper substrate plug has a thickness between 0.5 and 2.5 mm. In some embodiments, the copper substrate plug has a thickness between 0.3 and 0.6 mm.

In some embodiments, the filler material 118 located between the carbon nanotubes comprises a phase change material. In some embodiments, the filler material 118 located between the carbon nanotubes comprises an ester, a wax, or an acrylate.

In some embodiments, as described above, the filler material comprises an ester, such as Purester 40 ($CH_3$—$(CH_2)_{20}$—COO—$(CH_2)_{17}$—$CH_3$, an ester made from stearyl alcohol and methyl behenate by Strahl & Pitsch, http://www.spwax.com/sppure.htm). In some embodiments, the filler material comprises a wax, such as MULTIWAX® W445 Multicrystalline Wax from Gehring-Montgomery, Inc. (http://gehring-montgomery.com/pdfs/MICROCRY.pdf) or paraffin (e.g., C44 paraffin). In some embodiments, the filler material comprises an acrylate. In some embodiments, the filler material comprises a mixture of acrylates. In some embodiments, the filler material comprises a mixture of methyl acrylate, octadecyl acrylate, and acrylic acid. In some embodiments, the filler material comprises a mixture of 0-50% methyl acrylate, 50-90% octadecyl acrylate, and 0-10% acrylic acid. In some embodiments, the filler material comprises a mixture of 27% methyl acrylate, 70% octadecyl acrylate, and 3% acrylic acid. (The preceding percentages are volume percentages.) In some embodiments, the filler material comprises mixtures of esters, waxes, and/or acrylates. In some embodiments, the filler material comprises a conductive filler such as graphene, which may be combined with an ester, wax, and/or acrylate. In some embodiments, the filler material comprises an antioxidant, such as 2',3-bis[[3-[3,5-di-tert-butyl-4-hydroxyphenyl]propionyl]]propionohydrazide (which goes by the trade name Ciba® IRGANOX® MD 1024) or Pentaerythritol Tetrakis(3-(3,5-di-tert-butyl-4-hydroxyphenyl)propionate) (which goes by the trade name Ciba® IRGANOX® 1010). In some embodiments, between 0.5-5% antioxidant improves the long term stability of the filler material.

In some embodiments, as described above, the layer of carbon nanotubes can withstand a shearing force of at least 0.5 Kgf without detaching from the copper substrate plug. In some embodiments, the layer of carbon nanotubes can withstand a shearing force of at least 3.3 Kgf without detaching from the copper substrate plug. In some embodiments, the layer of carbon nanotubes can withstand a shearing force of at least 5 Kgf without detaching from the copper substrate plug.

In some embodiments, as described above, the layer of carbon nanotubes can withstand an interfacial shearing stress of at least 30 psi without detaching from the copper substrate plug. In some embodiments, the layer of carbon nanotubes can withstand an interfacial shearing stress of at least 200 psi without detaching from the copper substrate plug. In some embodiments, the layer of carbon nanotubes can withstand an interfacial shearing stress of at least 300 psi without detaching from the copper substrate plug.

In some embodiments, an integrated circuit or other solid-state device may be removably connected to the thermal interface material 120. In some embodiments, the thermal interface material 120 is configured to enable an integrated circuit or other solid-state device to be connected to the thermal interface material, disconnected from the thermal interface material, and then reconnected to the thermal interface material.

In some embodiments, a Raman spectrum of the layer of carbon nanotubes has a D peak at ~1350 $cm^{-1}$ with an intensity $I_D$, a G peak at ~1585 $cm^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

In some embodiments, the article of manufacture 1300 is a computer, such as a server computer, client computer, desktop computer, laptop computer, handheld computer, personal digital assistant, cell phone, gaming console, or handheld gaming device.

FIG. 13B illustrates a side view of an article of manufacture 1301 that comprises a solid-state device (e.g., integrated circuit 1310) and a heat spreader 206 with a copper substrate plug 102 incorporated in a peripheral structure 205 of the heat spreader in accordance with some embodiments. The printed circuit board or other substrate that the integrated circuit 1310 is attached to is omitted for clarity. Article 1301 can further include additional components (not shown).

The copper substrate plug 102 has a front surface 114 and a back surface 115. The copper substrate plug 102 has a copper substrate plug thermal resistance. The heat spreader 206 has a surface 906 facing the integrated circuit 1310.

A first thermal interface material 120 is attached to the front surface 114 of the copper substrate plug 102 and contacts the solid-state device (e.g., integrated circuit 1310). The first thermal interface material 120 comprises a first layer 112 of carbon nanotubes 116 and a first filler material 118 located between carbon nanotubes in the first layer of carbon nanotubes. The carbon nanotubes 116 in the first layer of carbon nanotubes are oriented substantially perpendicular to the front surface of the copper substrate. The first thermal interface material 120 has: a first bulk thermal resistance, a contact resistance between the first thermal interface material and the copper substrate plug, and a contact resistance between the first thermal interface material and the solid-state device.

A second thermal interface material 136 is attached to the back surface 115 of the copper substrate plug 102. The second thermal interface material 136 comprises a second layer 130 of carbon nanotubes 132 and a second filler material 134 located between carbon nanotubes in the second layer of carbon nanotubes. The carbon nanotubes 132 in the second layer of carbon nanotubes are oriented substantially perpendicular to the back surface of the copper substrate. The second thermal interface material 136 has: a second bulk thermal resistance, a contact resistance between the second thermal interface material and the back surface of the copper substrate plug, and a contact resistance between the second thermal interface material and a heat conducting surface (e.g., heat sink surface 1606, FIG. 16B).

The summation of the first bulk thermal resistance, the contact resistance between the first thermal interface material and the copper substrate plug, the contact resistance between the first thermal interface material and the solid-state device, the second bulk thermal resistance, the contact resistance between the second thermal interface material the copper substrate plug, and the contact resistance between the second thermal interface material and the heat conducting surface has a value of 0.060 cm2K/W or less. In some embodiments, the summation is 0.050 $cm^2K/W$ or less. In some embodiments, the summation is 0.040 $cm^2K/W$ or less. In some embodiments, the summation is between 0.035-0.060 $cm^2K/W$. In some embodiments, the summation is between 0.035-0.050 $cm^2K/W$. In some embodiments, the summation is between 0.035-0.040 $cm^2K/W$. These values are better than what is achieved with conventional thermal interface materials and with prior copper substrates with carbon nanotube-based thermal interface materials on both the front and back surfaces.

In some embodiments, the copper substrate plug has a thickness between 0.1 and 4.0 mm. In some embodiments, the copper substrate plug has a thickness between 0.5 and 2.5 mm. In some embodiments, the copper substrate plug has a thickness between 0.3 and 0.6 mm.

In some embodiments, first filler material 118 and/or the second filler material 134 comprises a phase change material. In some embodiments, first filler material 118 and/or the second filler material 134 comprises an ester, a wax, or an acrylate.

In some embodiments, as described above, the first filler material 118 and/or the second filler material 134 comprises an ester, such as Purester 40 ($CH_3$—$(CH_2)_{20}$—COO—$CH_2)_{17}$—$CH_3$, an ester made from stearyl alcohol and methyl behenate by Strahl & Pitsch, http://www.spwax.com/sppure.htm). In some embodiments, the first filler material 118 and/or the second filler material 134 comprises a wax, such as MULTIWAX® W445 Multicrystalline Wax from Gehring-Montgomery, Inc. (http://gehring-montgomery.com/pdfs/MICROCRY.pdf) or paraffin (e.g., C44 paraffin). In some embodiments, the first filler material 118 and/or the second filler material 134 comprises an acrylate. In some embodiments, the first filler material 118 and/or the second filler material 134 comprises a mixture of acrylates. In some embodiments, the first filler material 118 and/or the second filler material 134 comprises a mixture of methyl acrylate, octadecyl acrylate, and acrylic acid. In some embodiments, the first filler material 118 and/or the second filler material 134 comprises a mixture of 0-50% methyl acrylate, 50-90% octadecyl acrylate, and 0-10% acrylic acid. In some embodiments, the first filler material 118 and/or the second filler material 134 comprises a mixture of 27% methyl acrylate, 70% octadecyl acrylate, and 3% acrylic acid. (The preceding percentages are volume percentages.) In some embodiments, the first filler material 118 and/or the second filler material 134 comprises mixtures of esters, waxes, and/or acrylates. In some embodiments, the first filler material 118 and/or the second filler material 134 comprises a conductive filler such as graphene, which may be combined with an ester, wax, and/or acrylate. In some embodiments, the first filler material 118 and/or the second filler material 134 comprises an antioxidant, such as 2',3-bis[[3-[3,5-di-tert-butyl-4-hydroxyphenyl]propionyl]]propionohydrazide (which goes by the trade name Ciba® IRGANOX® MD 1024) or Pentaerythritol Tetrakis(3-(3,5-di-tert-butyl-4-hydroxyphenyl)propionate) (which goes by the trade name Ciba® IRGANOX® 1010). In some embodiments, between 0.5-5% antioxidant improves the long term stability of the first filler material 118 and/or the second filler material 134.

In some embodiments, as described above, both the first layer 112 of carbon nanotubes and the second layer 130 of carbon nanotubes can withstand a shearing force of at least 0.5 Kgf without detaching from the copper substrate plug. In some embodiments, both the first layer 112 of carbon nanotubes and the second layer 130 of carbon nanotubes can withstand a shearing force of at least 3.3 Kgf without detaching from the copper substrate plug. In some embodiments, both the first layer 112 of carbon nanotubes and the second layer 130 of carbon nanotubes can withstand a shearing force of at least 5 Kgf without detaching from the copper substrate plug.

In some embodiments, as described above, both the first layer 112 of carbon nanotubes and the second layer 130 of carbon nanotubes can withstand an interfacial shearing stress of at least 30 psi without detaching from the copper substrate plug. In some embodiments, both the first layer 112 of carbon nanotubes and the second layer 130 of carbon nanotubes can withstand an interfacial shearing stress of at least 200 psi without detaching from the copper substrate plug. In some embodiments, both the first layer 112 of carbon nanotubes and the second layer 130 of carbon nanotubes can withstand an interfacial shearing stress of at least 300 psi without detaching from the copper substrate plug.

In some embodiments, as described above with respect to FIG. 6, the value of the summation of the first bulk thermal resistance, the contact resistance between the first thermal interface material and the copper substrate plug, the contact resistance between the first thermal interface material and the solid-state device, the second bulk thermal resistance, the contact resistance between the second thermal interface material and the copper substrate plug, and the contact resistance between the second thermal interface material and the heat conducting surface changes (e.g., increases) by less than a predetermined value (e.g., 5%, 10%, or 15%) after the copper substrate plug 102 with thermal interface materials 120 & 136 on the front and back surfaces, respectively, is subjected to one or more harsh environments (e.g., thermal cycling 604, HAST 606, high temperature storage 608, preconditioning 610, shock 612, and/or vibration 614).

In some embodiments, an integrated circuit or other solid-state device may be removably connected to the first thermal interface material 120. In some embodiments, the first thermal interface material 120 is configured to enable an integrated circuit or other solid-state device to be connected to the first thermal interface material, disconnected from the first thermal interface material, and then reconnected to the first thermal interface material. In some embodiments, the article of manufacture 1301 is configured to be reused to cool a succession of integrated circuits or other solid-state devices.

In some embodiments, a Raman spectrum of the first layer 112 containing carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

In some embodiments, a Raman spectrum of the second layer 130 containing carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

In some embodiments, the article of manufacture 1301 is a computer, such as a server computer, client computer, desktop computer, laptop computer, handheld computer, personal digital assistant, cell phone, gaming console, or handheld gaming device.

Figure 14A:
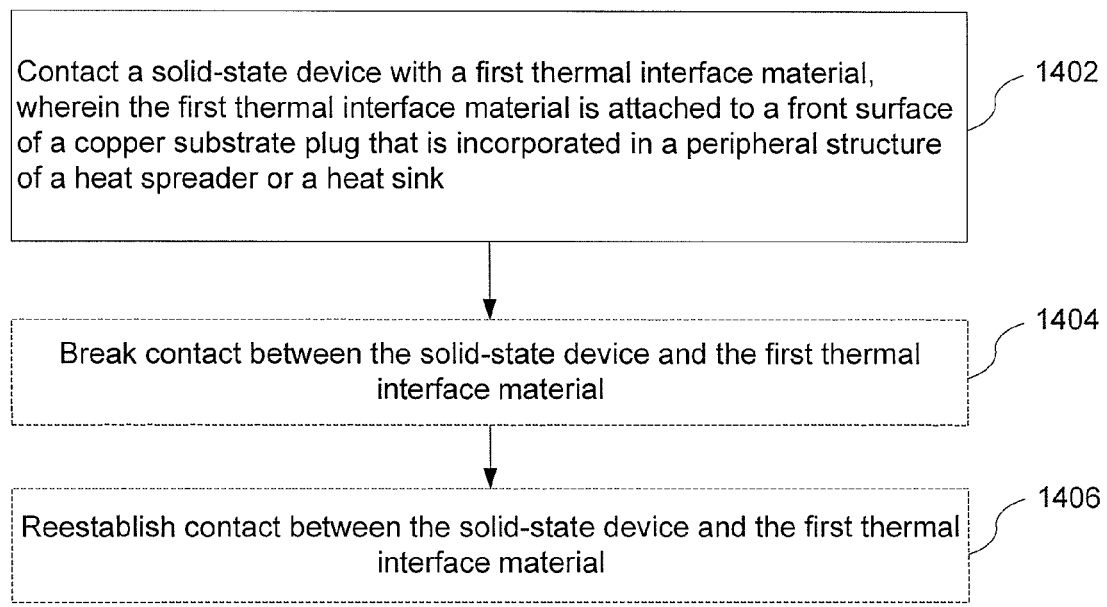
FIG. 14A is a flow diagram illustrating a process for contacting a solid state-device (e.g., an integrated circuit) with a first thermal interface material in accordance with some embodiments.

FIG. 14A is a flow diagram illustrating a process for contacting (1402) a solid-state device (e.g., integrated circuit 1310) with a first thermal interface material 120 in accordance with some embodiments. The first thermal interface material 120 is attached to a front surface 114 of a copper substrate plug 102 that is incorporated in a peripheral structure 205 of a heat spreader 206 or a heat sink (not shown).

The first thermal interface material 120 comprises: a first layer 112 of carbon nanotubes 116 that are oriented substantially perpendicular to the front surface 114 of the copper substrate, and a first filler material 118 located between the carbon nanotubes 116 in the first layer 112 of carbon nanotubes. The first thermal interface material 120 has: a first bulk thermal resistance, a contact resistance between the first thermal interface material and the copper substrate plug, and a contact resistance between the first thermal interface material and the solid-state device.

The first thermal interface material 120 has: a bulk thermal resistance, a contact resistance between the first thermal interface material and the copper substrate plug, and a contact resistance between the first thermal interface material and the solid-state device. The summation of the bulk thermal resistance, the contact resistance between the first thermal interface material and the copper substrate plug, and the contact resistance between the first thermal interface material and the solid-state device has a value of 0.060 cm$^2$K/W or less. In some embodiments, the summation has a value of 0.050 cm$^2$K/W or less. In some embodiments, the summation has a value of 0.040 cm$^2$K/W or less. In some embodiments, the summation has a value of 0.030 cm$^2$K/W or less. In some embodiments, the summation has a value of 0.020 cm$^2$K/W or less. In some embodiments, the summation has a value between 0.020-0.060 cm$^2$K/W. In some embodiments, the summation has a value between 0.020-0.050 cm$^2$K/W. In some embodiments, the summation has a value between 0.020-0.040 cm$^2$K/W. These values are better than what is achieved with conventional thermal interface materials and with prior thermal interface materials that include a layer of carbon nanotubes on a single surface of a copper substrate.

In some embodiments, a Raman spectrum of the first layer 112 containing carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

In some embodiments, a back surface 115 of the copper substrate plug is attached to a second thermal interface material 136. The second thermal interface material 136 is attached to a heat conducting surface (e.g., heat sink surface 1606, FIG. 16B).

In some embodiments with a second thermal interface material, the second thermal interface material 136 comprises: a second layer 130 of carbon nanotubes that are oriented substantially perpendicular to the back surface 115 of the copper substrate, and a second filler material 134 located between the carbon nanotubes 132 in the second layer 130 of carbon nanotubes. The second thermal interface material 136 has: a second bulk thermal resistance, a contact resistance between the second thermal interface material and the copper substrate plug, and a contact resistance between the second thermal interface material and the heat conducting surface.

In some embodiments with the second thermal interface material, the summation of the first bulk thermal resistance, the contact resistance between the first thermal interface material and the copper substrate plug, the contact resistance between the first thermal interface material and the solid-state device, the second bulk thermal resistance, the contact resistance between the second thermal interface material and the copper substrate, and the contact resistance between the second thermal interface material and the heat conducting surface has a value of 0.060 cm$^2$K/W or less. In some embodiments, the summation is 0.050 cm$^2$K/W or less. In some embodiments, the summation is 0.040 cm$^2$K/W or less. In some embodiments, the summation is between 0.035-0.060 cm$^2$K/W. In some embodiments, the summation is between 0.035-0.050 cm$^2$K/W. In some embodiments, the summation is between 0.035-0.040 cm$^2$K/W. These values are better than what is achieved with conventional thermal interface materials and with prior copper substrates with carbon nanotube-based thermal interface materials on both the front and back surfaces.

In some embodiments, a Raman spectrum of the second layer 130 containing carbon nanotubes has a D peak at ~1350 cm$^{-1}$ with an intensity $I_D$, a G peak at ~1585 cm$^1$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

The heat spreader 206 and first thermal interface material 120 may be reworkable, which increases yields and reduces manufacturing costs. In some embodiments, contact between the solid-state device and the first thermal interface material 120 is broken (1404), and then contact between the solid-state device and the first thermal interface material is reestablished (1406).

Figure 14B:
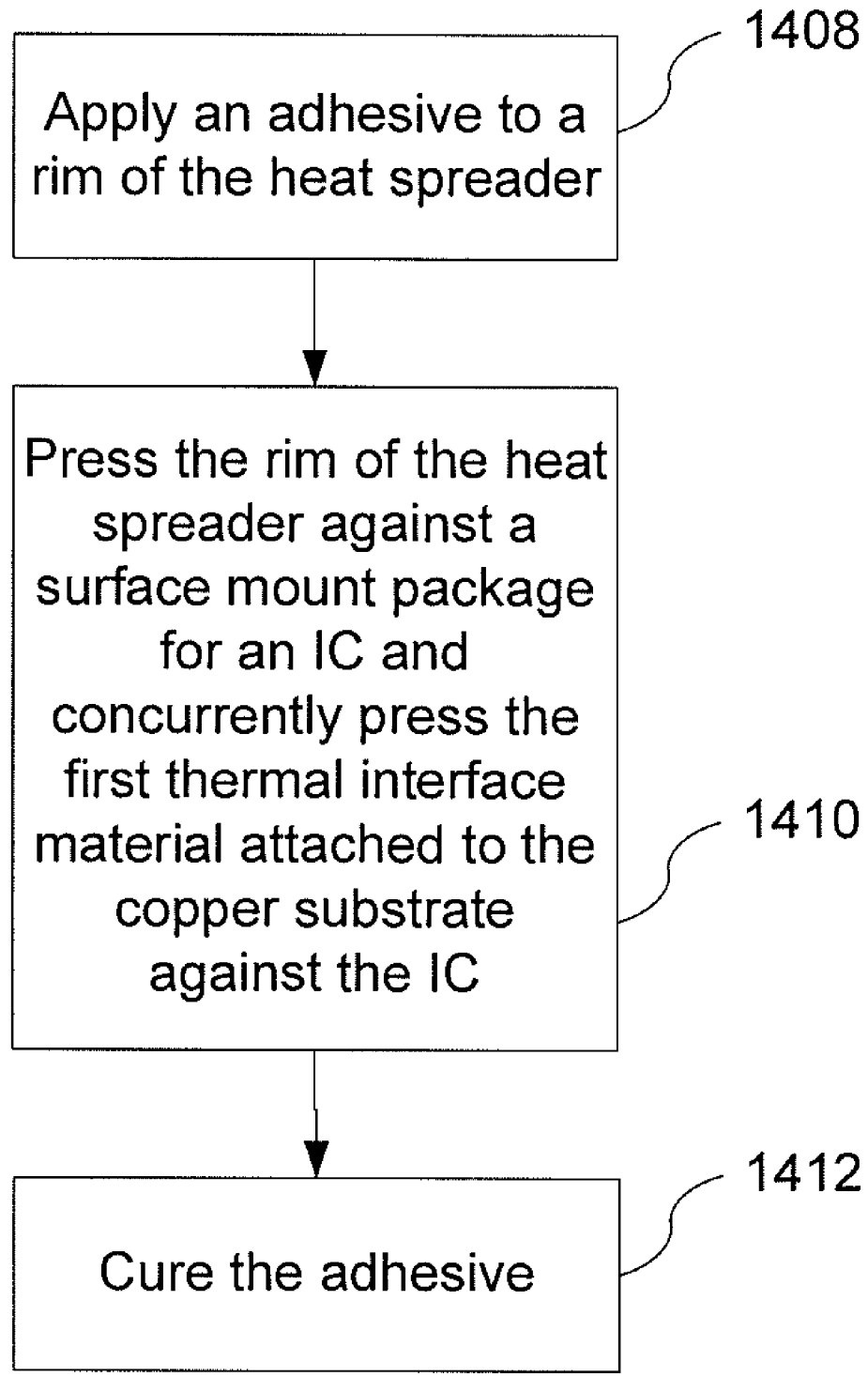
FIG. 14B is a flow diagram illustrating a process for contacting an integrated circuit with a first thermal interface material in accordance with some embodiments.

FIG. 14B is a flow diagram illustrating a process for contacting an integrated circuit 1310 with a first thermal interface material 120 in accordance with some embodiments. In some embodiments, the contacting comprises:

applying (1408) an adhesive to a rim (e.g., 220) of the heat spreader;

pressing (1410) the rim of the heat spreader against a surface mount package for an integrated circuit (e.g., a ball grid array (BGA) package) and concurrently pressing the first thermal interface material 120 attached to the copper substrate plug 102 against the integrated circuit; and
curing (1412) the adhesive.

In some embodiments, the first layer 112 of carbon nanotubes in the first thermal interface material 120 is designed to have sufficient compressibility so that the nanotubes contact the entire integrated circuit surface even if there are deviations in the flatness of the integrated circuit surface. For example, if the flatness of the integrated circuit surface being contacted varies by ±110 µm, the first layer of carbon nanotubes can be made with an average length of 30-50 µm, an average diameter of 100-150 nm, and a Young's Modulus of 30-150 GPa so that the thermal resistance is low (e.g., 0.060 cm$^2$K/W or less) when a pressure of 30-100 psi is applied to the heat spreader.

In cases where the flatness of the integrated circuit surface being contacted varies by ±25 µm, the first layer of carbon nanotubes can be made with an average length of 50-75 µm to provide sufficient thermal contact between the surfaces.

Figure 15:
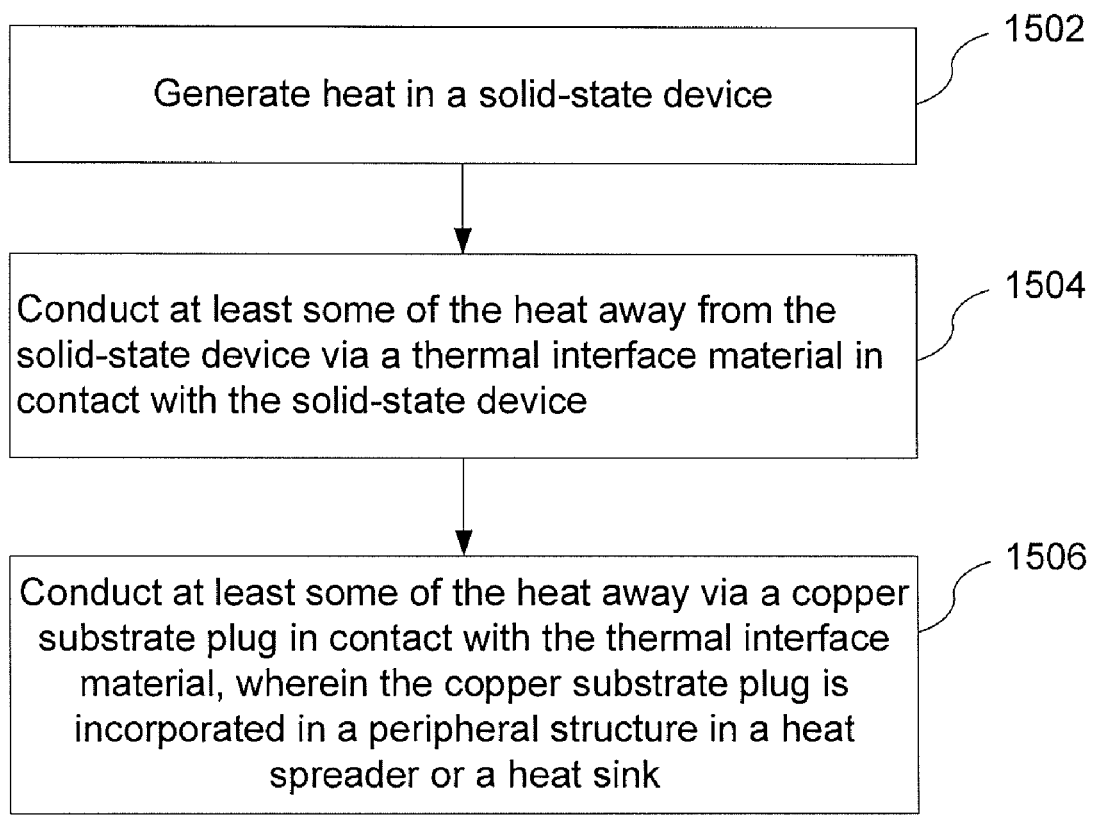
FIG. 15 is a flow diagram illustrating a process for removing heat from a solid state-device (e.g., an integrated circuit) in accordance with some embodiments.

FIG. 15 is a flow diagram illustrating a process for removing heat from a solid-state device (e.g. integrated circuit 1310) in accordance with some embodiments.

Heat is generated (1502) in a solid-state device (e.g., during the use of a computer containing integrated circuit 1310).

At least some of the heat is conducted (1504) away from the solid-state device via a thermal interface material 120 in contact with the solid-state device.

At least some of the heat is conducted (1506) away via a copper substrate plug 102 in contact with the thermal interface material 120. The copper substrate plug 102 is incorporated in a peripheral structure 205 in a heat spreader 206 or a heat sink (not shown).

In some embodiments, the thermal interface material 120 comprises: a layer 112 of carbon nanotubes 116 that are oriented substantially perpendicular to the front surface of the copper substrate, and a filler material 118 located between the carbon nanotubes.

In some embodiments, the thermal interface material 120 has: a bulk thermal resistance, a contact resistance between the thermal interface material and the copper substrate plug, and a contact resistance between the thermal interface material and the solid-state device. The summation of the bulk thermal resistance, the contact resistance between the thermal interface material and the copper substrate plug, and the contact resistance between the thermal interface material and the solid-state device has a value of 0.060 cm$^2$K/W or less. In some embodiments, the summation has a value of 0.050 cm$^2$K/W or less. In some embodiments, the summation has a value of 0.040 cm$^2$K/W or less. In some embodiments, the summation has a value of 0.030 cm$^2$K/W or less. In some embodiments, the summation has a value of 0.020 cm$^2$K/W or less. In some embodiments, the summation has a value between 0.020-0.060 cm$^2$K/W. In some embodiments, the summation has a value between 0.020-0.050 cm$^2$K/W. In some embodiments, the summation has a value between 0.020-0.040 cm$^2$K/W. These values are better than what is achieved with conventional thermal interface materials and with prior thermal interface materials that include a layer of carbon nanotubes on a single surface of a copper substrate.

In some embodiments, as described above with respect to FIG. 6, the value of the summation of the bulk thermal resistance and the two contact resistances associated with the thermal interface material changes (e.g., increases) by less than a predetermined value (e.g., 5%, 10%, or 15%) after an article containing the thermal interface material is subjected to one or more harsh environments (e.g., thermal cycling 604, HAST 606, high temperature storage 608, preconditioning 610, shock 612, and/or vibration 614). The two contact resistances associated with the thermal interface material are the contact resistance between the thermal interface material and the copper substrate plug, and the contact resistance between the thermal interface material and a solid-state device (e.g., an IC) or the equivalent of a solid-state device for testing purposes (e.g. a TTV or a copper block, as discussed above).

In some embodiments, a Raman spectrum of the layer of carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

FIG. 16A-16B illustrate side views of articles of manufacture that include a copper substrate plug 102 with thermal interface materials on one or two surfaces in accordance with some embodiments.

In article 1600 (FIG. 16A), a copper substrate plug 102 with a thermal interface material 120 on the front surface is incorporated in a peripheral structure 205 of a heat spreader 206. The copper substrate plug 102 is used to conduct heat from the heat spreader 206 to a heat sink 1606.

In article 1601 (FIG. 16B), a copper substrate plug 102 with thermal interface materials 120 and 136 on the front and back surfaces, respectively, is incorporated in a peripheral structure 205 of a heat spreader 206. The copper substrate plug 102 is used to conduct heat from the heat spreader 206 to a heat sink 1606 via thermal interface material 136. In FIG. 16B, the various parts are not drawn to scale, which creates a large apparent gap between the back surface of the heat spreader 206 and the heat sink surface 1606. In practice, the gap between these two surfaces would be filled by the second thermal interface material 136 and other thermal interface materials (e.g., a phase change material or thermal grease, not shown) between the peripheral structure 205 of the heat spreader and the heat sink surface 1606.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:
1. An article of manufacture, comprising:
a copper substrate plug with a front surface and a back surface;
a first adhesion layer that contacts the front surface of the copper substrate plug, wherein the first adhesion layer has a thickness between 200 and 5000 Å and comprises Ti, TiN, Cr, or Ta;
a diffusion barrier layer that contacts the first adhesion layer, wherein the diffusion barrier layer has a thickness between 100 and 400 Å and comprises TiN, SiO$_2$, Al$_2$O$_3$, or TaN;
a catalyst on top of the diffusion barrier layer, wherein the catalyst has a thickness between 30 and 1000 Å and comprises Ni, Fe, or Co; and
a thermal interface material on top of a single surface of the copper substrate plug;
wherein the thermal interface material comprises:
a layer of carbon nanotubes that contacts the catalyst, and a filler material located between the carbon nanotubes;
wherein the carbon nanotubes are oriented substantially perpendicular to the front surface of the copper substrate plug; and
wherein the copper substrate plug is configured to be incorporated in a peripheral structure of a heat spreader.

2. An article of manufacture, comprising:
a copper substrate plug with a front surface and a back surface;
a catalyst on top of a single surface of the copper substrate plug; and
a thermal interface material on top of the single surface of the copper substrate plug;
wherein the thermal interface material comprises:
a layer of carbon nanotubes that contacts the catalyst, and
a filler material located between the carbon nanotubes;
wherein the carbon nanotubes are oriented substantially perpendicular to the single surface of the copper substrate plug; and
wherein copper substrate plug is configured to be incorporated in a peripheral structure of a heat spreader.

3. The article of manufacture of claim 2, wherein the thermal interface material has:
a bulk thermal resistance,
a contact resistance between the thermal interface material and the copper substrate plug, and
a contact resistance between the thermal interface material and a solid-state device; and
wherein the summation of the bulk thermal resistance, the contact resistance between the thermal interface material and the copper substrate plug, and the contact resistance between the thermal interface material and the solid-state device has a value of 0.050 cm²K/W or less.

4. The article of manufacture of claim 2, wherein the copper substrate plug has a thickness between 0.1 and 4.0 mm.

5. The article of manufacture of claim 2, wherein the copper substrate has a circular, a square, or a rectangular shape.

6. The article of manufacture of claim 2, wherein the copper substrate plug has a cross-sectional area and thickness that substantially correspond to a cross-sectional area and depth of an opening, respectively, in the peripheral structure of the heat spreader.

7. The article of manufacture of claim 2, wherein the filler material located between the carbon nanotubes comprises a phase change material and/or a graphene.

8. The article of manufacture of claim 2, wherein the filler material located between the carbon nanotubes comprises an ester, a wax, or an acrylate.

9. The article of manufacture of claim 2, wherein the filler material located between the carbon nanotubes comprises an antioxidant.

10. The article of manufacture of claim 2, wherein the filler material located between the carbon nanotubes has a viscosity between 0.5-100 cSt at 25° C., a melting point between 40-80° C., a modulus between 50-1000 psi, and a surface tension between 1-100 dyne/cm and a boiling point of at least 250° C.

11. The article of manufacture of claim 2, wherein the filler material located between the carbon nanotubes comprises a mixture of esters, waxes, and/or acrylates.

12. The article of manufacture of claim 2, wherein the filler material located between the carbon nanotubes comprises a mixture of acrylates.

13. The article of manufacture of claim 2, wherein the filler material located between the carbon nanotubes comprises a mixture of methyl acrylate, octadecyl acrylate, and acrylic acid.

14. The article of manufacture of claim 2, wherein the filler material located between the carbon nanotubes comprises a mixture of 0-50% methyl acrylate, 50-90% octadecyl acrylate, and 0-10% acrylic acid.

15. The article of manufacture of claim 2, wherein the filler material located between the carbon nanotubes comprises a mixture of 27% methyl acrylate, 70% octadecyl acrylate, and 3% acrylic acid.

16. The article of manufacture of claim 2, wherein the layer of carbon nanotubes is attached to the copper substrate plug and can withstand an interfacial shearing stress of at least 300 psi without detaching from the copper substrate plug.

17. The article of manufacture of claim 2, wherein the copper substrate plug contains less than 40 ppm oxygen.

18. The article of manufacture of claim 2, wherein the copper substrate plug has a cross-sectional area that substantially corresponds to a cross-sectional area of a solid-state device.

19. The article of manufacture of claim 18, wherein the solid-state device is a IC chip, light emitting diode, laser, power transistor, RF device, or solar cell.

20. An article of manufacture, comprising:
a heat spreader with a peripheral structure;
a copper substrate plug incorporated in the peripheral structure of the heat spreader; and
a thermal interface material attached to a front surface of the copper substrate plug comprising a layer of carbon nanotubes and a filler material located between the carbon nanotubes, wherein
the carbon nanotubes are oriented substantially perpendicular to the front surface of the copper substrate plug, and
the carbon nanotubes are on a catalyst layer, the catalyst layer being arranged between the carbon nanotubes and the copper substrate plug.

* * * * *